US005737765A

United States Patent [19]

Shigeeda

[11] Patent Number: 5,737,765
[45] Date of Patent: *Apr. 7, 1998

[54] ELECTRONIC SYSTEM WITH CIRCUITRY FOR SELECTIVELY ENABLING ACCESS TO CONFIGURATION REGISTERS USED BY A MEMORY CONTROLLER

[76] Inventor: Akio Shigeeda, 7522 Holly Hill Dr., Apt. 2, Dallas, Tex. 75231

[*] Notice: The term of this patent shall not extend beyond the expiration date of Pat. No. 5,713,006.

[21] Appl. No.: 488,350

[22] Filed: Jun. 7, 1995

Related U.S. Application Data

[62] Division of Ser. No. 404,702, Mar. 15, 1995.
[51] Int. Cl.$^6$ .................................................. G06F 13/00
[52] U.S. Cl. .................. 711/170; 711/163; 395/651; 395/653; 395/830; 395/833; 395/310
[58] Field of Search .................. 395/497.01, 497.02, 395/497.03, 833, 830, 829, 828, 653, 651, 494, 490, 310, 309, 285, 283, 306

[56] References Cited

U.S. PATENT DOCUMENTS

| | | | |
|---|---|---|---|
| 4,739,473 | 4/1988 | Ng et al. | |
| 5,040,153 | 8/1991 | Fung et al. | 365/230.03 |
| 5,274,768 | 12/1993 | Traw et al. | 395/200.2 |
| 5,287,531 | 2/1994 | Rogers, Jr. et al. | 395/800 |
| 5,301,292 | 4/1994 | Hilton et al. | 395/484 |
| 5,307,320 | 4/1994 | Farrer et al. | 365/230.01 |
| 5,317,709 | 5/1994 | Sugimoto | 395/432 |
| 5,379,384 | 1/1995 | Solomon | 395/308 |
| 5,386,567 | 1/1995 | Lien et al. | 395/700 |
| 5,408,129 | 4/1995 | Farmwald et al. | 257/692 |
| 5,446,869 | 8/1995 | Padgett et al. | 395/500 |
| 5,513,331 | 4/1996 | Pawlowski et al. | 395/401 |
| 5,548,730 | 8/1996 | Young et al. | 395/306 |
| 5,574,869 | 11/1996 | Young et al. | 395/306 |

OTHER PUBLICATIONS

Linley Gwennap, *Microprocessor Report*, "TI Shows Integrated X86 CPU for Notebooks", vol. 8, No.2, Feb. 14, 1994, pp. 5–7.

ACC Micro, ACC 2056 3.3V Pentium Single Chip Solution for Notebook Applications, Rev. 1.1, pp. 1-1-1-10.
ACC Micro, ACC 2066 486/386DX Notebook Enhanced–SL Single Chip AT, Rev. 1.2, Oct. 11, 1993 pp. 1-1-1-10.
PicoPower, Redwood Technical Reference Manual, Databook 3.0P, Jul. 8, 1994, pp. i–iv, 18,19, 87–89.
ACC Micro, ACC Microelectronics Product Guide.
VIA Technologies, Inc., Energy Star–Compliant System Logic Solutions, Brochure.

(List continued on next page.)

*Primary Examiner*—Glenn Gossage

[57] ABSTRACT

An electronic system, such as a computer system, in which access to configuration registers used by a memory controller, is selectively enabled. The disclosed system includes a single integrated circuit microprocessor unit that includes a microprocessor core, a memory controller circuit, a bus bridge circuit, and configuration registers. The microprocessor unit is connected to external dynamic random access memory (DRAM). The memory controller circuit is operable to perform an operation utilizing current information in one or more of the configuration registers. The bus bridge circuit includes a request logic circuit for supplying a request output signaling an impending access to one or more of the configuration registers. The memory controller circuit includes a reply logic circuit for supplying a reply output back to the request logic circuit after the operation utilizing current configuration register information is completed. The request logic includes an enable circuit responsive to the reply output to then enable the impending access to the configuration registers. The electronic system may also include one or more additional integrated circuit devices, such as may include a direct memory access (DMA) circuit and a bus bridge interface circuit for bidirectional communication with the microprocessor unit. The microprocessor unit may also include a first level write-through cache in combination with a significantly smaller second level write-back cache. The disclosed microprocessor unit also includes circuitry for determining memory bank size and memory address type.

20 Claims, 27 Drawing Sheets

OTHER PUBLICATIONS

OPTi, 82C895 Single Chip True Green PC Chipset.

OPTi, Blackhawk 486 Desktop Chipset.

EFAR, EC802G One Chip32 Bits PC/AT Core Logic, Technical Reference Manual, 1994, 11–14, 25,29.

ETEQ Micro, Buffalo ET 9000, 486 Write Back Cache "AT" Single Chip, Rev 03, May 1994, pp. 1–8.

ETEQ Micro, Panda 82C390SX, Single Chip 386 SX Direct Mapped Cache solution, Rev 0.1, Oct. 1991, pp. 1–4, Rev.02, Apr. 1992, pp. 5–10.

EFAR, SWIFT–IDE, 386 Chip UP grade 486, POWERset Pentium PCI/ISA Chip Set, 1994.

OPTi Python Chipset for Pentium Processors, 82C546 & 82C547 Data Book, Version 1.0, May 1994, pp. 1–3, 37,38, 41,43,45–52,65,66,69,70,72.

Symphony Laboratories, Wagner 486 PC/AT Chip Set, Rev A.2,Features, Block Diagram, pp. 1–1–1–8.

UMC Super Energy Star Green File, Version 4.0, Preliminary UM8881F/8886F, Apr. 15, 1994, pp. 1, 7–18.

UMC Super Energy Star Green File, Version 4.0, Preliminary UM8498F/8496F/82C495F, Apr. 15, 1994, pp. 1–3, 17–19.

UMC Super Energy Star Green File, Version 4.0, Preliminary UM8486F, Apr. 15, 1994, pp. 6–8, 17–19.

OPTi, Viper Notebook Chipset, Preliminary Data Book, Ver.02, 82C556/82C557/82C558N, Jun. 1994, pp. 1–5, 46–67.

Texas Instruments, TACT84500 EISA Chip Set, Designer's Handbook, 1991, pp. 3–1–3–4, 3–42–3–44.

OPTi 82C802G, System/Power Management Controller, Mar. 1994, pp. 1–14, 19–22, 37.

OPTi 82C596/82C597, Cobra Chip for Pentium Processors Data Book, Rev. 1.0, Oct. 1994, pp. 1–3, 35–51.

Texas Instruments, TACT84411 Single–Chip 80486 Systems Logic, 1993, pp. 1–1–1–5, 2–1, 2–2, 4–1–4–15, 5–28.

ELECTRONIC SYSTEM WITH CIRCUITRY FOR SELECTIVELY ENABLING ACCESS TO CONFIGURATION REGISTERS USED BY A MEMORY CONTROLLER

This is a division of application Ser. No. 08/404,702, filed Mar. 15, 1995.

NOTICE (C) Copyright, *M* Texas Instruments Incorporated 1995. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications, are hereby incorporated herein by reference:

(TI-18329) Ser. No. 08/363,198, filed Dec. 22, 1994, now allowed.

(TI-18533) Ser. No. 08/363,109, filed Dec. 22, 1994; abandoned in favor of (TI-18533A) Ser. No. 08/608,030, filed Feb. 28, 1996; now abandoned in favor of (TI-18533B) Ser. No. 08/744,567, filed Nov. 6, 1996, now allowed.

(TI-18536) Ser. No. 08/363,673, filed Dec. 22, 1994; now abandoned in favor of (TI-18536A) Ser. No. 08/684, filed Jul. 23, 1996.

(TI-18538) Ser. No. 08/363,098, filed Dec. 22, 1994; now abandoned in favor of (TI-18538A) Ser. No. 08/712,659, filed Sep. 13, 1996, now allowed.

(TI-18540) Ser. No. 08/362,669, filed Dec. 22, 1994; now abandoned in favor or (TI-18540C) Ser. No. 08/760,355, filed Dec. 4, 1996.

(TI-18541) Ser. No. 08/362,325, filed Dec. 22, 1994; now abandoned in favor of (TI-18541A) Ser. No. 08/749,388, filed Nov. 6, 1996, now allowed.

(TI-18902) Ser. No. 08/363,543, filed Dec. 22, 1994;

(TI-19880) Ser. No. 08/363,450, filed Dec. 22, 1994; now abandoned in favor of (TI-19880A) Ser. No. 08/547,966, filed Oct. 25, 1995; now abandoned in favor of (TI-19880B) Ser. No. 08/728,404, filed Oct. 9, 1996, now allowed.

(TI-20173) Ser. No. 08/363,459, filed Dec. 22, 1994, now allowed.

(TI-20175) Ser. No. 08/363,449, filed Dec. 22, 1994, now abandoned in favor of (TI-20175A) Ser. No. 08/482,340, filed Jun. 7, 1995, now abandoned.

(TI-20177) Ser. No. 08/362,032, filed Dec. 22, 1994.

(TI-20178) Ser. No. 08/362,351, filed Dec. 22, 1994, now abandoned in favor of (TI-20178A) Ser. No. 08/705,034, filed Aug. 29, 1996.

(TI-20180) Ser. No. 08/362,288, filed Dec. 22, 1994, now abandoned in favor of (TI-20180C) Ser. No. 08/719,599, filed Sep. 25, 1996.

(TI-20181) Ser. No. 08/362,637, filed Dec. 22, 1994, now abandoned in favor of (TI-20181B) Ser. No. 08/857,272, filed May 16, 1997

(TI-20182) Ser. No. 08/362,033, filed Dec. 22, 1994.

(TI-20183) Ser. No. 08/362,701, filed Dec. 22, 1994, now abandoned in favor of (TI-20183B) Ser. No. 08/834,579, filed Apr. 7, 1997.

(TI-20185) Ser. No. 08/363,661, filed Dec. 22, 1994.

(TI-20186) Ser. No. 08/362,702, filed Dec. 22, 1994, now abandoned in favor of (TI-20186A) Ser. No. 08/872,727, filed Jun. 11, 1997.

(TI-20202) Ser. No. 08/401,105, Mar. 8, 1995, now abandoned in favor of (TI-20202A) Ser. No. 08/730,165, filed Oct. 15, 1996, now allowed.

Other patent applications and patents are incorporated herein by reference by specific statements to that effect elsewhere in this application.

FIELD OF THE INVENTION

This invention generally relates to electronic circuits, computer systems and methods of operating them.

BACKGROUND OF THE INVENTION

Without limiting the scope of the invention, its background is described in connection with computer systems, as an example.

Early computers required large amounts of space, occupying whole rooms. Since then minicomputers and desktop computers entered the marketplace.

Popular desktop computers have included the "Apple" (Motorola 680×0 microprocessor-based) and "IBM-compatible" (Intel or other ×86 microprocessor-based) varieties, also known as personal computers (PCs) which have become very popular for office and home use. Also, high-end desk top computers called workstations based on a number of superscalar and other very-high-performance microprocessors such as the SuperSPARC microprocessor have been introduced.

In a further development, a notebook-size or palm-top computer is optionally battery powered for portable user applications. Such notebook and smaller computers challenge the art in demands for conflicting goals of miniaturization, ever higher speed, performance and flexibility, and long life between battery recharges. Also, a desktop enclosure called a docking station has the portable computer fit into the docking station, and improvements in such portable-computer/docking-station systems are desirable. Improvements in circuits, integrated circuit devices, computer systems of all types, and methods to address all the just-mentioned challenges, among others, are desirable, as described herein.

SUMMARY OF THE INVENTION

Generally and in one form of the invention, an electronic device on a single integrated circuit chip has a microprocessor with a processing unit operable to process digital data in accordance with computer instructions, and a first cache coupled to said processing unit. A second cache includes a write-back cache which is at least ten times smaller than the first cache, and coupled to the first cache.

Generally, another form of the invention has a memory controller circuit for generating column addresses from addresses on an address bus. The memory controller circuit includes a selector circuit having inputs for a plurality of lines of the address bus, and an output for column addresses. A control register has bits representing a particular memory array type among a plurality of memory array types. A control circuit couples the bits of the control register to the selector circuit thereby supplying the column addresses from the plurality of lines in accordance with the particular memory array type represented by the bits in the control register.

BRIEF DESCRIPTION OF THE DRAWINGS

In the drawings:

FIGS. 5, 6 and 7 are three parts of a more detailed electrical diagram (partially schematic, partially block) of a preferred embodiment electronic computer system for use in embodiments including those of FIGS. 3 and 4, wherein FIG. 5 shows microprocessor unit (MPU) and peripheral control unit (PCU), FIG. 6 shows peripheral processor unit (PPU) and peripherals, and FIG. 7 shows display and other elements;

Corresponding numerals and symbols in the different figures refer to corresponding parts unless otherwise indicated.

DETAILED DESCRIPTION OF PREFERRED EMBODIMENTS

Figure 1:
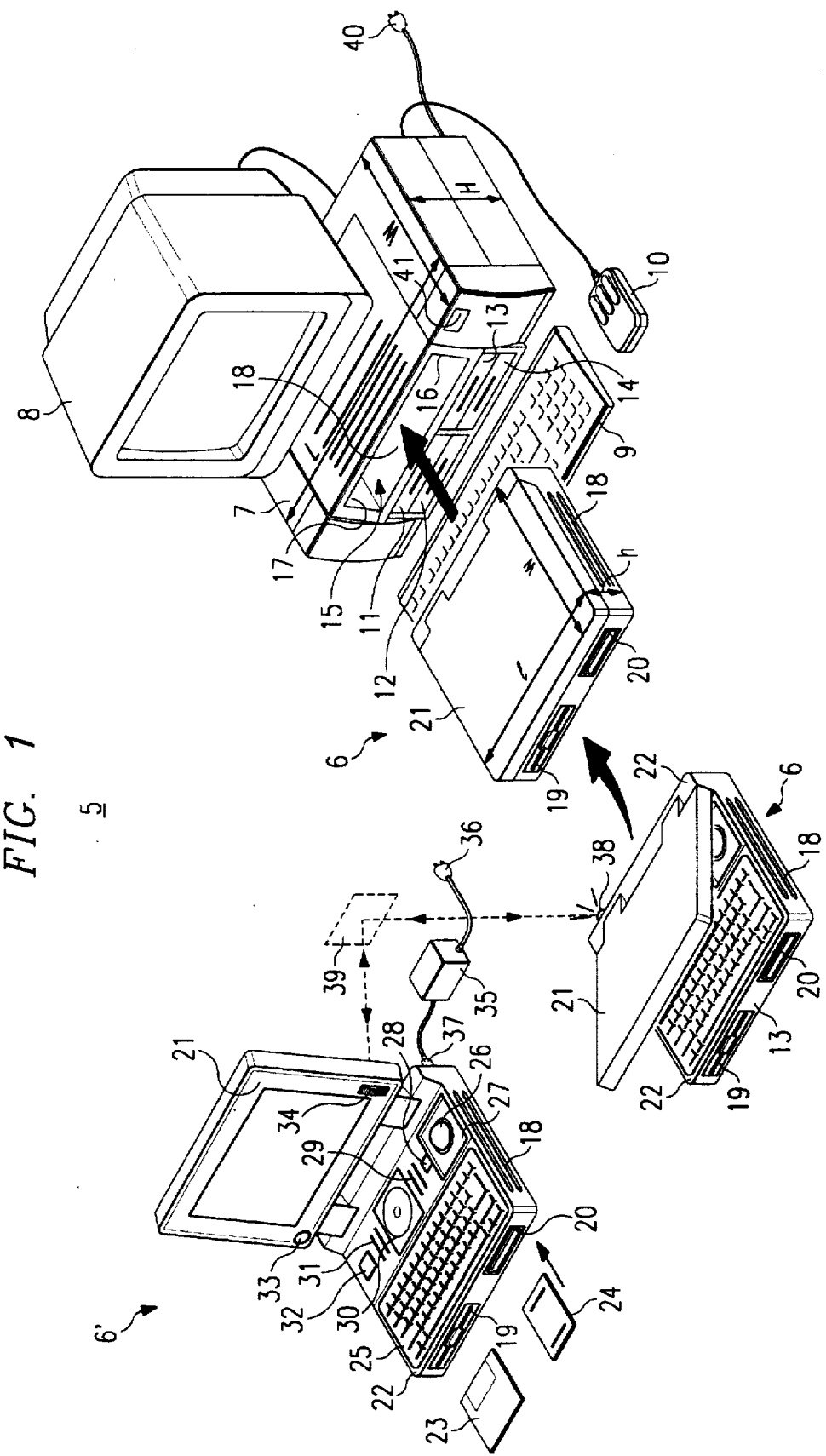
FIG. 1 is a pictorial diagram of two notebook computer embodiments, one of them being inserted into a docking station embodiment to provide a combined system embodiment.

In FIG. 1 a notebook-computer-and-docking-station system 5 has an insertable or dockable notebook computer 6 shown being inserted along a path of bold arrows into a docking station 7. A CRT (cathode ray tube) display 8, a keyboard 9 and a mouse 10 are respectively connected to mating connectors on a rear panel of docking station 7. Docking station 7 has illustratively four storage access drives, for example: 5.25 inch floppy disk drive 11, 3.5 inch floppy disk drive 12, a CD (compact disc) drive 13 and an additional floppy or CD drive 14.

Docking station 7 has a docking compartment 15 into which notebook computer 6 inserts securely against internal rear electrical connectors. Docking compartment 15 in this embodiment accepts manual insertion of notebook computer 6 along lateral guideways 16 and 17 using a minimum of mechanical elements to achieve advantageous economy in cost of the physical docking. A horizontal surface of guideway brackets or a horizontal panel as shown provide physical support for notebook computer 6. In an alternative embodiment, a motorized insertion mechanism associated with docking compartment 15 holds, rearwardly moves and seats notebook computer 6 against either rear electrical connectors, lateral connectors or both.

Docking station 7 in this embodiment occupies a volume V=LWH equal to the product of the length L, width W and height H of the form of a rectangular solid. Notebook computer 6 also has a form of a rectangular solid with volume v=l w h equal to the product of its own length 1, width w, and height h. The docking station 7 in this embodiment advantageously is proportioned so that the width w of the notebook 6 exceeds at least 75% and preferably 85% of the width W of the docking station. In this way, the room left for keyboard 9 and user work space to the front of keyboard 9 is advantageously sufficient to make docking station 7 as convenient to locate as many conventional desktop computers. Drives are stacked in pairs 11, 12 and 13,14 providing extra ergonomically desirable height (user head position level, low glare) for supporting display 8, reduced length L, and efficient use of volume V. The weight distribution of the docking station 7 suits it for location on a desktop as shown, or for tower positioning with docking station 7 resting on its right side-panel. In either position, the drives 11,12 and 13,14 are suitable as shown, or alternatively are mounted with the docking compartment 15 located centrally between drives 11 and 13 on top, and drives 12 and 14 on the bottom.

Notebook computer 6 has slits 18 for advantageous lateral ventilation both in open air, and in a forced air ventilation environment of docking station 7. Notebook computer 6 features front-facing slots of a 3.5 inch floppy disk drive 19 and a card connector 20 (e.g. for flash memory, modem or other insertable cards). These slots are accessible even when the notebook computer 6 is docked.

A display panel 21 combined with a high-impact back panel is hingeably mounted rearward on a high-impact mounting base 22. Looking to the left in FIG. 1 is an identical but distinct notebook computer unit 6'. (For economy of notation, additional numerals on notebook unit 6' are not primed.)

Notebook unit 6' has display panel 21 raised to operating position relative to base 22 in the portable environment. A 3.5 inch floppy diskette 23 and a flash memory card 24 are shown near their respective insertion slits 19 and 20. A keyboard 25 mounts forwardly on base 22. To the rear of keyboard 25, and between keyboard 25 and display panel 21, lie (in order from right to left) a recessed trackball 26 in a recess 27, an ON/OFF switch 28, ventilation slits 29, a loudspeaker 30 beneath a protective grille, further ventilation slits 31, and a SUSPEND/RESUME switch 32.

A physical protuberance or stud 33 is molded integrally with display panel 21 or affixed thereon, near a hinge so that when the display panel 21 is closed against base 22, the stud 33 impinges against SUSPEND/RESUME switch 32 thereby putting the computer 6' in a Suspend mode whereby very little power is consumed. Then when the panel 21 is reopened, the computer resumes almost immediately with the current application program without rebooting. ON/OFF switch 28 has no stud associated with it, so that the user has the manual option to turn the notebook computer on or off and to reboot when desired.

In still further features, notebook computers 6 and 6' have a display brightness (e.g. backlighting) adjustment control 34 mounted low on the right side of panel 21. An optional power supply 35 is powered from a commercial power source to which an AC plug 36 connects. Power supply 35 in turn supplies battery recharge and supply voltages via a rear power connector 37 to notebook computer 6'.

An infrared (IR) emitter/detector assembly 38 on notebook computer 6 provides two-way communication with a corresponding infrared emitter/detector assembly on the back of notebook computer 6'. The two computers 6 and 6' suitably communicate directly to one another when two users are positioned opposite one another or otherwise such that the computers 6 and 6' have the IR assemblies in line-of-sight. When the two computers 6 and 6' are side-by-side, they still advantageously communicate by reflection from an IR-reflective surface 39, such as the wall of a conference room or side-panel of an overhead projector unit.

Docking station 7 has an AC power plug 40 connected to energize the docking station circuitry as well as that of notebook computer 6 when the latter is inserted into docking compartment 15. An AC Power On/Off switch 41 is manually actuated by the user on the upper right front panel of docking station 7 in FIG. 1.

Figure 2A:
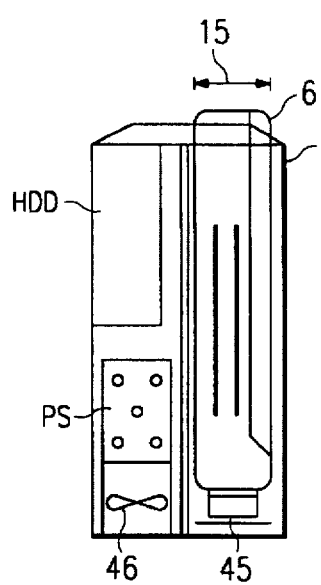
FIGS. 2A, 2B, and 2C are, respectively, a right-side profile view, plan view, and rear elevation of the combined system of notebook and docking station of FIG. 1.

Turning now to FIG. 2A, notebook computer 6 is shown inserted against a power connector 45 of docking station 7 in a right profile view of the assembly. A hard disk drive HDD and a power supply P.S. are visible in the right profile view and in the plan view of FIG. 2. A ventilation fan 46 efficiently, quietly and with low electromagnetic interference, draws a lateral air flow across a Docking PCB (Printed Circuit Board) of the docking station, as well as through the notebook computer 6 having its own printed circuit board. The ventilation flow continues through the ventilation holes of power supply P.S. whereupon heated air is exhausted by fan 46 broadside and outward from the rear panel of docking station 7, as shown in the rear elevation detail of FIG. 2C.

The Docking PCB is supported low to the bottom panel 47 of an enclosure or cabinet of the docking station 7.

Figure 2B:
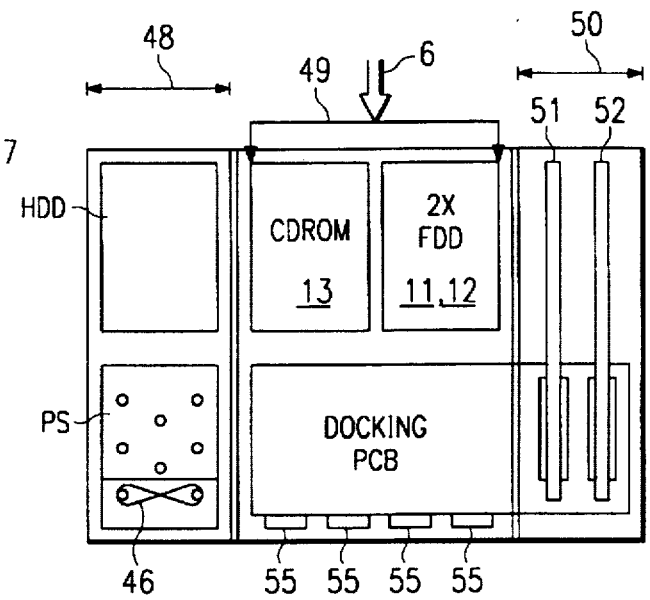

As seen from the top in FIG. 2B, the enclosure has a left bay 48 for hard disk drive HDD and power supply P.S., a wider middle bay 49 having mass storage drives 11, 12, 13 and 14, and the docking PCB behind the docking compartment 15, and then a right bay 50 into which a multimedia board 51, a video teleconferencing board 52, and other boards of substantial size readily fit from top to bottom of the enclosure.

For convenience and economy, several connectors 55 are physically mounted and electrically connected to Docking PCB and are physically accessible through a wide aperture in the rear of the enclosure. As shown in rear elevation in FIG. 2C, connectors 55 include a keyboard connector KBD, a mouse connector MS, a display connector VGA, a PRINTER port, a GAME port, a local area network LAN connector, and an RJ-11 telephone jack or modem port. A Multimedia connector and a teleconferencing Camera connector are accessible at the rear of the right bay 50.

Emphasizing now the connector arrangement of the notebook computer 6 in rear elevation, a series of these connectors are physically mounted and electrically connected to an internal printed circuit board of notebook computer 6. These connectors are utilized in two docking station and system embodiments. In a first embodiment, shown in FIG. 2C, an aperture-defining rectangular edge 58 provides physical access to several of the connectors of notebook computer 6, thereby increasing the connectivity of the combined system 6,7 to peripheral units as will be discussed in connection with FIG. 3. In a second embodiment, the edge 58 is absent, and rear connectors of the docking station 7 mate to these several connectors of notebook computer 6 as will be discussed in connection with FIG. 4.

Figure 2C:
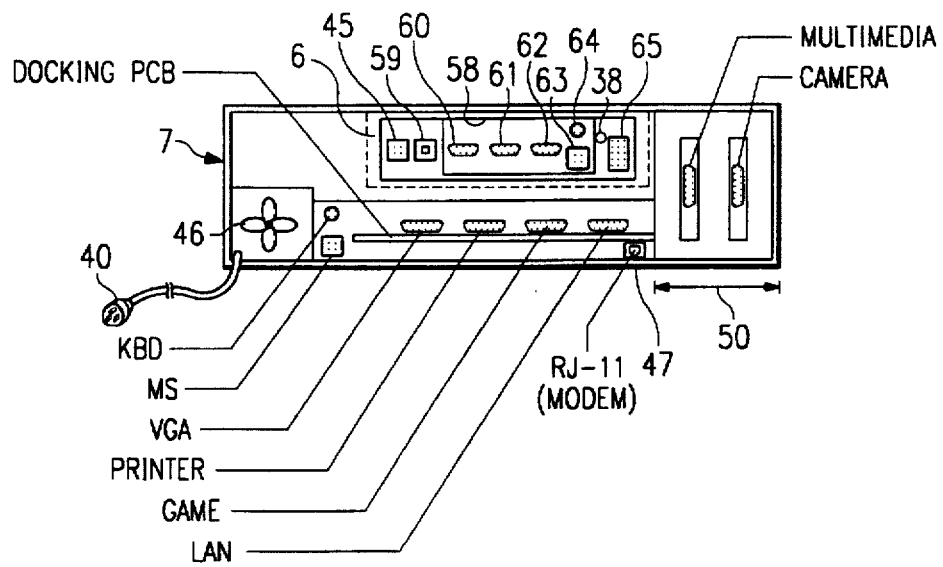

Looking from left to right in rear elevation of FIG. 2C, a power and telephone connector 45 securely mounted to docking station 7 mates to notebook computer 6. A telephone connector 59 of notebook 6 is suitably obscured in the docking compartment 15, but available for use when the notebook is used in the portable environment. A display connector 60, a printer parallel port connector 61, and a disk drive connector 62 are provided at the back of notebook 6. An optional mouse connector 63 and keyboard connector 64 are provided next to IR emitter/detector 38.

At far right rear on notebook 6, a high-speed bus connector 65 mates securely to a corresponding connector of docking station 7 so that wide-bandwidth communication, such as by a PCI (Peripheral Component interconnect) type of bus is established between notebook 6 and docking station 7. In this way, the notebook 6 contributes importantly to the computing power of the combined system 5 comprised of notebook 6 and docking station 7.

The physical presence of connector 45 on the left rear and connector 65 on the right rear also contribute to the security of alignment and seating of the notebook 6 in the docking compartment 15. Wide snap-springs of docking compartment 15 click into shallow mating recesses of notebook 6, completing the physical security of alignment and seating of notebook 6 in docking compartment 15.

Figure 3:
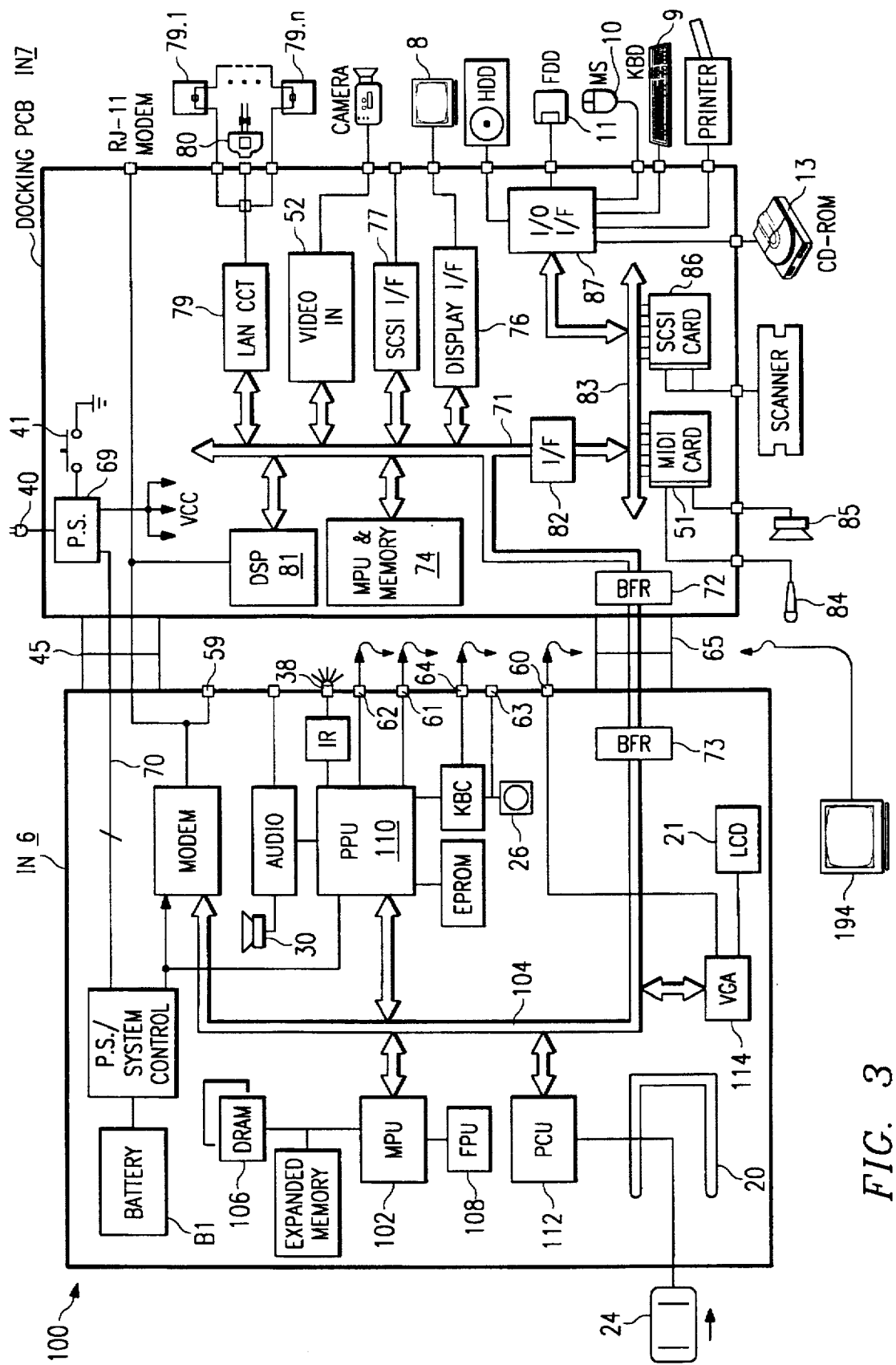
FIG. 3 is an electrical block diagram of the FIG. 1 combined embodiment system of improved notebook computer and docking station system to which the notebook computer system connects.

In FIG. 3, the docking station PCB has a docking station power supply 69 supplying supply voltage VCC to the components of the docking station. Power supply 69 has Power On/Off switch 41, power plug 40, and supplies operating and battery recharging power along power lines 70 through connector 45 to notebook computer 6 which has a printed circuit board and system 100 of interconnected integrated circuits therein as described more fully in connection with FIGS. 5–7 and the later Figures of drawing.

In the docking station PCB, a main bus 71, such as a high bandwidth PCI bus, interconnects via buffers 72, connector 65 and buffers 73 with a high bandwidth bus 104 in system 100 of notebook 6. A docking station microprocessor unit MPU and memory circuitry 74 preferably provides advanced superscalar computing power that is connected to bus 71. A display interface 76 receives display data and commands from bus 71 and supplies video data out to CRT display monitor 8. A SCSI interface 77 communicates with bus 71 and can receive and send data for any suitable SCSI peripheral. Video input circuit 52 receives video data from a video camera, video recorder, or camera-recorder (CAMERA) and supplies this data to bus 71 for processing. A LAN (Local Area Network) circuit 79 provides two-way communication between the docking station 7 and to n other computers having LAN circuits 79.1, . . . 79.n. Token ring, Ethernet, and other advanced LANs are accommodated. An adapter 80 having an interface chip therein provides communication with any LAN system and plugs into a single same socket regardless of the LAN protocol. Such LAN circuitry is described in coassigned U.S. Pat. No. 5,299,193 "Signal interface for Coupling a Network Front End Circuit to a Network Adapter Circuit" issued Mar. 29, 1994 (TI-15009), which is hereby incorporated herein by reference.

A digital signal processor circuit 81 is connected to bus 71, and is adapted for voice recognition, voice synthesis, image processing, image recognition, and telephone communications for teleconferencing and videoteleconferencing. This circuit 81 suitably uses the Texas Instruments TMS320C25, TMS320C5x, TMS320C3x and TMS320C4x, and/or TMS320C80 (MVP), DSP chips, as described in coassigned U.S. Pat. Nos. 5,072,418, and 5,099,417, and as to the MVP: coassigned U.S. Pat. No. 5,212,777 "SIMD/MIMD Reconfigurable Multi-Processor and Method of Operation" and coassigned U.S. Pat. No. 5,420,809, issued May 30, 1995, and entitled "Method of Operating a Data Processing Apparatus to Compute Correlation", all of which patents and application are hereby incorporated herein by reference.

An interface chip 82, such as a PCI to ISA or EISA interface, connects bus 71 with a different bus 83 to which a multimedia (MIDI) card 51 is connected. Card 51 has an input for at least one microphone, musical instrument or other sound source 84. Card 51 has an output accommodating monaural, stereo, or other sound transducers 85. A SCSI card 86 interfaces a document scanner to bus 83.

Still further peripherals compatible with the speed selected for bus 83 are connected thereto via an I/O interface 87 which communicates with connectors for the hard disk drive HDD, the floppy disk drive FDD 11, mouse MS 10, keyboard KBD 9, the CD-ROM drive 13 and a printer such as a laser printer.

A cursory view of the notebook 6 in FIG. 3 shows that various rear connectors 60–64 are physically accessible through aperture 58 of FIG. 2C allowing still additional peripherals to be optionally connected. For example, the display connector 60 is connected to a second monitor 194 so that multiple screen viewing is available to the docking station user. Connector 59 of notebook 6 is connected through connector 45 to the RJ-11 telephone connector on the back of docking station 7 so that the user does not need to do any more than insert notebook 6 into docking station 7 (without connecting to the rear of notebook 6) to immediately obtain functionality from the circuits of notebook 6.

Figure 4:
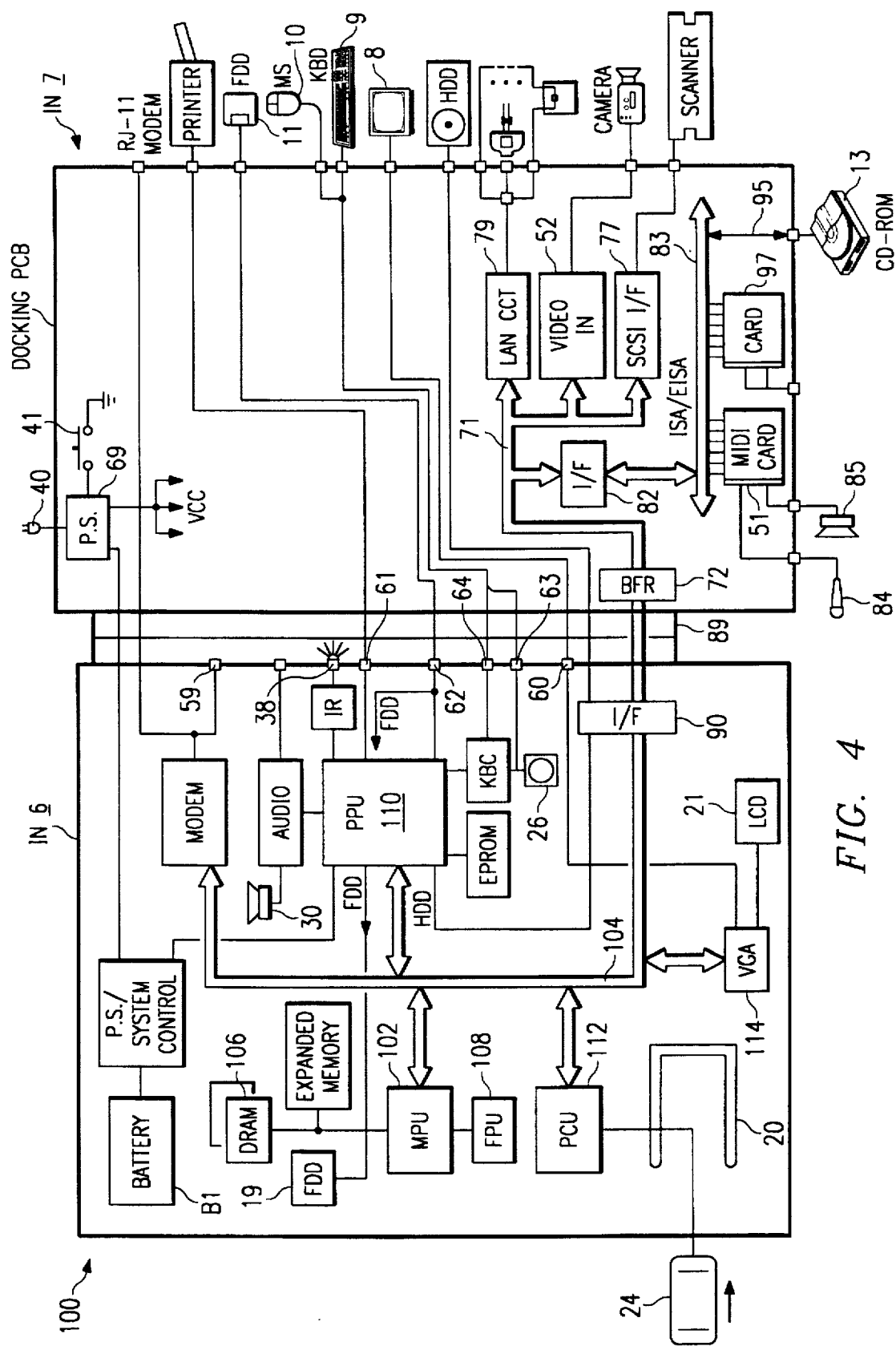
FIG. 4 is an electrical block diagram of another embodiment of an improved computer system for desktop, notebook computer and docking station applications.

In FIG. 4, an alternative embodiment of docking station PCB has a comprehensive connector 89 to which the connectors 60–64 of notebook 6 connect. The connectors 60–64 are not independently accessible physically through any aperture 58 of FIG. 2C, in contrast with the system of FIG. 3. In this way, when notebook 6 is inserted into docking compartment 15, straight-through lines from connectors 60–64 through connector 89 pass respectively to display 8, to a PRINTER peripheral, to floppy disk drive FDD, to mouse MS, and to keyboard KBD. Comprehensive connector 89 not only accommodates lines from a bus to bus interface 90 to bus buffers 72, cascaded between buses 104 and 71, but also has an HDD path from notebook 6 to the internal hard disk drive HDD of docking station 7.

The docking station of FIG. 4 has the printer, FDD, MS, KBD and HDD disconnected when the notebook 6 is removed, by contrast with the docking station and notebook system of FIG. 3. However, the docking station of FIG. 4 confers a substantial economic cost advantage, especially in situations where the user does not need to use these peripherals when the notebook 6 is removed. The docking station of FIG. 3 confers substantial flexibility and functionality advantages, especially in situations in which the docking station continues to be used by a second user when the notebook user has taken the notebook elsewhere. Docking station 7 is augmented by the data and processing power available from notebook 6, when the notebook is reinserted into docking station.

Similar circuit arrangements are marked with corresponding numerals in FIGS. 3 and 4, as to docking station power supply 69, Power On/Off switch 41, power plug 40, notebook system 100, main bus 71, SCSI interface 77, video input circuit 52, LAN circuit 79, interface chip 82, multimedia card 51 and SCSI card 86.

Note in FIG. 4 that the SCSI card 77 is connected to the document SCANNER peripheral, providing advantageously high bandwidth input from the scanner to the hard disk drive HDD, floppy disk drive FDD, and microprocessor unit MPU 102. CD-ROM is connected by path 95 in FIG. 4 to the ISA or EISA bus 83 in FIG. 4. Card 97 connected to bus 83 can accommodate further peripherals or, indeed, a microprocessor board so that the docking station of FIG. 4 is independently usable by second user with the notebook 6 removed.

In either FIGS. 3 or 4, the docking station provides advantageous system expandability through i) ISA/EISA slots, ii) additional HDD space, CDROM, multimedia with monaural, stereo, quadraphonic and other sound systems, and iii) wide bandwidth PCI bus 71 local bus slots. A further area of advantage is quick, easy connections to desired non-portable equipment through i) an easier to use, bigger keyboard, ii) bigger, higher quality, CRT display iii) better mouse, printer, and so on. For example, the user merely pushes the notebook 6 into the docking station 7 quickly and easily, and all peripherals are then hooked up, without any further user hookup activity. Another area of advantage is that the docking station 7 provides a platform by which users can retrofit ISA or EISA add-in cards from a previous installation and obtain their use with the notebook 6.

Figure 5:
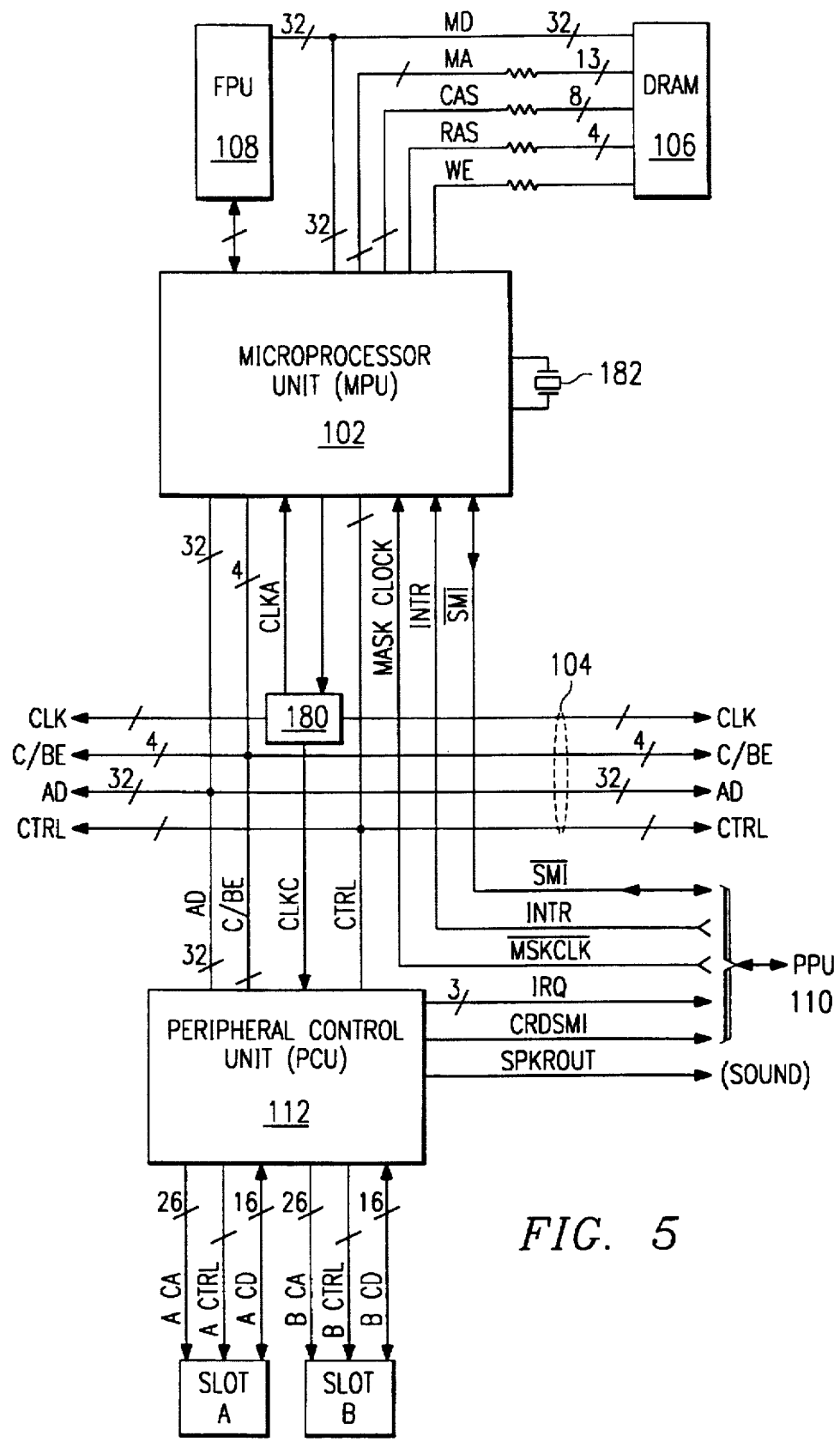
Figure 6:
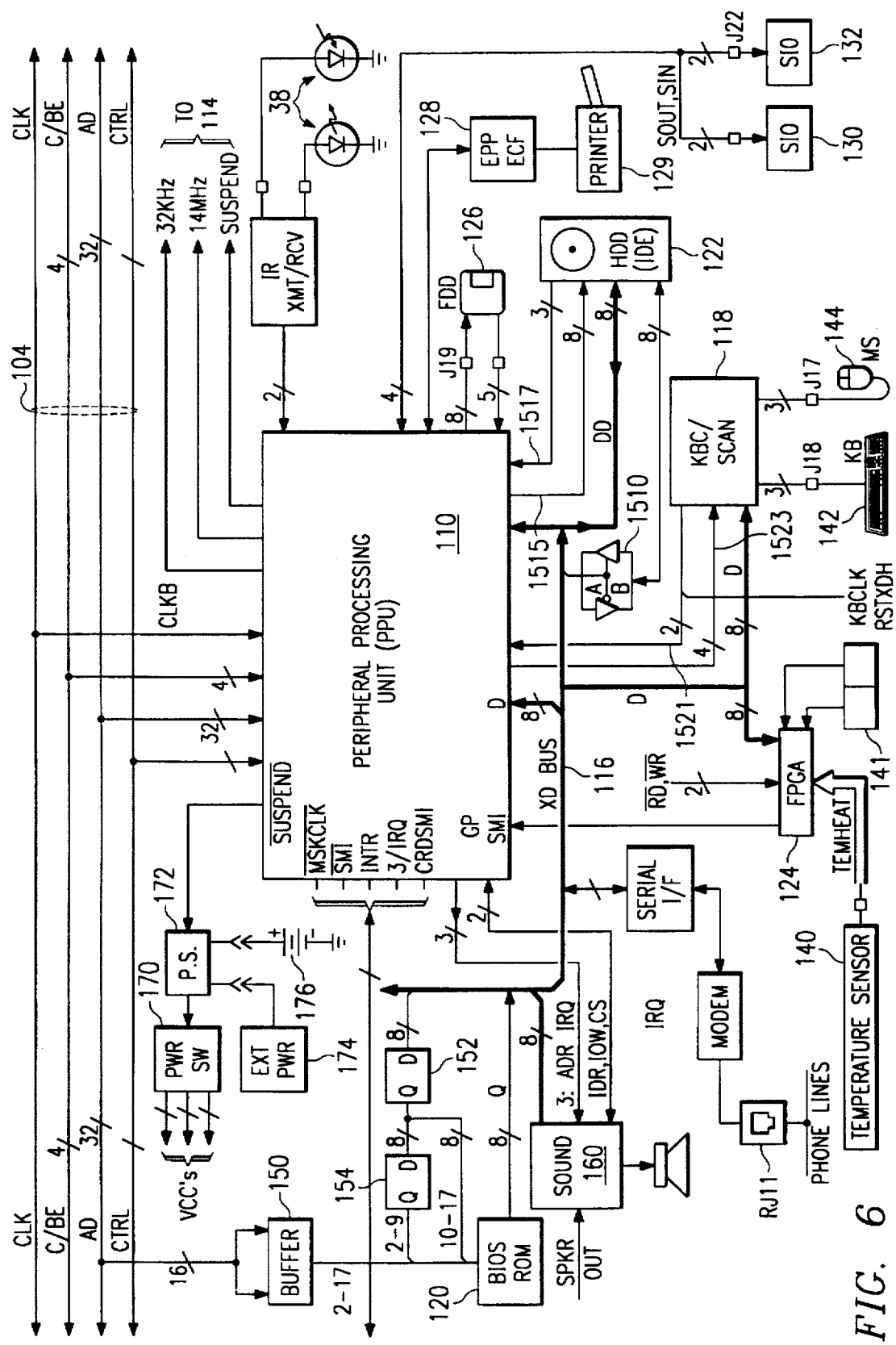
Figure 7:
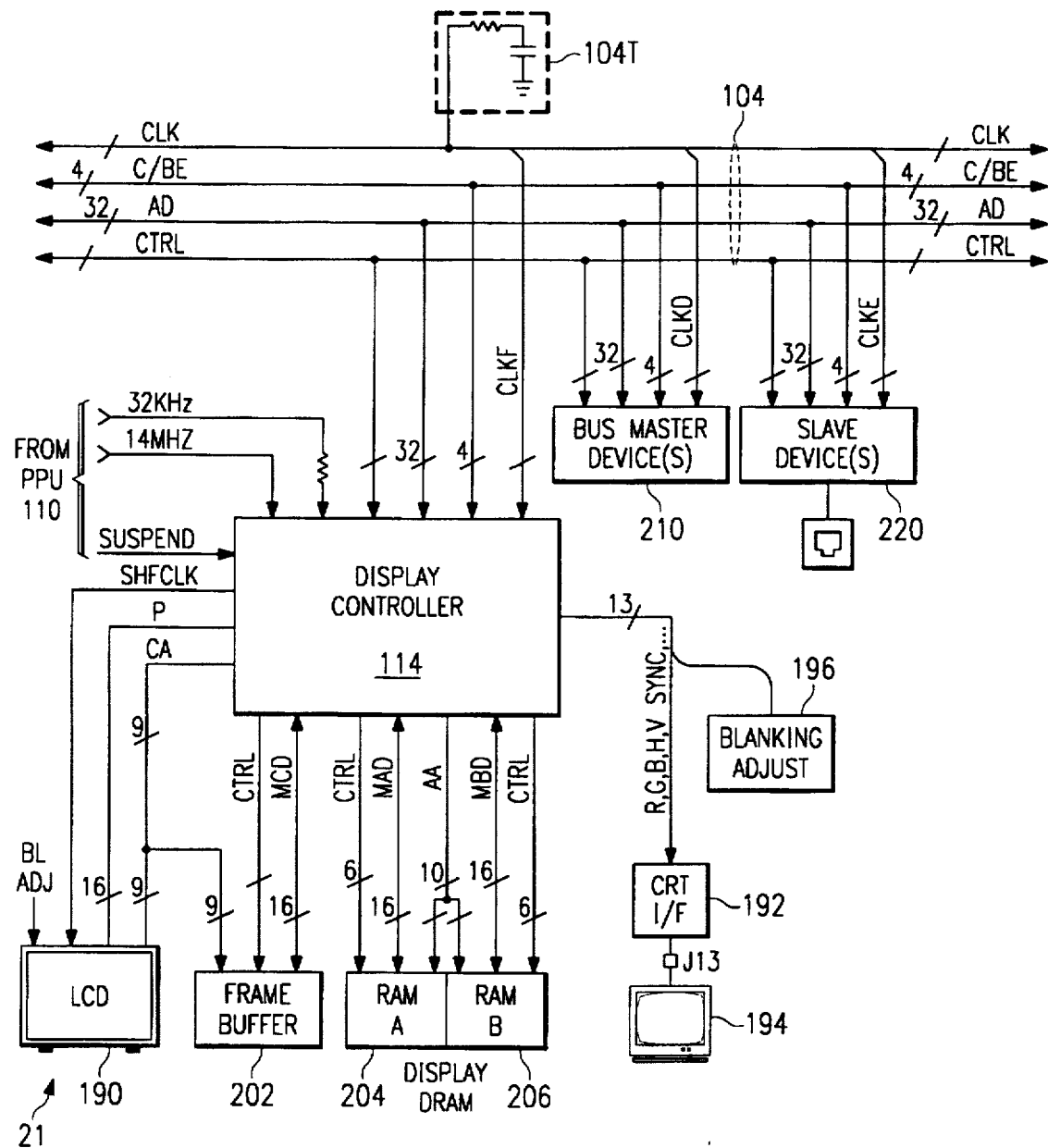

In FIGS. 5, 6, and 7 (which detail the system 100 in FIGS. 3 and 4) a block diagram of a first part of a preferred embodiment computer system 100 shows in FIG. 5 a single-chip microprocessor unit MPU 102 connected to a bus 104, DRAM (dynamic random access memory) 106, FPU (floating point unit) 108, single-chip peripheral control unit (PCU) 112, single-chip peripheral processor unit PPU 110 (shown in FIG. 6) and a display controller 114 (shown in FIG. 7). The FPU 108 of FIG. 5 is suitably either implemented on a separate chip as shown, or integrated onto the same chip as MPU 102 in, for example, a 486DX chip, a 586-level microprocessor, or a superscalar or multiprocessor of any type.

In FIG. 6, PPU 110 has terminals connected via an 8-bit bus 116 to a keyboard controller and scan chip KBC/SCAN 118, BIOS (basic input/output system) ROM (read only memory) 120, HDD (hard disk drive) unit 122, and field programmable logic array (FPGA) chip 124. PPU 110 has further terminals connected to a floppy disk drive (FDD) 126, a printer port EPP/ECF 128 to a printer 129, and two serial input/output ports SIO 130 and 132.

A temperature sensor 140, or heating sensor, is connected via logic 124 to the rest of the system to signal temperature levels and cooperate in the power management of the system.

KBC/SCAN 118 is connected to a computer keyboard 142 and computer mouse input device 144.

BIOS ROM 120 is addressed by addresses by signals from MSB (most significant bits) or LSB (least significant bits) 16-bit halves of bus 104 via a buffer multiplexer (MUX) 150. Also BIOS ROM is addressed via 16 bit addresses built up by successive 8-bit entries from bus 116 in two cascaded 8-bit registers 152 and 154. In this way, separate PPU 110 pins for BIOS ROM addresses are advantageously rendered unnecessary.

An audio sound system 160 is connected to PPU 110, thereby providing sound resources for the system 100.

A power switch circuit 170 responsive to a SUSPEND# (the # suffix indicating, throughout this specification, that the signal is active at a low level) line from PPU 110 controls the supply of power from a power supply 172 to system 100 via three pairs of lines from power switch 170 to supply voltages VPP and VCC to system 100. Power supply 172 is energized by an electrical battery 176 and/or an external power source 174.

A clock switch control circuit 180 (FIG. 5) supplies clock signals for system 100 via a line CLK of bus 104.

Returning to FIG. 5, 4 banks of DRAM 106 are resistively connected to MPU 102 via 13 memory address MA lines, 8 CAS (column address strobe) lines, four RAS (row address strobe) lines, and a WE (write enable) line. 32 memory data MD lines provide a path for data to and from DRAM 106 between MPU 102 and DRAM 106.

A frequency-determining quartz crystal 182 of illustratively 50 MHz (MegaHertz) is connected to MPU 102. A 32 KHz (kiloHertz) output terminal from PPU 110 is connected resistively to display controller 114.

In FIG. 7, display controller 114 is connected directly to an LCD (liquid crystal display) or active matrix display of monochrome or full color construction. Display controller 114 is connected via a CRT (cathode ray tube) interface (I/F) 192 to a CRT computer monitor 194. A blanking adjustment control 196 is connected to display controller 114. A frame buffer 202 is connected to display controller 114 via address, data and control lines. Two sections A and B of display DRAM 204 and 206 are also connected to display controller 114 via their own address, data and control lines.

Additional bus master devices 210, such as LAN (local area network) and SCSI (Small Computer System Interface) are connected to bus 104 in system 100. Also, slave devices 220 connect to bus 104.

Figure 8:
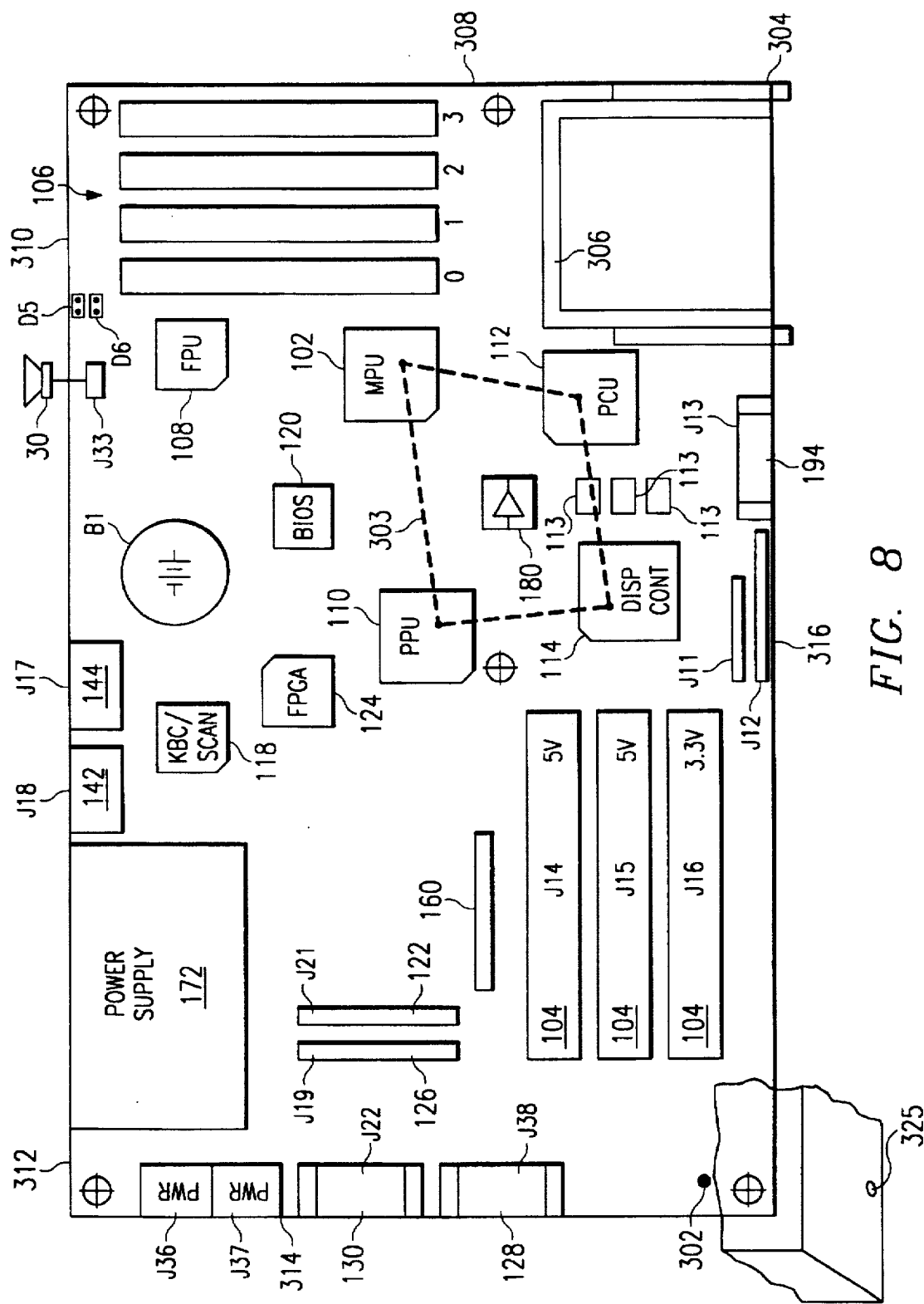
FIG. 8 is a plan view of a preferred embodiment apparatus having a printed wiring board and electronic components of the computer system of FIGS. 5-7.

FIG. 8 is a plan view of a preferred embodiment apparatus having a multiple layer (e.g. 10-layer) printed wiring board 302 and electronic components of the computer system 100 of FIGS. 5-7. FIG. 8 shows a component side of printed wiring board 302, while a solder side of board 302 lies opposite (not shown) from the component side. Arranged at vertices of a centrally located quadrilateral 303, and interiorly disposed on the component side of board 302, are the MPU 102, PPU 110, PCU 112 and video, or display, controller 114. All these component devices 102, 110, 112 and 114 are on a high speed bus 104 (as shown in FIGS. 3 through 7), and because the quadrilateral affords an arrangement whereby these devices are located very close to each other, the high speed bus 104 is advantageously made physically small and compact both for small physical size and low electromagnetic interference due to small electrical size. Near the PCU 112 and near a corner 304 of board 302 lies card connector 306, constructed according to a selected interface standard, such as the Personal Computer Memory Card international Association (PCMCIA) standard.

At the system level, system 100 as implemented in the embodiment of FIG. 8 has a main microprocessor integrated circuit 102, a peripheral control unit (PCU) integrated circuit 112, a peripheral processor unit (PPU) integrated circuit 110, a display controller unit integrated circuit 114, and a bus 104 on the printed wiring board interconnecting each of the integrated circuits 102, 112, 110, and 114. The integrated circuits 102, 112, 110 and 114 establish corners of a quadrilateral 303 bounding the bus 104. Further provided are a plurality of external bus connectors disposed in parallel outside quadrilateral 303 and connected to bus 104. A clock chip 180, such as of the well-known AC244 type, is approximately centrally located inside quadrilateral 303 and connected via approximately equal-length lines to each of the integrated circuits 102, 112, 110 and 114 thereby minimizing clock skew.

Four long DRAM 106 SIMM (single inline memory module) socket connectors for banks 0-3 lie parallel to each other, parallel to a short side 308 of board 302, and perpendicular to the connector 306. FPU 108 is located adjacent to one of the DRAM connectors near the MPU 102. SIMM sockets for the DRAMs provide a direct path for the wiring traces on the printed wiring board 302.

Along a longer side 310 of board 302 lie LED connectors D5 and D6 and a loudspeaker connector J33. Next to the holder for battery B1 are connectors J17 for mouse 144 and J18 for keyboard 142. A power supply unit 172 located on the edge of side 310 lies near a corner 312 diagonally opposite corner 304.

A second short side 314 lies opposite side 308 of board 302. At the edge of side 314 are located two power connectors J36 and J37, a serial connector J22 and a parallel port connector J38 designated "Zippy." Looking interiorly, between side 314 and PPU 110 and parallel to short side 314 are a floppy disk drive connector J19 located closely parallel to a hard disk drive connector J21.

A second long side 316 lies opposite side 310 of board 302. At the edge of side 316 and centrally located are a 15 pin connector J11 parallel to a 20×2 pin header J12. A video connector J13 lies next to J12 below quadrilateral 303.

Between video controller 114 and PCU 112 lie three TMS45160 chips 113, available from Texas Instruments Incorporated, disposed parallel to each other and to side 316 and substantially parallel to the side of quadrilateral 303 defined by vertices 114 and 112. Next to video controller 114 outside quadrilateral 303 lie three bus 104 connectors J14, J15, J16 parallel to each other and to long side 316.

FPGA 124 is located above PPU 110 between PPU 110 and side 310 near power supply 172.

A DOS-compatible static 486 core in MPU 102 allows on-the-fly clock-scale and clock-stop operation to conserve battery power. The special clocking scheme allows optional clock stopping between keystrokes. Low voltage operation such as 3.3 volts or less, coupled with power management, provides the capability to achieve low system battery power consumption. Bus 104 is a high speed high bandwidth bus to improve data transfers of bandwidth-intensive I/O devices such as video. Electrical noise is minimized by this embodiment which has short conductor trace lengths and direct point-to-point clock traces. Each clock trace has a series or parallel termination to prevent undesirable reflections. An economical 74LS244 clock driver 180 is provided in the interior of quadrilateral 303. Placement of that clock driver 180 is such that the length of the clock traces therefrom to each chip 110, 102, 114 and 112 are approximately equal, advantageously minimizing clock skew.

Integrated card controller PCU 112 can be configured to support a portable peripheral bus such as PCMCIA (Personal Computer Memory Card international Association), for example. The connector 306 near corner 304 has one card insertion level in a plane on the top side of board 302 and a second card insertion level in a plane on the underside of board 302.

Single 8-bit ROM 120 support allows for integration of the system BIOS and video BIOS into the same device to reduce motherboard real estate and reduce cost. MPU 102, PPU 110 and PCU 112 are highly integrated into three 208 pin PQFP devices (see FIG. 58 later hereinbelow) which reduces board space and reduces active battery power consumption by integrating all CPU and system logic.

In other embodiments, the PPU 110 and PCU 112 are separate integrated circuit devices. In still other embodiments the MPU 102, PPU 110 and PCU 112 are integrated into only one single-chip device. However, the three chip embodiment shown, with its substantially equal pin numbers, provides remarkable economy and board layout convenience.

In the three-chip embodiment illustrated in FIGS. 5–7, the chips are manufactured using submicron process technology to illustratively provide operation up to 66 MHz and higher at 3.3 volts while keeping power consumption and heat dissipation remarkably low.

Returning to FIG. 8, physical strength and reasonable rigidity without fragility are provided by the relatively small size of board 302. Additional mounting holes near connectors for bus 104 are provided. Board 302 is firmly mounted with screws, bolts, rivets or other mounting elements in an enclosure 325 associated with or comprised by base 22 of FIG. 1. When an external connection to bus 104 is made, such as in a docking station or other environment, the mounting elements in the additional mounting holes advantageously provide substantial load-bearing support strength for improved reliability.

Figure 9:
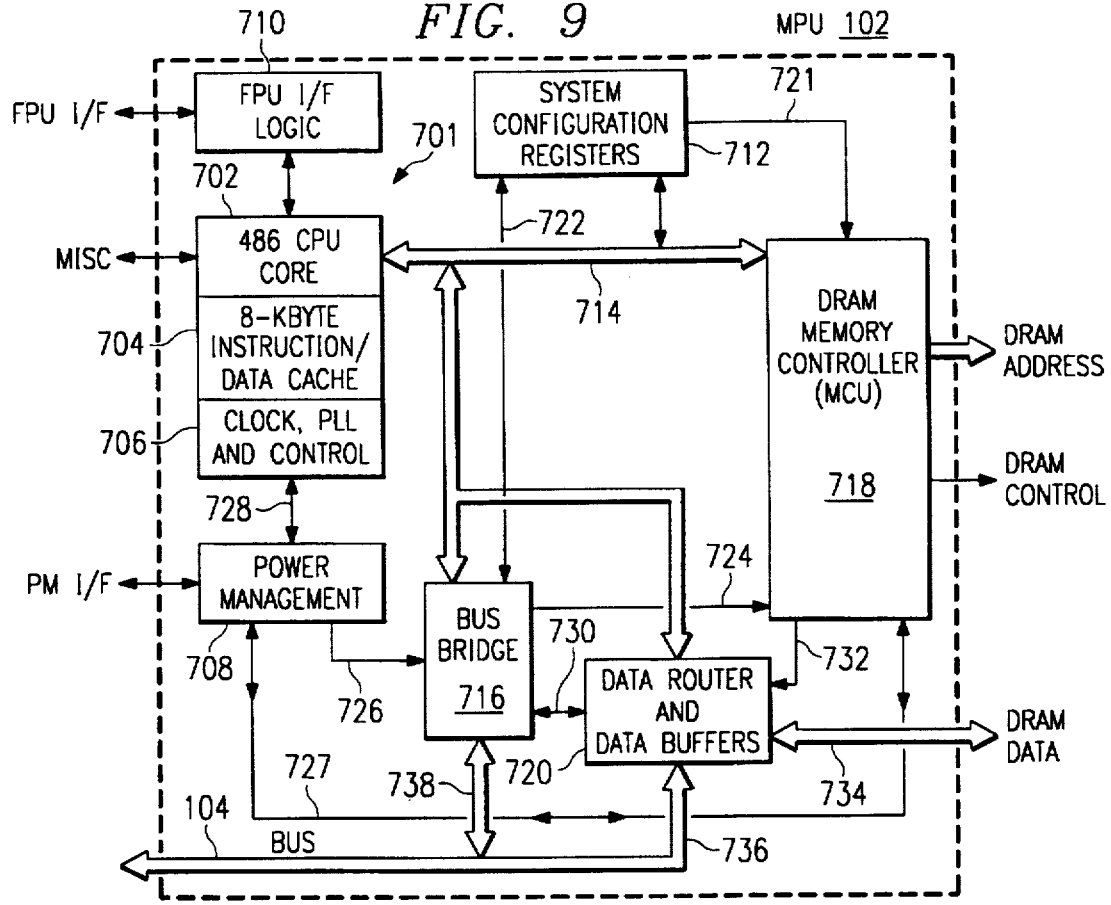
FIG. 9 is a block diagram of a microprocessor unit (MPU) device embodiment for the system of FIGS. 5-7.

In FIG. 9 microprocessor unit (MPU) 102 comprises a preferred embodiment device illustrated in block diagram form. MPU 102 integrates a 486-class CPU (central processing unit) 701 which has a CPU core 702, an 8K-byte write-through 32-bit instruction/data cache 704, and a clock, phase-locked loop (PLL), and control circuit 706. CPU core 702 is described in the TI 486 Microprocessor: Reference Guide, 1993, which is hereby incorporated herein by reference. Cache 704 is two-way set associative and is organized as 1024 sets each containing 2 lines of 4 bytes each. The cache contributes to the overall performance by quickly supplying instructions and data to an internal execution pipeline.

A power management block 708 provides a dramatic reduction in current consumption when the microprocessor MPU 102 is in standby mode. Standby mode is entered either by a hardware action in unit 920 of PPU 110, described hereinbelow relative to FIG. 11, or by a software initiated action. Standby mode allows for CPU clock modulation, thus reducing power consumption. MPU power consumption can be further reduced by generating suspend mode and stopping the external clock input. The MPU 102 is suitably a static device wherein no internal data is lost when the clock input is stopped or clock-modulated by turning the clock off and on repeatedly. In one preferred embodiment, without suggesting any limitation in the broad range of embodiments, the core is a three volt, 0.8 micron integrated circuit having clock operation at 50 or 66 MHz., with clock doubling.

Core 702 has a system-management mode with an additional interrupt and a separate address space that is suitably used for system power management or software transparent emulation of I/O (input/output) peripherals. This separate address space is also accessible by the operating system or applications. The system management mode is entered using a system management interrupt which has a higher priority than any other interrupt and is maskable. While running in the separate address space, the system management interrupt routine advantageously executes without interfering with the operating system or application programs. After reception of the system management interrupt, portions of the CPU are automatically saved, system management mode is entered and program execution begins in the separate address space. System management mode memory mapping into main DRAM memory is supported.

The MPU 102 has interface logic 710 which communicates via external FPU/IF terminals to FPU 108 when the latter is present.

System configuration registers 712 are accessible via a CPU local bus 714. Bus 714 is connected to CPU 701, to a bus bridge circuit 716, and to a DRAM memory controller (MCU) 718. Registers 712 also are bidirectionally connected to the bus bridge circuit 716 via line 722.

DRAM memory controller 718 is connected to system configuration registers 712 via line 721 and receives signals via a line 724 from bus bridge 716. DRAM memory controller 718 supplies DRAM addresses and DRAM control signals to external terminals of single-chip MPU 102. DRAM memory controller 718 is connected by handshake line 727 to power management circuit 708, which circuit 708 is also connected by line 726 to bus bridge 716 and by line 728 to clock, phase lock loop and control circuit 706.

A data circuit 720 provides a data router and data buffers. DRAM memory controller 718 supplies signals to circuit 720 via line 732. Data circuit 720 also bidirectionally communicates with bus bridge 716 via line 730. Data circuit 720 reads and writes DRAM data to external terminals on data bus 734. Main bus 104 connects via terminals to MPU 102 and connects via paths 736 and 738 to data circuit 720 and bus bridge 716 respectively. Data circuit 720 includes two-level posted DRAM write buffers, an integrated four-level DRAM refresh queue, and provides for three programmable write-protection regions.

DRAM memory controller 718 supports up to 256 megabytes or more of DRAM memory with up to four or more 32-bit banks without external buffering. For example, DRAMS of 256K, 512K, 1M, 2M, 4M, 8M, and 16M asymmetric and symmetric DRAMS and up to 64M or higher DRAMS are readily supported. Shadowed RAM is supported. Additionally, the memory interface buffers can be programmed to operate at different operating voltages such as 3.3 or 5.0 volts for different types of DRAMS. The DRAM memory controller 718 is programmable to support different access times such as 60 or 80 nanoseconds (ns). For example, 60 ns. is quite advantageous at 50 and 66 MHz. clock speeds at 3.3 v. Varous refresh modes are programmably supported, such as slow, self, suspend, and CAS-before-RAS refresh. Maximum memory throughput occurs because DRAM parameters are driven off the internal high-speed 50/66 MHz. CPU clock to improve resolution, thus taking full advantage of the integration of the DRAM controller.

The bus bridge 716 acts as an integrated interface which is made compliant with whatever suitable specification is desired of bus 104. Bus bridge 716 advantageously acts, for example, as a bus master when there is a MPU 102 initiated transfer between the CPU and bus 104, and as a target for transfers initiated from bus 104. A bus-quiet mode advantageously supports power management. The bus-quiet mode is used to inhibit cycles on bus 104 when the CPU is accessing the DRAM 106 or internal cache 704. Put another way, bus quieting reduces system power consumption by toggling the data/address bus 104 only on bus transfers. Bus quieting is not only implemented on MCU 718 but also PPU 110 bus bridge 716 and XD/IDE block 934, described hereinbelow relative to FIG. 11. All signals, buses and pins are made to change state only when they need to. For example, each data bus flip-flop holds its state until the next change of state.

As thus described, MPU 102 integrates in a single chip a 486-class CPU, a DRAM controller, and a bus interface in any suitable integrated circuit package, of which one example is 208 pin PQFP (plastic quad flat pack). PPU 110 and PCU 112 also partition system functionality into respective single-chip solutions which can have the same type of package as the MPU 102, such as a plastic package. These latter two chips can even be pinned out in a preferred embodiment from the same 208 pin PQFP package type.

Figure 10:
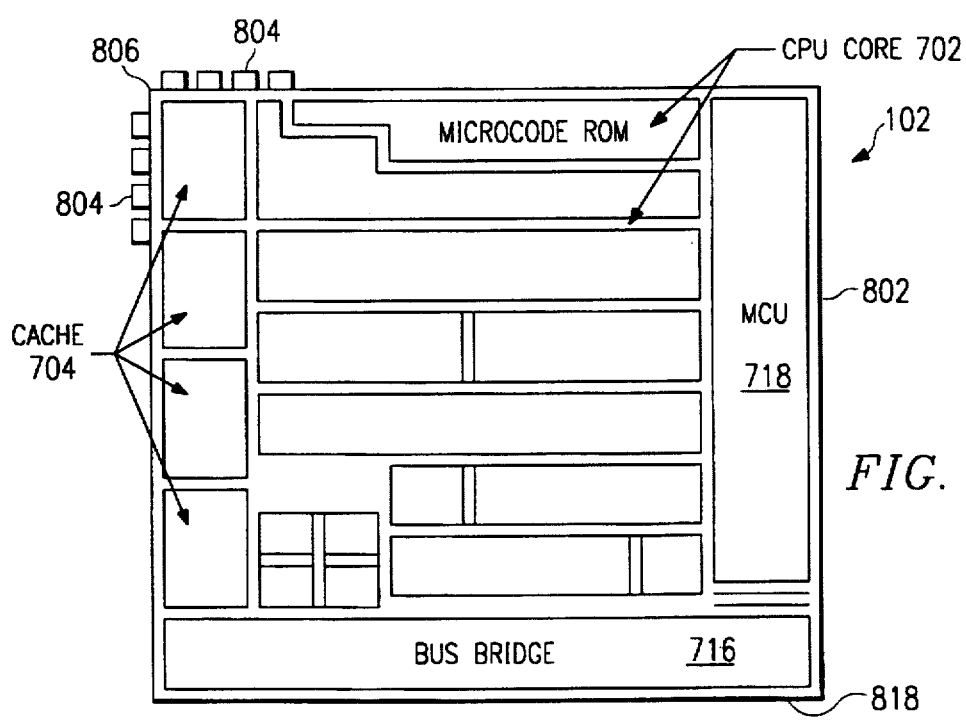
FIG. 10 is a plan view of an integrated circuit with improved topography for implementing the microprocessor unit of FIG. 9.

In FIG. 10 a preferred embodiment layout for MPU 102 has an improved topography wherein MPU 102 is realized as an integrated circuit die with a single substrate 802 with approximately 1:1 ratio of side lengths. Various circuit regions or blocks are fabricated on substrate 802 by a CMOS (complementary metal oxide semiconductor) process. Other processes such as BiCMOS (bipolar CMOS can also be used.

The 486 CPU core 702 is located in one corner of the die to provide maximum accessibility pin-out with short conductor length to bond pads 804 on the nearby margins forming a right angle at the corner 806 of the substrate 802. Cache 704 lies closely adjacent to CPU core 702 for high speed CPU access to the cache. The memory controller 718 MCU is laid out together in an approximately rectangular block of circuitry lying along a strip parallel to cache 704, and perpendicular to microcode ROM and core 702 along substantially most of an edge of the chip 802 opposite to an edge occupied by cache 704. In this way cache 704 and MCU 718 bracket core 702.

On a side 818 opposite microcode ROM of core 702 lies bus bridge 716 laid out in a long strip parallel and stretching most of the length of side 818. Advantageously, the long length of this bus interface 820 provides physical width accessibility to the numerous terminals for connection to the wide bus 104 of system 100 of FIGS. 3–7.

Figure 11:
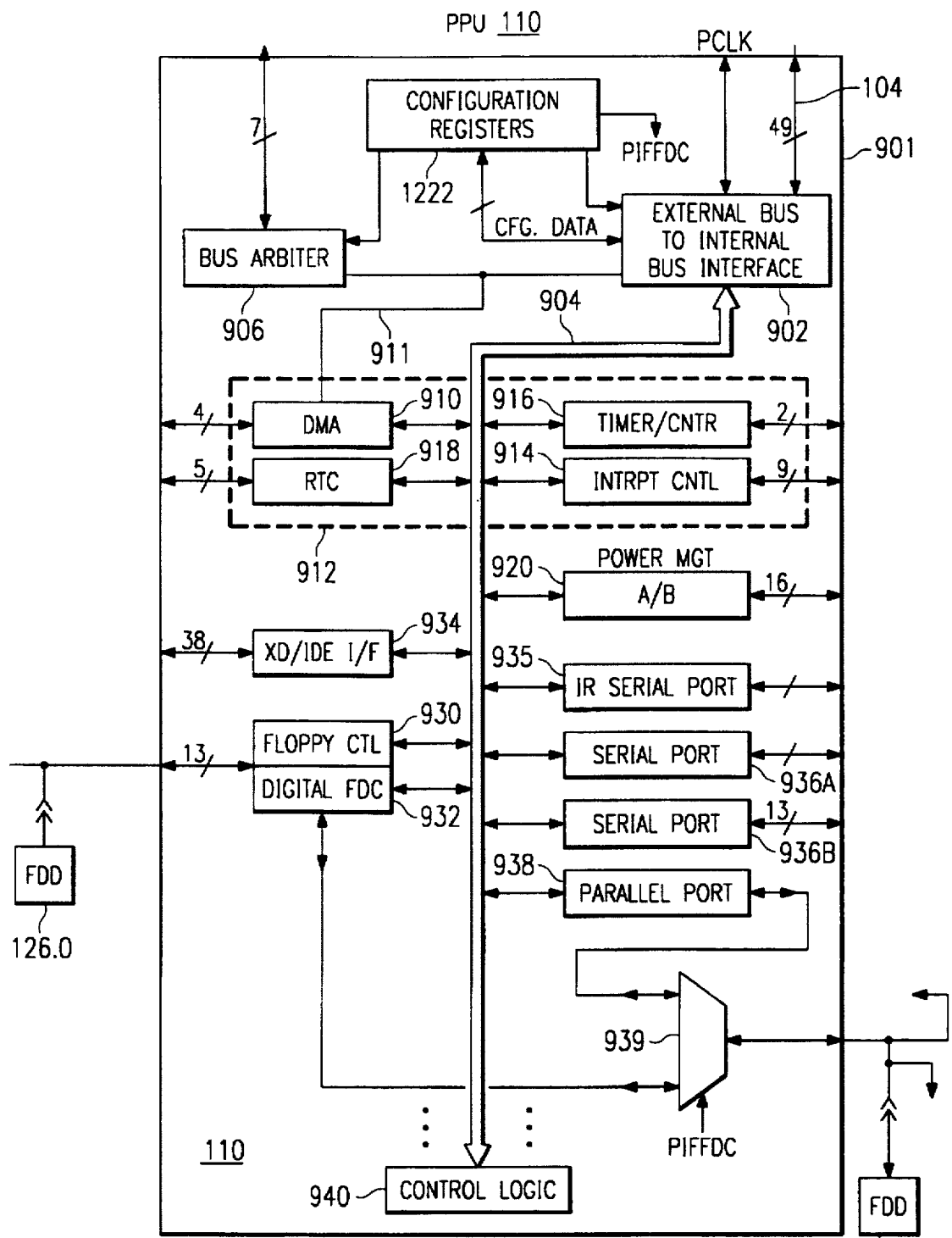
FIG. 11 is a block diagram of a peripheral processing unit (PPU) device embodiment for implementing the PPU in the system of FIGS. 5-7.

In FIG. 11 PPU 110 provides a single-chip solution that has numerous on-chip blocks on chip 901.

First is a bus interface 902 to interface from external bus 104 to an on-chip bus 904. Bus interface 902 is compatible with bus 104 externally, and is at the same time also compatible with bus 904 as a fast internal bus for integration of several peripherals described hereinbelow. For example, the peripherals in various embodiments suitably provide peripheral functions compatible with the IBM-compatible "AT" computers, or compatible with Apple "Macintosh" computers or peripherals having any desired functionality and operational definition as the skilled worker establishes. Bus interface 902 has advantageously short bus 104 ownership when mastering to minimize overall system latency. Bus interface 902 provides fast DMA (direct memory access) transfers from internal I/O devices to agents (circuits) on bus 104.

Bus interface 902 performs a disconnection with retry operation for slow internal accesses to reduce the latency still futher. Illustrative bus 104 frequency is 33 MHz. at either 5 volts or 3.3 volts, although other lower or higher frequencies and voltages are also suitably established in other embodiments. In the embodiment of FIG. 11 the internal bus 904 is suitably clocked at half or a quarter of the bus 104 frequency, and higher or lower frequency relationships are also contemplated.

A bus arbiter 906 on-chip provides arbitration of bus 104 for the MPU 102 of FIG. 5, PPU 110 of FIG. 6, and two external bus masters 210 of FIG. 7. PPU 110 acts as a bus 104 bus master during DMA cycles for transfers between bus 104 and a DMA peripheral 910.

One preferred embodiment provides more peripherals that are compatible with the "PC-AT" architecture. Since the bus 904 provides an on-chip common connection to all of these on-chip peripherals, their speed and other electrical performance are enhanced. For example, two DMA controllers 910 control the DMA transfers through bus interface 902. In PPU 110 DMA controllers 910 are connected to bus 904 and separately also to both bus arbiter 906 and bus interface 902 via path 911. DMA controllers 910 also pin out externally to four pins from bond pads on chip 901. Two interrupt controllers 914 provide channels individually programmable to level-triggered or edge-triggered mode. Also in interrupt controllers 914 is an interrupt router that routes an external interrupt from bus 104 or an interrupt from PCU 112 to a software-selectable interrupt channel. In PPU 110 interrupt controllers 914 and a timer/counter 916 connect to bus 104 and also pin out externally to 9 pins and 2 pins respectively.

An RTC (real time clock) circuit block 918 has an integrated low-power 32 kHz. oscillator and a 128 byte CMOS SRAM (static RAM). Examples of some features and circuitry which are useful in DMA controllers 910, interrupt controllers 914, timer-counter 916 and RTC circuit 918 are commercially available devices, such as the well-known 8237, 8259, 8254 and MC146818 devices, respectively (the 8237, 8259, 8254 devices available from Intel Corporation, and the MC146818 device available from Motorola) together with improvements as described herein. It is also contemplated that still other peripherals be provided on-chip for system purposes as desired.

A power management block 920 has a battery powered first section 920A for operation whenever the system 100 is energized, and a section 920B which is battery powered at all times. Power management block 920 provides clock control for CPU 702 even without a system management interrupt. Mixed voltage (e.g., 3.3 v/5 v) support is provided as a power management function.

Power management block 920 includes system activity timers named the STANDBY timer and the SUSPEND timer which monitor bus 104 activity via DEVSEL# signal, display frame buffer (e.g., VGA) activity (as performed by controller 114 and frame buffer 202 described above relative to FIG. 7), DMA requests, serial port 130 interrupts and chip selects via a COM1 signal, parallel-port 128 interrupts and chip select via a LPT1 signal, hard disk controller 122 interrupts and chip select, floppy disk controller 126 interrupts and chip select, programmable chip select signals, and other interrupts, all such functions described hereinabove relative to FIG. 6. Power management block 920 further provides for short term CPU clock speedup timer monitoring of keyboard 142 and mouse 144 interrupt requests from KBC/SCAN chip 118, as well as bus 104 bus master cycle requests, and masked system activity timer output.

CPU clock masking, or clock-modulation, is provided by power management block 920 hardware that includes a programmable register for adjusting the gate-on-to-gate-off ratio, i.e., a ratio of clock time on to clock time off.

A bidirectional system management interrupt handshaking protocol is supported by power management block 920. Also, six power management traps are provided for IDE block 122, FDD 126, serial port 130 COM1, parallel port 128 LPT1, as described hereinabove relative to FIG. 6, and for programmable chip selects.

Four-bit (16 level) backlight intensity adjustment pulse-width modulation (PWM) advantageously results from the operations of power management block 920 in response to intensity control 34 of FIG. 1.

When power management block 920 has caused substantial sections of PPU110 and the rest of system 102 to be deactivated, reactivation can be initiated by circuitry in block 920 responsive to an RTC alarm, a modem ring, a suspend/resume button, keyboard IRQ (interrupt request), mouse IRQ, ON/OFF button, a card system management interrupt CRDSMI from PCU 112, or a low-to-high transition on a battery input BATLOW.

Shadow registers in power management block 920 support saving the full system state to disk.

Bus quieting and I/O leakage current control circuitry are also included in power management block 920.

Advanced Power Management support is also provided by power management block 920.

Further in FIG. 11, a floppy disk controller block 930, digital disk controller (FDS), hard disk interface XD/IDE 934, serial interface block SIU 936, and a parallel port interface 983 are all coupled to internal bus 904 and to pins externally.

The floppy disk controller block 930 is integrated on-chip in PPU 110 to support 3.5 inch drives (720 kB (kilobyte), 1.44 MB (megabyte), and 2.88 MB) as well as 5.25 inch drives (360 kB and 1.2 MB). All buffers are integrated. Floppy disk controller block 930 has circuitry to accommodate data in several track formats: IBM System 34 format, perpendicular 500 kb/s (kilobits per second) format, and perpendicular 1-Mb/s (one megabit per second) format. A data FIFO (first-in-first-out) buffer operates during the execution phase of a read or write command in block 930. Block 930 also has a 255-step (16 bit) recalibrate command and function. This floppy disk controller block 930 can be reset by software. It has an integrated floppy data separator with no external components in this embodiment. Drive interface signals can be multiplexed to parallel port 938 pins for use with an external drive.

The interface 934 provides a complete IDE hard disk interface logic with high speed access. The IDE hard disk is isolated and can be powered off independently. Also included in interface 934 is a bus interface for XD bus 116 of FIG. 6, which supports BIOS ROM (which can be flash electrically erasable programmable read only memory, commonly referred to as "EEPROM"), provides keyboard controller KBC/SCAN connections, has two user-programmable chip selects, and can connect to audio CODEC (coder-decoder).

Further in FIG. 11 a block for miscellaneous control functions is provided as block 940.

Serial interfaces 936A and 936B each have a 16-byte FIFO for queuing and buffering the serial data to be transmitted and received, and has a selectable timing reference clock of 1.8461 MHz. or 8 MHz.

Parallel interface 938 has a 16-byte datapath FIFO buffer and provides DMA transfer. Support for fast parallel protocols such as ECP and EPP is suitably provided. More than one floppy disk drive FDD 126.0 and 126.1 are suitably accommodated by provision of a multiplexer 939 to mux the output of digital floppy disk controller 932 with parallel port 938. When a control signal PIFFDC from configuration registers 1222 of PPU 110 causes mux 939 to select the floppy disk, then external pins otherwise utilized by parallel port 938 are suitably used instead for a FDD 126.1.

Bus Quieting

The description now turns to the subject of bus quieting. Bus quieting reduces power dissipation and EMI (electromagnetic interference) and RFI (radio frequency interference) because fewer transitions from high to low, or low to high, occur on a given bus. As to power dissipation, fewer transitions mean less power dissipation because inherent capacitance of bus circuitry is charged from the power supply, or discharged, fewer times. Power dissipation is given by the general formula $$P = 0.5 \, C \, V^2 \, f$$

where P is power, C is inherent capacitance, V is supply voltage, and f is number of transitions per second. The 0.5 $C \, V^2$ factor relates to the energy stored in the inherent capacitance, and the factor f establishes how often the capacitance has energy moving in or out of it. The product of the factors represents a rate of energy dissipation which by definition is power dissipation. The bus quieting methods are primarily directed to reducing the repetition rate factor f.

Figure 12:
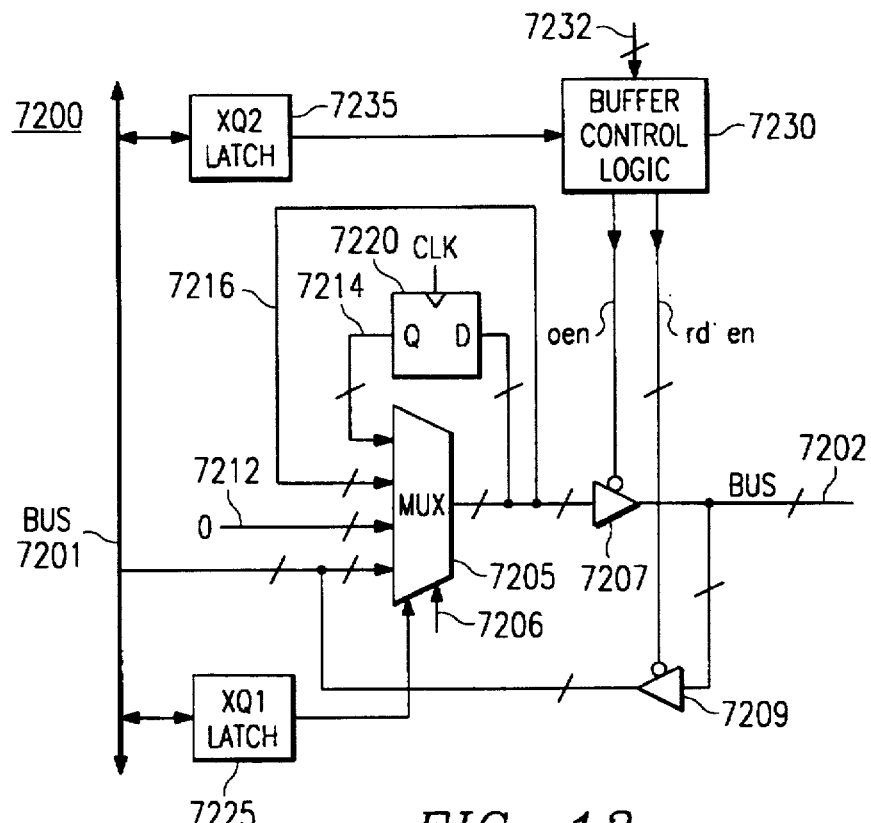
FIG. 12 is a block diagram of a bus-quieting circuit embodiment.
Figure 13:
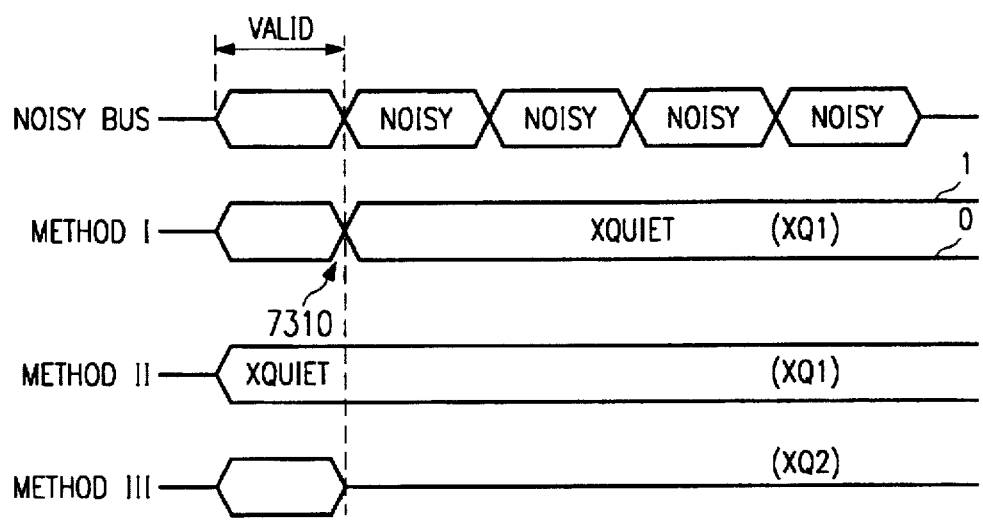
FIG. 13 is a waveform diagram representing bus-quieting method steps.
Figure 14:
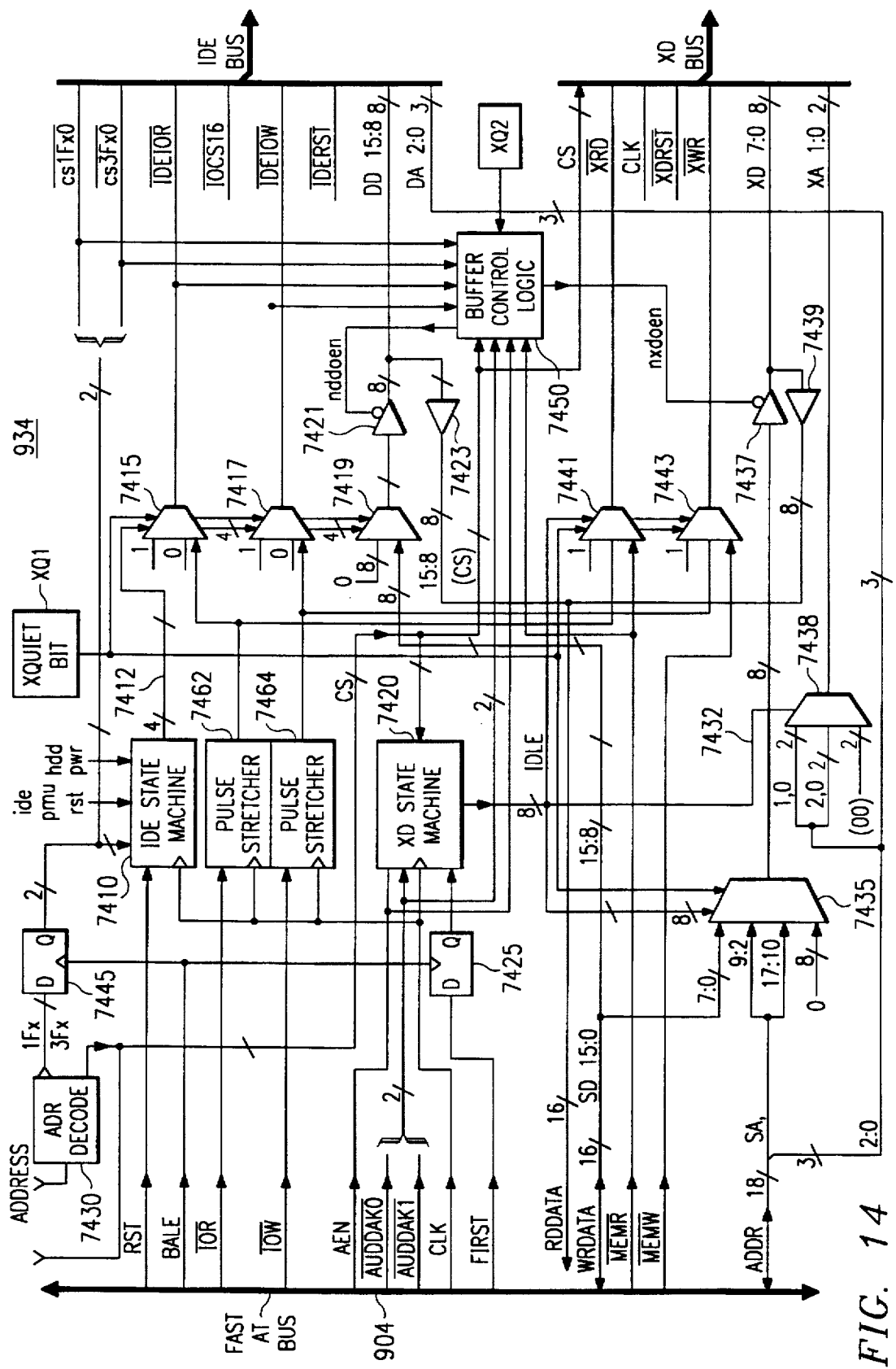
FIG. 14 is a partially block, partially schematic diagram of a bus interface embodiment of PPU 110 of FIG. 11 for bus types such as the X-bus (XD) and intelligent drive electronics (IDE) types, improved with bus quieting circuits and methods.

FIGS. 12 and 13 show circuitry and methods respectively for implementing different improved approaches in bus quieting in a general case of interfacing two buses or lines. These circuits and methods are implemented in whole or in part anywhere in the systems of FIGS. 3–7 that the real estate overhead is justified by the power reduction achieved. For example, bus quieting circuitry is advantageously implemented in the PPU 110 in the XD/IDE I/F 934 among other blocks in PPU 110. A preferred embodiment circuit for XD/IDE 934 is illustrated in FIG. 14, for example. Also, bus quieting circuitry as taught herein is suitably provided in the main microprocessor MPU 102 in the memory controller unit MCU 718 and data router and data buffers 720, among other places. Still further bus quieting circuitry as described is suitably provided in the PCU 112 and other components of the illustrated systems. For instance, a display controller chip 114 has substantial memory traffic to frame buffer 202, and RAMs 204, 206 to which the bus quieting methods and structures as taught herein are applicable. The improved bus quieting circuits, systems and methods described herein are intended for reduced instruction set computer (RISC) and complex instruction set computer (CISC) portable computers, desktop personal computers, workstations, embedded microprocessor and microcomputer applications, battery powered applications of all types, and indeed to all circuits, systems and applications to which their advantages commend them.

In FIG. 12, an improved bus quieting circuit 7200 is implemented in an interface between a first bus 7201 and a second bus 7202. A selector, or multiplexer (mux), 7205 has a first input connected to first bus 7201, and an output connected via an output buffer 7207 (with low active output enable oen) to second bus 7202. An input buffer 7209 (with low active input enable rd en) is connected with its input connected to second bus 7202 and its output connected to bus 7201, bypassing mux 7205.

Mux 7205 has a second input 7212 tied to a predetermined level, such as zero (0 or "low"), and a third input 7214 connected to the Q output of a data latch 7220 clocked with a clock CLK of bus 7201. Latch 7220 has a data D input connected to the output of the mux 7205.

A fourth input to mux 7205 is directly connected to the mux 7205 output by lines 7216. This circuit can function similarly to the latch arrangement provided there is no need for clock synchronization and wherein the mux 7205 is preferably glitch-free on a mux 7205 switchover operation from bus 7201 input to lines 7216. In this way the mux 7205 performs both selection and latch functions.

Mux 7205 has control inputs among which is the output of a first bit latch 7225 for a bus-quieting control bit XQ1. The latch 7225 is accessible via bus 7201, and/or bus 7202 as desired, so that the quieting mode can be established on setup or disabled. The ability to software-select the quieting mode or to disable it on command confers power reduction and RFI reduction advantages with bus quieting enabled. When quieting is disabled in the context of an output buffer coupling internal circuitry or an internal bus of an integrated circuit to external pins or external circuitry, the ability to disable quieting confers internal visibility advantages for monitoring, test and debug operations.

Thus, an improved system (FIGS. 6 and 7) comprises an integrated circuit (e.g. PPU 110) having bus quieting with the mode enable/disable features herein, combined with peripherals (e.g. memory 120, sound 160, KBC 118, Hard Disk Drive HDD 122) and also with a monitoring circuit or external test circuitry (e.g. in FPGA 124) or a computer (e.g. MPU 102, bus master 210, or docking station test computer) external to the integrated circuit. The bus quieting feature is software accessible to enable or disable the bus quieting mode or modes in low-power system operation (bus-quieting on and mode type selected) and in monitoring, test and debug operations (bus-quieting turned off).

Latch 7225 has one or more bits as needed to enable no quieting (NOISY BUS of FIG. 13) or enable any selected quieting mode, as the case may be. If a single quieting mode such as Method I or Method II of FIG. 13 is implemented, one bit XQ1 suffices. If both Method I or Method II are provided as quieting options, then latch 7225 is suitably a two-bit latch.

A buffer control logic circuit 7230 has control outputs connected to output enable oen and input enable rden respectively. Among other inputs 7232 to circuit 7230 is a second quieting control bit XQ2 for tristating (floating, disabling, three-stating) at least the buffer 7207 in Method III of FIG. 13. The latch 7235 is accessible via bus 7201, and/or bus 7202 as desired, so that the Method III quieting mode can be established on set up or disabled.

In FIG. 13, suppose a particular data line of bus 7201 is valid during an interval VALID. After its strobe included in control line 7206 becomes inactive, subsequent activity on that data line of bus 7201 continues to produce transitions NOISY on bus 7202 in the absence of bus quieting. Note that NOISY as used here to describe a signal or bus, is considered as one or more logic values which are present on a second bus or signal line (e.g. XD or IDE bus) when that second bus or signal line is not involved in or necessary to an ongoing transaction on a first bus (e.g. 904) to which the second bus is in fact coupled.

Advantageously, in Method I of FIG. 13, a first step of asserting valid data and passing the data from a first line to a second line is followed by a quieting step of forcing the second line to a predetermined level until valid data for the second line is again presented.

In a circuit implementation for practicing one form of Method I of FIG. 13, the presence of a bit or bits in latch 7225 of FIG. 12 causes MUX 7205 to select a predetermined level zero on line 7212 as shown by a lower parallel line "0" in Method I of FIG. 13. In an alternative embodiment, a complementary logic value one (1) is instead provided at input 7212 or at an additional input of mux 7205. Then a second form of method I is practiced wherein bus 7202 is forced to the high level "1" in FIG. 13.

In a second method embodiment Method II of FIG. 13, a first step of asserting valid data and passing the data from a first line to a second line is followed by a quieting step of maintaining the second line at a predetermined level identical to the level of the just-presented valid data, for a predetermined or otherwise established period of time extending beyond the valid interval and/or until different valid data for the second line is later presented.

In a circuit implementation for practicing one form of Method II of FIG. 13, the presence of a bit or bits in latch 7225 of FIG. 12 causes MUX 7205 to select the input 7214, whereupon the latched value of the valid data on bus 7201 held in latch 7220 is maintained and passed on to bus 7202 via input 7214, mux 7205, and buffer 7207. Method II eliminates a transition 7310 which may occur in Method I but uses slightly more complex circuitry then Method I. Note that when valid data, or even a "noisy" level in FIG. 12, has the same logic level as a bus-quieting logic level, then no transition would occur.)

Both Method I and Method II advantageously provide outputs that can be either used on or off-chip without additional pull-up or pull-down circuitry on Bus 7202. In applications where such circuitry is already present, or its lack is of no concern, or providing it is no impediment, Method III recognizes that bus quieting can be introduced by tristating bus output buffer 7207 under control of buffer control logic 7230 and quieting control bit XQ2 in latch 7235.

Thus, in the methods, according to the preferred embodiments of the invention, as illustrated in of FIG. 13, a first step of asserting valid data and passing the data from a first line to a second line is followed by a quieting step of disconnecting or decoupling the first line from the second line for a predetermined or otherwise established period of time between data-valid intervals. In Method III, the decoupling can involve floating or disabling a coupling element that is interposed between the first and second lines. In Method II, the decoupling can involve coupling a latch instead of bus 7201 to bus 7202. In method I, the decoupling can involve coupling a predetermined logic level instead of bus 7201 to bus 7202.

It should be apparent that in some embodiments, portions of the circuitry of FIG. 12 can be omitted. For example, if method III is not practiced, latch 7235 is omitted. If only method I is practiced, the latch 7220 can be omitted. If only method II is practiced, then latch 7220 on line 7214 (or return line 7216) is retained, and the input 7212 can be omitted.

Also, slash marks as shown in FIG. 12 indicate that the circuit can be replicated for all of the data lines and applicable control lines in the busses to which quieting is relevant.

Where Method I is applicable to control lines and Method II is more advantageous for data lines, then the circuit of FIG. 12 is suitably configured so that a single one XQ1 bus-quieting control simultaneously enables Method I for the control line circuits and Method II for the data line circuits. In such type of embodiment, the circuit of FIG. 12 is not precisely replicated, but instead has the mux 7205 control circuitry designed to implement the respective methods. Also, different bus quieting methods can suitably be applied to different lines of the same bus under control of the same, or different, bus quieting bits.

As a further example, FIG. 14 shows a detailed block diagram of bus quieting circuitry and related circuitry in XD/IDE interface 934 of FIG. 11. Here, a fast-AT bus 904 internal to PPU 110 is coupled to distinct buses comprising the IDE bus to a hard disk drive external to PPU 110, and an XD bus to other external peripherals as shown in FIG. 6 herein. Attention is directed, in this regard, to copending application Ser. No. 08/363,198, and the other copending applications noted in the Background of the Invention hereinabove, which are incorporated herein by reference.

In FIG. 14 an IDE bus control state machine 7410 and an XD bus control state machine 7420 are respectively coupled to bus 904. IDE bus control state machine 7410 has inputs for bus 904 reset line RST, and bus clock line CLK (also called SYSCLK), as well as IDE power management reset line ide pmu rst and Hard Disk Drive Power control line hdd pwr. These latter two lines are respectively coupled from a reset generator and a power control block of the power management unit 920B of PPU 110. For additional detailed description of the reset generator and power control block, attention is directed to the above-referenced incorporated application Ser. No. 08/363,198, and the other copending applications noted in the Background of the Invention hereinabove. IDE bus control state machine 7410 has four output lines 7412 coupled to control A) a mux 7415 supplying an IDE I/O Read output IDEIOR# of the IDE Bus, B) correspondingly control a mux 7417 supplying an IDE I/O Write output IDEIOW# of IDE Bus, and C) correspondingly control a mux 7419 supplying IDE input/output data lines DD[15:8] of the IDE Bus via an output buffer 7421. Lines 7412 are respectively active to signify a corresponding one of four states of state machine 7410.

XD bus control state machine 7420 has inputs for ISA bus 904 lines AEN (Address Enable high for memory addressing of DMA; low for I/O cycle), AUDDAK0# and AUDDAK1# (Audio DMA Acknowledges), clock CLK, and a bus 904 line FIRST (signals First byte of ROM address) via a BALE-clocked (Bus Address Latch Enable) latch 7425. Low-active chip selects CS are provided for ROM nromcs, keyboard controller nkbccs, and programmable chip selects zero and one: npcs0, npcs1. The chip selects CS are output from a bus address decoding unit 7430 or from software accessible register bits as the skilled worker may choose to implement. The chip selects are not only supplied to state machine 7420 but also to the XD Bus itself.

XD bus control state machine 7420 has eight output lines 7432 to control a mux 7435. Mux 7435 supplies XD bus data lines XD[7:0] via an output buffer 7437. Among the eight lines 7432 is a line IDLE indicative of an Idle state of state machine 7420. Line IDLE is connected to a control input of each of 1) a mux 7441 supplying an XD Bus Read line XRD# and 2) a mux 7443 supplying an XD Bus Write line XWR#.

The important Bus Quieting bit XQ1 of FIG. 14 is connected to a control input of each of muxes 7415, 7417, 7419, 7435, 7441 and 7443. In the embodiment of FIG. 14, the XQUIET bit is active high to quiet buses IDE Bus and XD Bus when there is no access, and otherwise when low to turn bus quieting off. This bus quieting operation is described in still further detail herein after some further description of the state machines 7410 and 7420 in connection with FIGS. 15 and 16 respectively.

Figure 15:
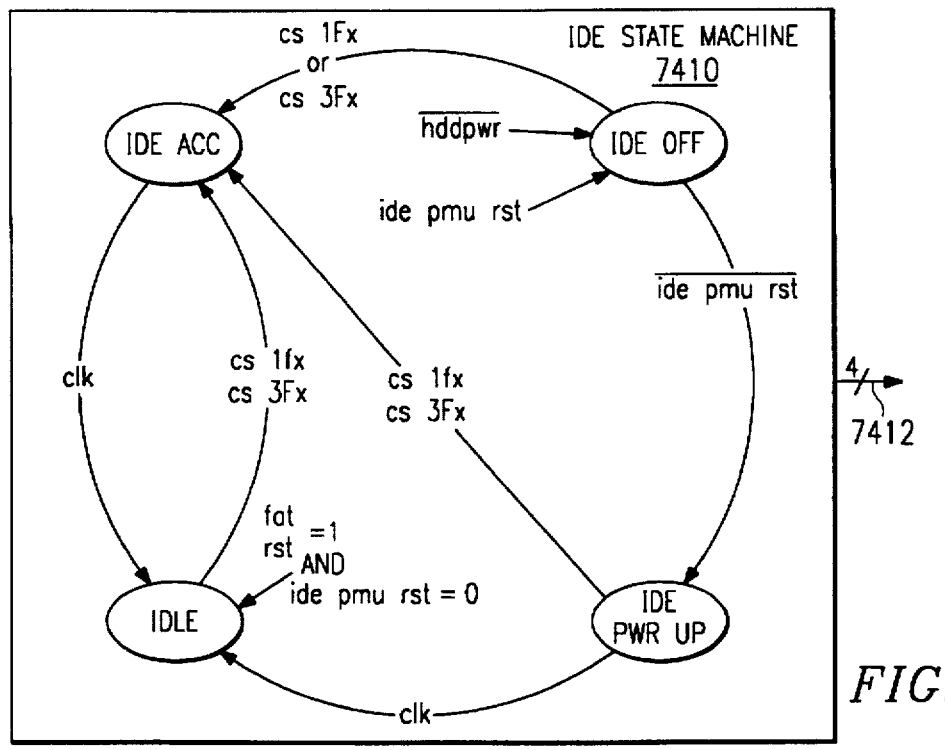
FIG. 15 is a state transition diagram representing an IDE bus control state machine in the embodiment of FIG. 14.

In FIG. 15, IDE bus control state machine 7410 is constructed in sequential logic to have four states IDE OFF, Power Up state IDE PWR UP, IDE Bus Access state IDE ACC, and an IDLE state. Since a state machine is suitably implemented in custom logic, programmable array logic (PAL) and other forms according to any chosen technique, the discussion focuses on the state transition diagram which more concisely describes the state machine.

In state machine 7410, an occurrence of active power management reset signal ida pmu rst, or inactive disk drive power control signal hddpwr#, sends the state machine 7410 to the IDE OFF state. An occurrence of a chip select for hard disk drive indicated by address 1Fx or 3Fx sends the state machine 7410 to state IDE ACC directly from any of its three other states. Such address is decoded by decoder 7430 of FIG. 14 on respective 1Fx and 3Fx decode output lines to a 2 bit latch 7445 clocked by bus address latch enable signal BALE. The 2 bit latch 7445 latch outputs are not only fed to OR-circuitry in IDE state machine 7410 but also to respective cs1Fx# and cs3Fx# lines of IDE Bus, and to inputs of a buffer control logic block 7450.

Further in FIG. 15, if neither cs1FX or cs3Fx is active and the state machine is in IDE OFF, a transition occurs from IDE OFF to IDE PWR UP upon the power management reset being or going inactive (ida pmu rst going low). Otherwise, in the absence of cs1Fx or cs3Fx active or IDE OFF transition as described, the next bus 904 clock clk rising transition will take operations to IDLE state from either IDE ACC or IDE PWR UP state. The IDLE state is also reached by assertion of a Bus 904 reset signal (fat rst) provided power management reset ida pmu rst is not active.

The circuitry of IDE state machine 7410 is arranged to take one of the four lines 7412 high representing whichever one of the four states IDE OFF, IDE PWR UP, IDLE or IDE ACC is active.

Figure 16:
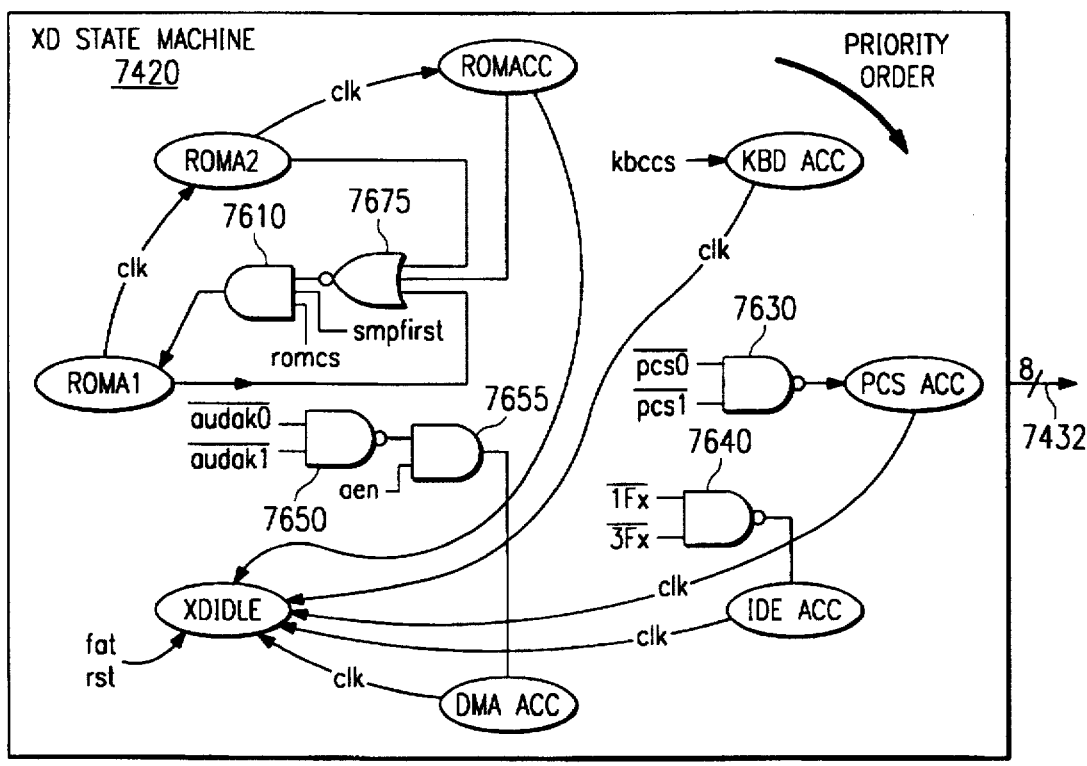
FIG. 16 is a state transition diagram representing an XD bus control state machine in the embodiment of FIG. 14.

In FIG. 16, XD Bus control state machine 7420 has eight states and 8 corresponding output lines 7432 for states ROMA1 (ROM address, send first byte), ROMA2 (ROM address, send second byte), ROMACC (ROM data access), Keyboard Access KBD ACC, Programmable Chip Select Access (PCS ACC), Hard Disk Drive Access (IDE ACC), Direct Memory Access Circuit Access (DMA ACC), and XD State Machine idle state (XDIDLE). Except for immediate transition to IDLE from any state upon Bus 904 Reset signal fat rst, the transitions are made on low-to-high clock clk edges when various conditions occur as next described.

As indicated by circuitry including AND gate 7610 and NOR-gate 7675, state ROMA1 is reached whenever a ROM chip select signal romcs is active and a smpfirst output of latch 7425 (shown in FIG. 14) is active and the state is not already any of states ROMA1, ROMA2, or ROMACC. Operations move from state ROMA1 to ROMA2 after a clock cycle, and from state ROMA2 to ROMACC after another clock cycle. If operations do not begin with ROMA1 as just described, a priority of state selection determines the state according to whatever chip select is active or to resolve contention if more than one chip select is active:

Top priority: ROMACC if romcs is active
Next: KBD ACC if kbccs is active
Next: PCS ACC if either pcs0 or pcs1 is active (NAND 7630)
Next: IDE ACC if either 1Fx/3Fx address active (NAND 7640)
Next: DMA ACC if aen active and either AUDDAK0 or AUDDAK1 active (NAND 7650, AND 7655)
Last Priority: IDLE if no chip select active, upon next clock.

The description now returns to FIG. 14 to discuss the bus quieting operations controlled by these state machines 7410, 7420 and the XQUIET software-accessible bus quieting control bit.

In FIG. 14, mux 7415 has three inputs respectively for a logic one, a logic zero, and a bus 904 I/O Read IOR# signal stretched by a pulse stretcher circuit 7462. Mux 7417 has three inputs respectively for a logic one, a logic zero, and a bus 904 I/O Write IOW# signal stretched by a pulse stretcher circuit 7464. Mux 7419 has two 8-bit inputs respectively for logic zeros, and a bus 904 data high-byte SD[15:8].

The mux 7415, 7417, 7419 outputs are controlled by the IDE state machine 7410 states and, further in the IDLE state specifically, by the XQUIET hie as well. In IDE ACC, mux 7415, 7417 outputs are stretched IOR#, IOW#; and mux 7419 output passes SD[15:8]. Any of the IDE ACC state output signal and the signals that produce IDE ACC can be regarded as indicative of valid data for the present purposes. In IDE OFF, the mux 7415, 7417 outputs are both zero (read and write both active) to avoid dumping current into the external hard disk drive 122, assuming it is off; and mux 7419 data output is all zeros. In IDE PWR UP, the mux 7415, 7417 outputs are both one to inactivate hard disk drive read and write; and mux 7419 output is all zeros.

In the IDLE state of the state of state machine 7410, bus quieting bit XQUIET controls the bus quieting function described above relative to FIG. 14. If XQUIET is zero (no bus quieting), the operation is just like IDE ACC state, and the operations on bus 904 drive the lines on the IDE Bus causing avoidable power dissipation.

However, if in the IDLE state of state machine 7410, XQUIET is one (bus quieting active), Method I of FIG. 13 is implemented in the following way. The one (1) inputs of mux 7415 and 7417 are selected to inactivate the read and write outputs IDEIOR# and IDEIOW# by forcing them to a high logic level (1). The zero (0) 8-bit input of mux 7419 is selected to drive the data lines DD[15:8] to zeroes on the IDE Bus. (In an alternative embodiment they are all driven high (ones) on DD[15:8] if zeroes do not produce the lower power quiescent condition for the IDE part of system 100.)

Further in FIG. 14, mux 7441 has three inputs respectively for a logic one, a bus 904 memory read MEMR# (connected also to buffer control logic 7450), and a bus 904 I/O Read IOR# signal stretched by a pulse stretcher circuit 7462. Mux 7443 has three inputs respectively for a logic one, a bus 904 memory write MEMW#, and a bus 904 I/O Write IOW# signal stretched by a pulse stretcher circuit 7464. Mux 7435 has four 8-bit inputs respectively for a bus 904 data low-byte SD[7:0], low word-address byte SA[9:2], high word-address byte SA[17:10], and an 8-zeroes input.

The mux 7441, 7443, 7435 outputs are controlled by the XD state machine 7420 states and, further in the XDIDLE state specifically, by the XQUIET bit as well. In states KBD ACC, PCS ACC, and DMA ACC, the mux 7441, 7443 outputs are stretched IOR#, IOW#; and mux 7419 output passes data low-byte SD[7:0]. In states ROMA1, ROMA2 and IDE ACC, the mux 7441, 7443 outputs are both one to inactivate XD bus read XRD# and write XWR#; and mux 7435 output is word-address low-byte, word-address high-byte, and data low-byte for these states respectively. In state ROMACC, the mux 7441, 7443 outputs are bus 904 MEMR# and MEMW# respectively; and mux 7435 output is data low-byte (in case the ROM is EEPROM and thus writable).

In the XDIDLE state of state machine 7420, the state of bus quieting bit XQUIET controls the bus quieting function described above relative to FIG. 14. If XQUIET is zero (no bus quieting), the mux 7441, 7443, 7435 operation is the same as in the ROM ACC state, and the operations on bus 904 drive the lines on the XD Bus causing avoidable power dissipation.

However, if in the XDIDLE state of state machine 7420, XQUIET is one (bus quieting active), Method I of FIG. 13 is implemented in the following way. The one (1) inputs of mux 7441 and 7443 are selected to inactivate the read and write outputs XRD# and XWR#. The zero (0) 8-bit input of mux 7435 is selected to drive the data lines XD[7:0] to zeroes on the XD Bus. (In an alternative embodiment they are all driven high (ones) on XD[7:0] if zeroes do not produce the lower power quiescent condition for the XD part of system 100.)

In another alternative embodiment, muxes 7419 and 7435 of FIG. 14 are each replaced with the circuit of FIG. 12 to operate latch 7220. In this way, data bus quieting Method II is employed for the data lines while Method I is used to quiet the read and write lines.

An address line mux 7438 is controlled by the eight state line outputs from state machine 7420 and not by the XQUIET bit. XD bus byte-address lines XA[1:0] are ordinarily fed with the corresponding 2 LSB lines SA[1:0] in all states except KBD ACC wherein XA[1] is instead fed by SA[2]. Also, for state machine 7420 states DMA ACC, IDE ACC and XDIDLE, the byte address lines XA[1:0] are forced by mux 7438 to 00 (both zeroes) to ensure aligned addresses.

Description turns now to the I/O buffers 7421, 7423 and 7437, 7439 and to the buffer control logic 7450.

In FIG. 14, buffer control logic 7450 has low active outputs IDE data output enable nddoen to output buffer 7421 and not to input buffer 7423. XD data output enable nxdoen to output buffer 7437 and not to input buffer 7439.

The buffer control logic 7450 basically sifts its inputs to determine whether a read or write on which bus (IDE or XD bus) is being selected, and then enables an output buffer 7421 or 7437 correspondingly. On reads XRD# and IDEIOR#, the output buffers 7421 and 7437 are disabled. If Method III of FIG. 13 is employed, an additional software-accessible bus quieting bit XQ2 is suitably used to disable the output buffers 7421 and 7437 during bus quieting periods when they are otherwise enabled under Methods I and II.

FIG. 9, MPU 102 includes a microprocessor, memory controller, and PCI Bridge Unit, all on a single integrated circuit chip.

Features of this preferred embodiment include:

Integrated 486 clock-doubled static core

50-MHz and 66-MHz operation at 3.3 V

Direct high speed bus interface into internal 486-CPU bus

Integrated 8K-Byte cache

Supports advanced power management software

System management mode hardware

High-priority system management interrupt (SMI)

Suspend mode (hardware and software initiated)

Integrated 50-MHz and 66-MHz memory controller

Programmable DRAM timing optimized for 60-ns access at 50 and 66 MHz

Supports 3.3 V and 5 V DRAMs

Supports up to 256M-byte DRAM in four 32-bit banks without external buffering

Supports 256K, 512K, 1M, 2M, 4M, 8M, and 16M asymmetric and symmetric DRAMs

Supports shadowed RAM

SMM Memory mapping into main memory (DRAM)

Two-level DRAM write buffers

Integrated 4-level DRAM refresh queue

Programmable write-protection regions

Advanced power management for DRAM

Suspend refresh

Self refresh

Slow refresh

CAS before RAS refresh

Integrated PCI bus interface for master/slave operation

The microprocessor unit (MPU) 102 of FIG. 9 integrates a 486 CPU 701, DRAM controller 718, and PCI interface 716 into a single chip contained in a 208-pin PQFP (plastic quad flat pack) package.

The 486 CPU core contains an 8K-byte write-through, 32-bit instruction/data cache 704. The cache 704 is two-way set associative and organized as 1024 sets each containing 2 lines of 4 bytes each. The cache contributes to the overall performance by quickly supplying instructions and data to an internal execution pipeline of CPU core 702.

Figure 27:
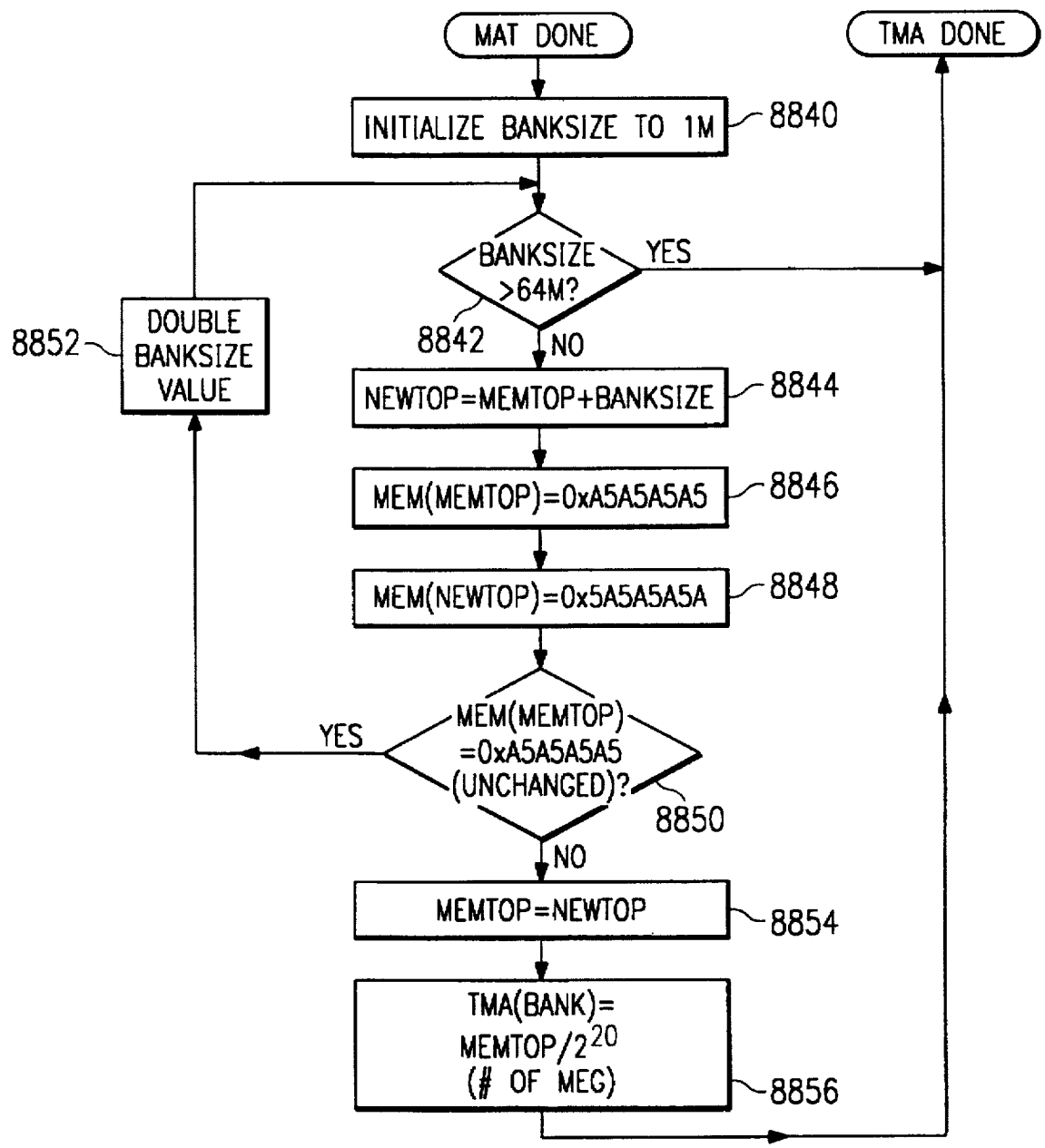
FIG. 27 is a method embodiment flow diagram for BIOS software for loading a Top Memory Address (TMA) register, and FIG. 27 mates with flow diagram FIG. 24.

MPU 102 power-management features allow a dramatic reduction in electrical current consumption when the microprocessor is in a standby mode. Standby mode is entered either by a hardware or software initiated action as described in connection with PPU 110 in FIG. 23. Standby mode allows for CPU clock modulation via a MaskClock MSKCLK input pin of MPU 102 as shown in FIG. 27, thus reducing power consumption. Once in standby mode, the MPU power consumption can be further reduced in a suspend mode, as discussed in connection with FIG. 33, by stopping the external clock input. Since the MPU 102 is a static device, no internal data is lost when the clock input is stopped.

A system-management mode (SMM) provides an additional interrupt SMI# and an address space that can be used for system power management or software transparent emulation of I/O peripherals or other purposes. SMM is entered using the system-management interrupt (SMI) which has a higher priority than any other interrupt. While running in protected SMM address space, the SMI interrupt routine can execute without interfering with the operating system or application programs. After reception of an SMI, portions of the CPU are automatically saved, SMM is entered and program execution begins at the SMM address space. The location and size of the SMM memory is programmable. Seven SMM instructions in the 486 core instruction set permit saving and restoring the total CPU state when in SMM mode.

In FIG. 9, MPU 102 integrates a high performance DRAM controller 718 that supports up to 256M bytes of DRAM memory 106 with up to four 32-bit banks without external buffering. Additionally, memory interface buffers 720 can be programmed to operate at 3.3 V or 5 V. The DRAM controller 718 is programmable to support 60 ns and 80 ns accesses. Various refresh modes are supported which include: slow, self, suspend, and CAS-before-RAS refresh.

An on-chip PCI interface 716 (bus bridge) is suitably provided compliant with the PCI 2.0 specification. The PCI interface 716 acts as a bus master when there is a CPU initiated transfer between the CPU and the high speed PCI bus 104 and as a target for PCI initiated transfers. An important feature which supports power management is a bus-quiet mode used to inhibit PCI bus cycles when the CPU is accessing the DRAM 106 or internal cache 704.

The embedded 486 core processor 702 is initialized when the RESET signal is asserted. The processor 702 is placed in real mode ("8086" mode), signal states shown in the next table are established, and the registers listed in the following table are set to their initialized values. RESET invalidates and disables the cache 704, turns off paging and returns the processor 706 clock circuit to non clock-doubled mode. When RESET is asserted, the microprocessor 102 terminates all local bus activity and all internal execution. During the time that RESET is asserted, the internal pipeline is flushed and no instruction execution or bus activity occurs.

Approximately 350 to 450 CLK2 clock cycles (additional 220+60 cycles if self-test is requested) after deassertion of RESET, the processor 702 begins executing instructions at the top of physical memory (address location FFFF FFF0h). When the first intersegment JUMP or CALL is executed, address lines A31–A20 of local bus 714 in FIG. 9 are driven low for code-segment-relative memory-access cycles. While these address lines are low, the microprocessor 102 executes instructions only in the lowest 1M byte of physical address space until system-specific initialization occurs via program execution.

The internal circuitry of 486 CPU core 702 is diagrammed and described in greater detail in TI486 Microprocessor: Reference Guide, 1993, available from Texas Instruments Incorporated and hereby incorporated herein by reference.

The clock circuitry 706 is described in U.S. Pat. No. 5,442,325, issued Aug. 15, 1995, entitled "A Voltage-Controlled Oscillator and System with Reduced Sensitivity to Power Supply Variation" and hereby incorporated herein by reference.

In FIG. 9 the PCI bus bridge 716 provides the interface between the rest of MPU 102 and the PCI bus 104. The integrated 486 core processor 701 and memory controller 718, 720 subsystems are connected to the PCI bus 104 through the PCI bridge 716. The PCI bridge 716 maps the address space of local bus 714, of the integrated 486 core processor 701, into the address space of the PCI bus 104; and provides the mechanism that allows the 486 core processor to access PCI configuration space. The PCI bridge 716 provides a low-latency path through which the 486 core processor directly accesses other PCI bus agents mapped anywhere in memory and I/O spaces. Additionally, the PCI bridge 716 provides a high-bandwidth path that allows PCI bus masters outside MPU 102 direct access to main memory. MPU 102 is capable of behaving as a bus master (initiator) or PCI Slave (target) running at 0 MHz up to 25 or 33 MHz and much higher frequencies into hundreds of Mega-Hertz according to the concepts disclosed herein.

MPU 102 implements a 256-byte configuration space, which is a physical address space for registers 712 to configure PCI agents. The configuration registers 712 are accessed via an Index/Data register pair.

For PCI bus 104 to main memory accesses, the MPU 102 is a target on the PCI bus 104. For host to peripheral component accesses, the MPU is a master on the PCI bus 104. The host can read and write both configuration and non-configuration address spaces. When the host is accessing the MPU configuration registers 712, the MPU 102 is both the master and the target. Configuration cycles initiated by MPPU 102 circuitry in bridge 716 to MPU configuration registers 712 are not forwarded to the PCI bus 104.

The FRAME, IRDY, and TRDY signals, are some PCI control signals. FRAME is asserted by the initiator (master) to indicate the beginning and end of a PCI transfer. IRDY is asserted by the initiator to indicate that the data is valid (write) or that it is ready to accept data (read). TRDY is asserted by the PCI target to indicate that The data is valid (read) or that it is ready to accept data (write).

All PCI transactions begin with the assertion of FRAME whereupon the master places address and control information on the address/data AD and C/BE command/byte enable lines. If the transaction is a read, the next cycle is used to allow the direction of the bus to turn around and be driven by the target. If the transaction is a write, the next cycle can be a data phase containing the data that is to be transferred to a target.

A data phase completes when both IRDY and TRDY are asserted. If either IRDY or TRDY are negated during the data phase, wait states are inserted by bus bridge 716, for example. FRAME is negated when the initiator has only one data transfer remaining and IRDY is asserted, as in cycles with multiple data phases such as burst cycles. Otherwise, if no burst cycle occurs, FRAME is negated when IRDY is asserted. When FRAME and IRDY are both negated (high), the data transfer is complete and the bus 104 is in an idle cycle.

When MPU 102 asserts FRAME, the other PCI agents in the system decode the address being driven onto the AD lines of bus 104. PCU 112, Display Controller 114 and devices 210 and 220 of FIGS. 5–7 decode the address on bus 104, and the PPU 110 decodes addresses not claimed by other devices. When an agent device decodes an address as being its own, it identifies itself as the target by asserting an active signal on select line DEVSEL. If no device responds within five clocks, MPU 102 terminates the cycle with a master abort. When MPU 102 is the target of another PCI master as in the case of a PPU 110 to main memory 106 transfer, MPU 102 asserts DEVSEL to claim the cycle.

Bus commands indicate to the PCI target devices the type of transaction that the master PCI device is requesting. The bus commands, such as interrupt acknowledge, special cycle, I/O read, I/O write, memory read, memory write, configuration read, configuration write, memory read multiple, memory read line, and memory write and invalidate, are supported as targets and masters according to the architecture of the preferred embodiment of the invention. It is contemplated that support for these and similar bus commands, as target and initiator will be selected appropriately to the commands and the architecture of each system embodiment.

The MPU can, but does not have to, support burst cycles as a master. The burst interface is suitably provided in the memory management unit MMU of CPU core 702. In the case of another PCI master attempting to burst data to memory, the MPU PCI bridge 716 can, in a non-burst mode, also terminate the PCI burst cycle after the first data has transferred. In burst mode, however, the burst cycle executes to completion. A latency timer is suitably used to limit the amount of time that the MPU can use the PCI bus during a burst transfer.

Turning to the subject of status and error reporting, MPU 102 has two signals, PERR and SERR, for handling errors. PERR is used to report data parity errors during all PCI transactions except a special cycle. SERR is used to report address parity errors and special cycle data parity errors. PERR is asserted when a PCI agent receiving data detects a data parity error. SERR is asserted by the PCI agent that detects an address parity error or a special cycle data parity error. In the event of an error, the appropriate status bits are set in the Status and Command register in block 712 as described in register tables later hereinbelow.

Additional MPU errors include 1) access to a non-existent device or 2) accessing a target that cannot handle the request. When MPU 102, as a master, attempts to access a nonexistent device or a device that does not respond, with DEVSEL in a predetermined time, MPU 102 executes a master abort. If the MPU is accessing a target device and the target device cannot handle the request, the target aborts. In both cases, status bits in the Status and Command register are set to indicate that a master abort (MABT bit) or a target abort occurred.

MPU 102 supports both master-initiated termination as well as target-initiated termination. All transactions are concluded when both FRAME and IRDY are negated, indicating that the bus is idle. Master-initiated termination includes 1) Cycle completion or 2) Master abort, as described above, 3) timeout termination. Cycle completion is normal completion of a PCI transaction.

Time-out termination refers to a transaction that is terminated because the latency timer expired before the transaction was able to complete.

The MPU responds to a target-initiated termination in one of the following ways: 1) Retry, 2) Abort or 3) Disconnect.

Retry refers to termination by the target that informs the initiator it currently cannot respond to a transaction and that the transaction should be retried at a later time. No data transfer takes place during this transaction.

Abort refers to termination by the target when the target determines that a fatal error has occurred or that it may never be able to respond to the transaction. The received-target-abort-status bit (TABT) in the PCI Status register is set indicating that the MPU experienced a PCI target-abort condition.

Disconnect refers to termination requested because the target is unable to respond within a latency time interval after the first data phase is transferred. By contrast, no data transfers during a retry. When the MPU 102 only transfers single data, a disconnect resembles a normal cycle completion except that STOP is asserted.

As a target, the MPU completes the transaction. No retry, disconnect, or abort is issued.

The MPU 102 supports HALT and SHUTDOWN. The halt instruction (HLT) stops program execution and prevents the processor 102 from using the local bus 714 until restarted. The CPU 702 in HALT enters a low-power suspend mode. When an external hardware interrupt is detected on the INTR input pin and the interrupts are enabled (IF bit in EFLAGS=1), SMI, NMI, or RESET forces the CPU out of the halt state. The PCI bridge 716 broadcasts the HALT as a special cycle on the PCI bus 104.

Shutdown occurs when a severe error is detected that prevents further processing. The PCI bridge does not broadcask the shutdown cycle as a PCI special cycle. Instead, the PCI bridge logic internally generates a reset to the CPU.

Interrupt acknowledge cycles are generated by the MPU 102 bridge 716 when an INTR output is asserted by PPU 110 to the MPU INTR input. During interrupt acknowledge cycles, the internal bus cycle definition signal (M/IO (pin), D/C (internal), and W/R (pin)) are driven to 000. The interrupt acknowledge cycle has two 8-bit read operations, with the addresses being driven to 4 and 0 for the first and second cycles, respectively. During an interrupt acknowledge cycle, the first byte read is ignored and the second provides the 8-bit interrupt vector. LOCK is also asserted to ensure that the two reads are executed back-to-back.

On the PCI bus, the interrupt acknowledge cycle is a single cycle, in contrast to the two back-to-back read cycles on the CPU bus 714. The cycle is an internal cycle initiated by ADS and terminated by RDY. FRAME is generated on the PCI bus to the PPU to start the interrupt Acknowledge (INTA) cycle. The CPU bus cycle definition signals are transformed into a PCI interrupt acknowledge (INTA) command. The PPU 110 responds to FRAME and the INTA command by providing a single interrupt vector byte from its internal interrupt controller 914 of FIGS. 11, 38, 43 and 44. A second RDY is generated to the CPU based on the IRDY/TRDY handshake and the cycle completes.

In a PC-compatible address map, the address space 512K–1M (00080000h-000FFFFFh) is reserved for video memory (VRAM or DRAM), ROM, and system-expansion memory. The MPU 102 PCI bridge 716 implements a DRAM Shadow and Timing Control register in block 712 that allows Read Only, Write Only, Read/Write, or Disabled attributes to be programmed for memory blocks within this space except the address range 512k–640k (0008 0000h-0009 FFFFh). This latter address range is not included because most current PC systems are populated with 640 KB of DRAM memory which spans the address space 0000 0000h-0009 FFFFh.

The next table shows the granularity defined by the DRAM Shadow and Timing Control Register for memory in the 640K–1M space (000A 0000-000F FFFFh).

Read only, write only, read/write or disabled attributes are also advantageously assigned to a memory block in the 640K–1M space. The host PCI bridge 716 response to memory access depends on whether the access originates on the CPU primary bus 714 or secondary (PCI) bus 104. As an example, a write access originating on the host bridge primary bus 714 to a memory block for which the attribute bits are set to write only (code 01 in SRRn, SRWn bits of shadow register for that memory space) does not flow through the bridge 716 to the PCI bus 104. Instead, the memory access is directed via bus 714 to the main system memory 106 controlled by the MCU 718. A read access to this same memory block originating on bus 714 does flow through the bridge to PCI bus 104 to BIOS RAM 120 of FIG. 6, for example, and is not responded to by system DRAM 106. This logic in bridge 716 advantageously supports copying of BIOS RAM to DRAM, as described later hereinbelow.

MPU Granularity in 640K–1M space

| Address Range | Usage |
| --- | --- |
| 000A 0000h—000B FFFFh | Video memory (128K byte Block) |
| 000C 0000h—000C 3FFFh | Expansion BIOS ROMs |
| 000C 4000h—000C 7FFFh | (16K byte Blocks) |
| 000C 8000h—000C BFFFh | |
| 000C C000h—000C FFFFh | |
| 000D 0000h—000D 3FFFh | |
| 000D 4000h—000D 7FFFh | |
| 000D 8000h—000D BFFFh | |
| 000D C000h—000D FFFFh | |
| 000E 0000h—000E FFFFh | System BIOS ROMs |
| 000F 0000h—000F FFFFh | (64K byte Blocks) |

Accesses from the host bridge 716 secondary bus (PCI bus 104) are responded to by the bridge 716 in a different way. It is assumed that unless a given address block is disabled, there is a PCI agent on the secondary bus (PCI bus) that will respond to an access within that block. In other words, for addresses, the only accesses originating on the host bridge secondary bus 104 that are passed through to the host bridge primary bus 714 are those to an address block that has a "disabled" attribute. Accesses from the host bridge secondary bus 104 to memory blocks that have been set to read/write, read only, or write only are responded to by the PCI agent on the secondary bus 104 and not passed on to the primary bus 704. The table below describes how the host PCI bridge 716 responds to accesses within the 640K–1M space:

| Origin of Cycle | Access | Block Attribute | Access Cycle Goes to Listed Bus |
| --- | --- | --- | --- |
| CPU Primary Bus | Read | Read Only | CPU (714) |
| | | Write Only | PCI (104) |
| | | Read/Write | CPU |
| | | Disabled | PCI |
| | Write | Read Only | PCI |
| | | Write Only | CPU |
| | | Read/Write | CPU |
| | | Disabled | PCI |
| PCI Secondary Bus | Read | Read Only | CPU |
| | | Write Only | PCI |
| | | Read/Write | CPU |
| | | Disabled | PCI |
| | Write | Read Only | PCI |
| | | Write Only | CPU |
| | | Read/Write | CPU |
| | | Disabled | PCI |

The memory controller unit (MCU 718) generates timing control signals for the DRAM array 106. The MCU 718 is integrated on the same single chip as the MPU 102 and supports 1 to 4 DRAM banks and up to 256M bytes or more without external buffers. The MCU 718 supports any combination of DRAM types: 256K, 512K, 1M, 2M, 4M, 8M, or 16M. Three types of refresh modes are supported: normal, suspend refresh, and self refresh. DRAM timing parameters are programmable to allow optimized DRAM accesses for 60 ns and 80 ns DRAMs at system speeds of 50 MHz and 66 MHz. The MCU 718 is designed to coordinate memory accesses originating from the CPU 702 with memory accesses originating from the PCI Interface bridge 716. A PCI master access to main memory 106 has higher priority than a CPU 702 access to main memory 106. The CPU 702 is put on hold until the PCI master is through bursting, unless there are higher priority refresh requests pending.

Each of the 4 DRAM banks in memory 106 supports 1 to 64M bytes in 1M byte increments. The DRAM bank size is individually programmable allowing any mix of banks without restrictions on mixing DRAM size or physical location.

Memory reads or writes to DRAM are double-word aligned 32-bit wide accesses. The MCU 718 has one RAS line per DRAM memory bank where RAS0-3 correspond directly to banks 0-3. Bank 0 contains the lowest addresses and bank 3 contains the highest addresses. The MCU 718 provides eight CAS lines. Each DRAM bank uses four CAS lines; one CAS line per byte. CAS3 and CAS7 control the high-order bytes while CAS0 and CAS4 control the low-order bytes. CAS3-0 drives DRAM banks 0 and 2. CAS7-4 drives DRAM banks 1 and 3.

The MCU 718 provides a common Write Enable (WE) line that is connected to all DRAM memory banks.

The following table shows the various DRAM technologies that are supported by the memory controller. The memory array types are selected by programing the Memory Array Type register. Each bank is individually programmable to support any of the DRAM array types.

DRAMs Supported

DRAM array. The following table shows the number of access wait states for the different memory cycles and timing types.

DRAM Timing Types

| Timing Type | DTMG 1 | DTMG 2 | RAS Access | CAS to READY Sampling | System Clock (MHz) | DRAM Speed (ns) |
|---|---|---|---|---|---|---|
| 2 | 1 | 0 | 4 | 2 | 50 | 60 |
| 1 | 0 | 1 | 5 | 3 | 50 | 80 |
|   |   |   |   |   | 66 | 60 |
| 0(*) | 0 | 0 | 6 | 4 | 50 | 100 |
|   |   |   |   |   | 66 | 80 |

(*) Default.

Wait States for DRAM Memory Cycles

| DRAM Memory Cycle | Wait States (T Cycles) | | |
|---|---|---|---|
|  | Type 2 | Type 1 | Type 0 |
| Normal Read (Single) | 5 | 6 | 8 |
| Normal Write (Single) | 4 | 5 | 6 |
| Normal Read (Back to Back) | 5/6 | 6/8 | 8/10 |

| Organization (Depth × Width) | Devices per × Bank | Bits per Device | Address Widths | | Memory Array Type | Size per Bank (Mbits) |
|---|---|---|---|---|---|---|
|  |  |  | Rows | Columns |  |  |
| 256K × 1 | ×32(*) | 256K | 9 (MA8–MA0) | 9 (MA8–MA0) | 2 | 1 |
| 256K × 4 | ×8 | 1M | 9 (MA8–MA0) | 9 (MA8–MA0) | 2 | 1 |
| 256K × 16 | ×2 | 4M | 9 (MA8–MA0) | 9 (MA8–MA0) | 2 | 1 |
|  |  |  | 11 (MA10–MA0) | 8 (MA7–MA0) | 3 | 1 |
| 512K × 8 | ×4 | 4M | 10 (MA9–MA0) | 9 (MA8–MA0) | 2 | 2 |
|  |  |  | 12 (MA11–MA0) | 8 (MA7–MA0) | 3 | 4 |
| 1M × 1 | ×32(*) | 1M | 10 (MA9–MA0) | 1 (MA9–MA0) | 1 | 4 |
| 1M × 4 | ×8 | 4M | 10 (MA9–MA0) | 10 (MA9–MA0) | 1 | 4 |
| 1M × 8 | ×4 | 8M | 10 (MA9–MA0) | 10 (MA9–MA0) | 1 | 4 |
|  |  |  | 12 (MA11–MA0) | 9 (MA8–MA0) | 2 | 4 |
| 1M × 16 | ×2 | 16M | 10 (MA9–MA0) | 10 (MA9–MA0) | 1 | 4 |
|  |  |  | 12 (MA11–MA0) | 9 (MA8–MA0) | 2 | 4 |
| 2M × 8 | ×4 | 16M | 11 (MA10–MA0) | 10 (MA9–MA0) | 1 | 8 |
|  |  |  | 13 (MA12–MA0) | 9 (MA8–MA0) | 2 | 8 |
| 2M × 16 | ×2 | 32M | 11 (MA10–MA0) | 10 (MA9–MA0) | 1 | 8 |
|  |  |  | 13 (MA12–MA0) | 9 (MA8–MA0) | 2 | 8 |
| 4M × 1 | ×32(*) | 4M | 11 (MA10–MA0) | 11 (MA10–MA0) | 0 | 16 |
| 4M × 4 | ×8 | 16M | 11 (MA10–MA0) | 11 (MA10–MA0) | 0 | 16 |
| 4M × 8 | ×4 | 32M | 11 (MA10–MA0) | 11 (MA10–MA0) | 0 | 16 |
| 4M × 16 | ×2 | 64M | 11 (MA10–MA0) | 11 (MA10–MA0) | 0 | 16 |
|  |  |  | 13 (A12–MA0) | 10 (MA9–MA0) | 1 | 16 |
| 8M × 8 | ×4 | 64M | 13 (MA12–MA0) | 10 (MA9–MA0) | 1 | 32 |
| 16M × 1 | ×32(*) | 16M | 12 (MA11–MA0) | 12 (MA11–MA0) | 0 | 64 |
| 16M × 4 | ×8 | 64M | 12 (MA11–MA0) | 12 (MA11–MA0) | 0 | 64 |

(*) Due to the capacitive loading caused by higher fanout on the memory address lines, these implementations are less preferable.

DRAM Timing

The DRAM Interface timing is programmable on a per-bank basis to support several DRAM speeds. The MCU provides two parameters that are used to program DRAM timing. These parameters are programmable by setting the DTMG1- 0 bits in the DRAM Shadow and Timing Control register. The first parameter is the RAS activation to DRAM access time (DTMG1). The second parameter is CAS to READY sampling time (DTMG0). The next table shows some example values for programming the DRAM timing types 0, 1, and 2. The timing type is selected for the entire -continued

| DRAM Memory Cycle | Wait States (T Cycles) | | |
|---|---|---|---|
|  | Type 2 | Type 1 | Type 0 |
| Normal Write (Back to Back) | 4/6 | 5/8 | 6/10 |
| Normal Read and Write (Back to Back) | 5/5 | 6/7 | 8/8 |
| Normal Write and Read (Back to Back) | 4/7 | 5/9 | 6/12 |

-continued

| DRAM Memory Cycle | Wait States (T Cycles) | | |
|---|---|---|---|
| | Type 2 | Type 1 | Type 0 |
| Page Hit Read | 3 | 4 | 6 |
| Page Hit Write | 2 | 3 | 4 |
| Page Hit Read (Back to Back) | 3/3 | 4/4 | 6/6 |
| Page Hit Write (Back to Back) | 2/2 | 3/3 | 4/4 |
| Page Hit Read and Write (Back to Back) | 3/2 | 4/3 | 6/4 |
| Page Hit Write and Read (Back to Back) | 2/3 | 3/4 | 4/6 |
| Page Miss Read | 8 | 10 | 13 |
| Page Miss Write | 7 | 9 | 11 |
| Page Miss Read (Back to Back) | 8/8 | 10/10 | 13/13 |
| Page Miss Write (Back to Back) | 7/7 | 9/9 | 11/11 |
| Page Miss Read and Write (Back to Back) | 8/7 | 10/9 | 13/11 |
| Page Miss Write and Read (Back to Back) | 7/8 | 9/10 | 11/13 |

System ROM 120 of FIG. 6 suitably resides in the memory space between 640K and 1M. Shadowing allows the contents of the ROM to be copied to DRAM 106 at the same address thereby allowing subsequent accesses to BIOS code to be directed to the DRAM copy. System performance is increased because the BIOS code is then executed from DRAM 106 at memory-controller speeds instead of at slower ROM speeds.

The DRAM Shadow and Timing Control register allows blocks of memory in the address range 768K–1M (000C 0000h-000F FFFFh) to be shadowed. During system initialization, a region of DRAM memory 106 can be set to write only (01 code). Reads to this address are directed to the BIOS ROM 120, while writes are directed to DRAM memory 106. A read and write to the same ROM address reads the data from ROM and writes the data to the shadowed memory location. In this way, the entire ROM 120 contents are copied to DRAM 106. After the ROM contents are copied to DRAM, the shadowed region in DRAM can be set to read only mode (10 in DRAM Shadow and Timing Control Register). This protects the DRAM copy from corruption. Subsequent accesses to ROM 120 are directed to the shadowed DRAM 106.

Video RAM/SMM Memory Support

Video RAM is suitably located in the reserved memory space 640K–768K (000A 0000h-000B FFFFh). Bit 11 (VRAM) in the DRAM Shadow and Timing Control register is used to program whether or not the MCU is to respond to accesses in that address range.

When the VRAM bit configuration bit is set to zero (default), the video RAM address space is not accessed by normal ADS or PCI initiated cycles. Cycles initiated to this address space are forwarded to the PCI bridge 716 and thence to bus 104 and are decoded by a display device 114 of FIG. 7. However, cycles initiated by System Management Mode signal strobe can access the video RAM address space (regardless of the VRAM bit value). This allows the portion of DRAM space from A0000h-BFFFFh to be used to store system management mode (SMM) binary code. In a preferred method of system initialization, the VRAM bit 11 of DRAM Shadow and Timing Control Register is suitably set to one (1) to enable the MCU 718 to respond to accesses in the video RAM space. This allows the SMM code to be shadowed to the DRAM from A0000h-BFFFFh. The VRAM bit 11 can then be set back to zero to disable the MCU from responding in the video RAM space. When a system management interrupt (SMI) is detected, SMADS is generated and SMM code shadowed in the DRAM is executed.

In FIG. 9, memory controller circuitry 718 is associated with two 32 bit wide write buffers in block 720 that temporarily store data before writing to DRAM. The write buffers are enabled by setting Bit 10 (WBE) in the Shadow and Timing Control register. When a write command from the host CPU 702 occurs, the memory controller 718 compares the host address with the address of any buffer in block 720. If the host address matches one of the write buffer addresses, the host data is written to that write buffer. The bytes that are written to the write buffer are determined by the host byte-enable BE lines. When all 4-byte locations in the write buffer in block 720 have been filled with host data, the buffers in block 720 are flushed immediately to DRAM 106. If the write buffers in block 720 have not been filled, (i.e., 1 to 3 bytes) the memory controller 718 does not flush the data to DRAM until subsequent write cycles either fill the write buffer, or a mismatch between the host address and the buffered data address occurs. In the case of an address mismatch, the buffer is immediately flushed to DRAM 106 and the current host data is written to the next available buffer. If no write buffer is available, the data from host 702 is held by the memory controller 718 until a write buffer becomes available and the host 702 can complete the write.

Turning to the subject of DRAM refresh, DRAM refresh requests occur at a programmed interval (typically 15.6 microseconds in a normal refresh mode). For each refresh request, the memory controller performs a CAS before RAS refresh, i.e., CAS is asserted first, followed by RAS. To reduce system noise and current surges, multiple DRAM banks are refreshed in a staggered sequential order starting with bank 0. Also, CAS before RAS refresh uses less power than the RAS only refresh. To support DRAMs with longer refresh times, the memory controller 718 provides programmable refresh rate capability. The DRAM refresh rate is programmable to intervals of 16 µs, 32 µs, 64 µs, or 128 µs, by setting the appropriate values for Bits 1-0 (REFDIV1-0) in the DRAM Shadow and Timing Control register.

To minimize interference with host cycles, the memory controller 718 supports a 4-level refresh queue. The refresh queue is enabled by setting Bit 2 (QUEEN) of the Shadow and Timing Control register. When the refresh queue is enabled, the memory controller queues up to 4 refresh requests. The memory controller then waits until a host idle cycle occurs to refresh the memory.

In a Self Refresh Mode the memory controller 718 supports DRAMs with self refresh capability. This mode is enabled by setting Bit 3 (SELFREF) to a one in the Shadow and Timing Control register. Self refresh is a special case of CAS-before-RAS refresh in which DRAMs are capable of generating their own refresh request and refresh address. This type of refresh is used in suspend mode wherein MPU 102 pin SUSPEND is activated and the 32 KHz refresh clock is the only clock running. Entering self refresh resembles an extended CAS-before-RAS refresh. WE is high when CAS is first driven low, to prevent the DRAM from entering a test mode. If CAS and RAS are both held low by a predetermined period (typically >16 msec), DRAMs supporting self refresh begin generating their own refresh requests and refresh addresses. When in self-refresh mode, the CAS and RAS signals must remain low, WE and OE are high and the MA memory address lines are disabled to a high impedance (3-state). Self refresh is automatically exited when CAS and RAS go high.

Suspend Refresh

The memory controller supports a low-power suspend mode. In this mode, power to the MPU and DRAM is maintained, but the MPU clocks are stopped placing it in a static state. Suspend refresh is useful for DRAMs that do not support their own self refresh. When entering suspend refresh mode, a CAS-before-RAS refresh is performed. The DRAM continues to be refreshed while the MPU is in suspend mode. When suspend mode is exited, an application program resumes. This mode is enabled by setting Bit 3 (SELFREF) to a one in the Shadow and Timing Control register.

The disclosed chipset of FIGS. 5–7 also supports a lower power suspend mode, called 0-volt suspend, wherein all power is removed to the system 100, including the DRAM 106. In this state only the power management block section called PMU 920B in PPU 110 is powered. All system information is stored to either a hard disk or other non-volatile memory array.

A Page mode is enabled by setting bit 4 (PGMOD) in the Shadow and Timing Control register. Page mode supports faster access and lower power dissipation than normal memory cycles. A page mode cycle begins with a normal cycle. While RAS is kept low to maintain the row address, CAS is cycled to strobe in additional column addresses. This eliminates the time required to set up and strobe sequential row addresses for the same page.

The memory controller unit 718 uses a memory address multiplexing scheme that supports different DRAM sizes. The multiplexing schemes for the various DRAMS are shown in detail in the next table. The memory address (MA) is shown across the top. The numbers located in the MA columns are the host address (HA) lines corresponding to the remapped memory row and column addresses. There are two bits, MATx1 and MATx0 (x is the memory bank number), for each of the four memory banks located in the Memory Array Type register that are used to select the DRAM array type.

Memory Address Multiplexing Scheme

When numeric coprocessor 108 is performing operations, its BUSY output is asserted low. When the coprocessor 108 needs to transfer data, its PEREQ output is asserted high. The BUSY and PEREQ outputs from the coprocessor 108 are connected to the MPU inputs NPBUSY and PEREQ respectively. The NPBUSY and PEREQ inputs of the MPU 102 are internally connected to the 486 core processor 702 inputs BUSY486 and PEREQ486, respectively.

During a normal cycle, when no error occurs, the internal BUSY486 is asserted when the coprocessor 108 asserts BUSY and deasserted when the coprocessor 108 deasserts BUSY. PEREQ486 is also asserted when the coprocessor asserts PEREQ and deasserted when the coprocessor 108 deasserts PEREQ.

When a numeric coprocessor error occurs, the coprocessor 108 asserts its ERROR output low. The falling edge of this signal causes the internal BUSY486 to be latched in a Busy Latch and IRQ13 to go active, triggering the IRQ13 interrupt request FPUERR to PPU 110. When the coprocessor 108 deasserts BUSY, the internal PEREQ486 signal is asserted. The interrupt service routine then executes on MPU 102, starting at an interrupt vector address supplied by interrupt controller 914, and MPU 102 writes to I/O address 00F0h which deasserts IRQ13, PEREQ486, and BUSY486.

Power management interface 708 of MPU 102 as shown in FIG. 9 supports two low-power modes: Toff and suspend. In Toff mode, the clock to the core processor portion 702 of MPU 102 is stopped. In suspend mode, all clocks, except the 32 kHz clock, are stopped, and the oscillator and clock multiplying phase locked loop PLL 706 are disabled. MPU 102 is full static in suspend mode, except for circuitry in MCU 718 that refreshes DRAMs 106. In a ready mode, the core processor 702 runs at full speed.

To enter Toff mode, a suspend mode enable signal is held inactive while either a mask-clock signal is asserted by

|  | MA12 | MA11 | MA10 | MA9 | MA8 | MA7 | MA6 | MA5 | MA4 | MA3 | MA2 | MA1 | MA0 |
|---|---|---|---|---|---|---|---|---|---|---|---|---|---|
| Memory Array Type 0 - 11/12-Bit Column Address Width ||||||||||||||
| Row | 25 | 24 | 23 | 22 | 21 | 20 | 19 | 18 | 17 | 16 | 15 | 14 | 13 |
| Col | — | 25 | 12 | 11 | 10 | 9 | 8 | 7 | 6 | 5 | 4 | 3 | 2 |
| Memory Array Type 1 - 10-Bit Column Address Width ||||||||||||||
| Row | 24 | 23 | 22 | 21 | 20 | 19 | 18 | 17 | 16 | 15 | 14 | 13 | 12 |
| Col | — | — | — | 11 | 10 | 9 | 8 | 7 | 6 | 5 | 4 | 3 | 2 |
| Memory Array Type 2 - 9-Bit Column Address Width ||||||||||||||
| Row | 23 | 22 | 21 | 20 | 19 | 18 | 17 | 16 | 15 | 14 | 13 | 12 | 11 |
| Col | — | — | — | — | 10 | 9 | 8 | 7 | 6 | 5 | 4 | 3 | 2 |
| Memory Array Type 3 - 8-Bit Column Address Width ||||||||||||||
| Row | 22 | 21 | 20 | 19 | 18 | 17 | 16 | 15 | 14 | 13 | 12 | 11 | 10 |
| Col | — | — | — | — | — | 9 | 8 | 7 | 6 | 5 | 4 | 3 | 2 |

In FIG. 9, the MPU 102 numeric coprocessor interface 710 has pins for connection to a math coprocessor 108 for floating point or other fast calculations in the FPU Interface Table earlier hereinabove. Signal pins connect between the MPU 102 numeric coprocessor interface 710, a 387DX or 487DLC numeric coprocessor 108 and the PPU 110 input FPUERR. PPU 110 has an integrated interrupt controller 914 of FIGS. 11 and 43. When an error signal is sent by the numeric coprocessor 108 to MPU pin NPERROR, the MPU 102 responsively asserts the IRQ13 signal at its FPUERR pin. The IRQ13 signal is fed to the PPU 110 FPUERR pin. PPU 110 processes the interrupt request with controller 914 in FIG. 43 and causes a numeric processor error interrupt service routine to be executed.

hardware, or a bit of a control register in core processor 702 is toggled under software control. In this event, the core processor 702 finishes the current instruction and bus cycle, and then the clock to core processor portion 702 is stopped. In this case, PCI bridge 716 and memory controller unit MCU 718 are not affected. Any hardware interrupt, or deassertion of the mask-clock signal, or assertion of a hold signal will restart the clock to core processor portion 702. The clock to core processor portion 702 advantageously restarts with a maximum latency of one oscillator clock cycle as a result of the proximity of clock circuitry 706 to core processor portion 702. Core processor clock stability and duty cycle requirements are maintained during transitions into and out of the Toff mode.

Suspend mode is entered in response to the assertion of a suspend mode enable signal applied to MPU 102; in this mode, not only is the clock to core processor portion 702 masked, but PCI bridge 716 and memory controller unit MCU 718 have their clocks masked, as do all clock outputs. Prior to entering suspend mode, MCU 718 acknowledges that it is able to stop, following which the clocks are stopped. When the suspend enable signal is deasserted, the suspend mode terminates and the oscillator is again enabled. After a short time, the clock signals to the MPU 102 are restarted and PLL 706 restarts. Stability and duty cycle requirements are maintained for all clocks during transitions into and out of suspend mode.

In the following charts of registers, the default value in every bit is zero (0) unless the notes indicate othewise by an "always" entry.

The PCI Configuration registers 712 are accessed by using Index/Data register pair. The index register is used to select a particular register in the PCI configuration space. The Data register is used to write/read data to/from the particular register selected by the Index register. The Index register is 32-bits and is located in the I/O map at address 0CF8h-0CFBh and may be accessed only as a full double-word I/O. The Data register is a 32-bit register located in the I/O map at address 0CFCh-0CFFh and may be accessed in bytes, words, or as a double word.

The bits in the index register are defined as follows:

Bit 31 should be a 1 to enable the generation of a PCI configuration cycle.

Bits 30-24 are reserved.

Bits 23-16 define the PCI bus number. This is used only in systems that support hierarchical PCI buses.

Bits 15-11 define the PCI device number. The PCI device number is translated to a unique AD line that is connected to the IDSEL line of a PCI device and is used as a chip select during a PCI configuration cycle.

Bits 10-8 define a functional group within the target PCI device.

Bits 7-0 define the index of a double-word location with PCI configuration space of a target device. Bits 1-0 are hardwired to zero. Internally, BE3-0 are used to determine which bytes to access from the Data register.

The PCI configuration block 712 contains registers that can be used to program the MPU 102 features including the memory control unit and the PCI bridge. Programming these registers is a two-step process: Write the bus number, physical device number, functional number, and Data register index to the Address register (CF8h-CFBh) as a double-word I/O write operation.

Perform an I/O read or write to the Data register (CFCh-CFFh). Bit 31 of the Index register (CF8h-CFBh) should be set to a one to convert the host I/O cycle to the Data register to a PCI configuration cycle on the PCI bus 104. The PCI configuration cycle generated is a Type 0, Mechanism #1 as defined by the PCI Local Bus Specification, revision 2.0.

The table shows how information in the Address register is translated by the host PCI bridge into a PCI configuration cycle.

| | Address Register Device Number Bits | | | | | PCI AD Bus Bits | | | | | |
|---|---|---|---|---|---|---|---|---|---|---|---|
| Device | 15 | 14 | 13 | 12 | 11 | 31 | 30 | 29 | 28 | 27 | 26 |
| Host | 0 | 0 | 0 | 0 | 0 | 0 | 0 | 0 | 0 | 0 | 0 |
| PPU | 0 | 0 | 0 | 0 | 1 | 0 | 0 | 0 | 0 | 0 | 1 |
| PCU | 0 | 0 | 0 | 1 | 0 | 0 | 0 | 0 | 0 | 1 | 0 |
| VGA | 0 | 0 | 0 | 1 | 1 | 0 | 0 | 0 | 1 | 0 | 0 |
| MASTER | 0 | 0 | 1 | 0 | 0 | 0 | 0 | 1 | 0 | 0 | 0 |
| SLAVE1 | 0 | 0 | 1 | 0 | 1 | 0 | 1 | 0 | 0 | 0 | 0 |

| | Address Register Device Number Bits | | | | | PCI AD Bus Bits | | | | | |
|---|---|---|---|---|---|---|---|---|---|---|---|
| Device | 15 | 14 | 13 | 12 | 11 | 31 | 30 | 29 | 28 | 27 | 26 |
| SLAVE2 | 0 | 0 | 1 | 1 | 0 | 1 | 0 | 0 | 0 | 0 | 0 |
| None | 0 | 0 | 1 | 1 | 1 | Not Permitted | | | | | |
| | 0 | 1 | X | X | X | | | | | | |
| | 1 | 0 | X | X | X | | | | | | |
| | 1 | 1 | X | X | X | | | | | | |

The location of the Index/Data register pair can be relocated by writing a value to the upper four bits of a Relocation register (Data register index 50 in the PCI configuration space). These four bits become the upper four bits of the index/Data register pair address. For example, the default address for the Index register is 0CF8h-0CFBh followed by the Data register at 0CFCh-0CFFh. If a value of 1 is written to the upper four bits of the Relocation register, then the Index/Data pair would move to I/O location 1CF8h-1CFFh; a value of 2 would move the address to I/O location 2CF8h-2CFFh; etc. The initial write to the Relocation register is done through the index/Data register at the default address.

An I/O mapping process is an alternative to the Index/Data register pair to access the PCI Configuration registers. The I/O mapping feature allows 256-byte configuration space of each PCI device to be mapped to the I/O address Cx00h-CxFFh, where x represents the PCI device number. Therefore, the PCI configuration space for the host PCI device would be accessed at I/O address C000h-C0FFh; the PCI configuration space for PCI device 1 would be accessed at I/O address C100h-C1FFh; etc. The I/O mapping feature is enabled by writing a 1 to bit 3 of the Relocation register. The initial write to the Relocation register is done through the index/Data register at the default address.

MPU Configuration Registers

| Default Address (h) | Register | Abbr. | Access |
|---|---|---|---|
| 00-01 | Vendor Identification | VID | R |
| 02-03 | Device Identification | DID | R |
| 04-05 | Command | COMM | Mixed |
| 06 | Reserved | — | R/W |
| 07 | Status | STS | Mixed |
| 08 | Revision Code | REVID | R |
| 09-0B | Device Class Code | CLCD | R |
| 0C | Cache Line Size | CLNSZ | R/W |
| 0D | Latency Timer | LTMR | R |
| 0E-0F | Reserved | — | R |
| A0-A3 | Top Memory Address Bank Select | TMA | R/W |
| A4-A7 | DRAM Shadow and Timing Control | STC | R/W |
| A8 | Memory Array Type | MAT | R |
| A9-AB | Reserved | — | R |
| 50 | Relocation | RLC | R/W |
| 51-53 | Reserved | — | R/W |

Device and Vendor ID Register

Data-Register index (hex): 00

| Bit | Name | Access | Description |
|---|---|---|---|
| 31-16 | DID15-0 | R | Device ID. (0A02h) |
| 15-0 | VID15-0 | R | Vendor ID. (104Ch) |

Status and Command Register
Data-Register Index (hex): 04

| Bit | Name | Access | Description |
|---|---|---|---|
| 31 | PERR | R/W | Set to 1 when parity error is detected, even if parity error handling is disabled. Cleared by writing a 1. |
| 30 | SYSERR | R/W | Set to 1 when SERR is asserted by MPU. Cleared by writing a 1. |
| 29 | MABT | R/W | Set to 1 when master is aborted (except for special cycle). Cleared by writing a |
| 28 | TABT | R/W | Set to 1 when the bridge is terminated by a target-abort. Cleared by writing a 1. |
| 27 | — | R | Always 0. |
| 26–25 | DEVTMG | R | Always 01. DEVSEL is asserted two clocks after FRAME is asserted. |
| 24 | DPDET | R/W | This bit is used only when MPU is a bus master. It is set when three conditions are met: 1) the MPU asserted PERR itself or observed PERR asserted; 2) the MPU acted as the bus master for the operation in which the error occurred; 3) the Parity Error Response bit (bit 6) is set. |
| 23–16 | — | R/W | Reserved. |
| 15–9 | — | R/W | Reserved. |
| 8 | SERR | R/W | Enable bit for the SERR driver. A value of 0 disables the SERR driver. A value of 1 enables the SERR driver. This bit's state after reset is 0. This bit (and bit 6) must be on to report address parity errors. |
| 7 | — | R | Always 0. |
| 6 | PAR | R/W | 1 = Enable parity reporting<br>0 = Disable |
| 5–3 | — | R | Always 0. |
| 2–1 | — | R | Always 1. |
| 0 | — | R | Always 0. |

Revision Code and Device Class Code Registers
Data-Register Index (hex): 08

| Bit | Name | Access | Description |
|---|---|---|---|
| 31–24 | DCC23–16 | R | Device class code. 06h |
| 23–16 | DCC15–8 | R | Device class code. 00h |
| 15–8 | DCC7–0 | R | Device class code. 00h |
| 7–0 | RC7–0 | R | Revision code. 0h |

Cache Line Size and Latency Timer Registers
Data-Register Index (hex): 0C

| Bit | Name | Access | Description |
|---|---|---|---|
| 31–24 | — | R | Always 00h. |
| 23–16 | — | R | Always 00h. |
| 15–8 | LTMR7–0 | R | Latency timer. Always 00h. |
| 7–0 | CLNSZ7–0 | R/W | Cache line size. Default: 00h (KEN high; memory non-cacheable). |

Relocation Register
Data-Register Index (hex): 50

| Bit | Name | Access | Description |
|---|---|---|---|
| 31–8 | — | R/W | Reserved |
| 7–4 | IDRA3–0 | R/W | Upper 4 bits of the index-data register address. |

| Bit | Name | Access | Description |
|---|---|---|---|
| 3 | IDEN | R/W | 1 = Enable accessing PCI configuration space via Cx00h–CxFFh.<br>0 = Disable |
| 2–0 | — | R/W | Reserved. |

Top Memory Address Bank Select Registers
Data-Register index (hex): A0

| Bit | Name | Access | Description |
|---|---|---|---|
| 31–24 | TMA31–24 | R/W | Top memory address for banks 3, 2, 1, and 0: A27–A20.<br>NOTE: Bits 31 − 29 = 110 are used for test purposes; therefore, this combination (110 only) should be avoided in normal operation. |
| 23–16 | TMA23–16 | R/W | Top memory address for banks 2, 1, and 0: A27–A20. |
| 15–8 | TMA15–8 | R/W | Top memory address for banks 1 and 0: A27–A20. |
| 7–0 | TMA7–0 | R/W | Top memory address for bank 0: A27–A20. |

DRAM Shadow and Timing Control Register
Data-Register index (hex): A4

The DRAM Shadow and Timing Control register defines which 16-Kbyte blocks in the address range 000C 0000h-000D FFFFh are shadowed. The SRRn/SRWn bits, corresponding to each block, define what type of access is allowed to the DRAM in the address range, as shown for bits 31-30, below.

| Bit | Name | Access | Description | | |
|---|---|---|---|---|---|
| 31–30 | SRR9 SRW9 | R/W | Access control for 000C C000–000C FFFFh. | | |
| | | | SRRn | SRWn | Access |
| | | | 0 | 0 | No access (ROM access) "(disabled)" |
| | | | 0 | 1 | Write of only (read from ROM) |
| | | | 1 | 0 | Read of only (write to ROM) |
| | | | 1 | 1 | Read/write. |
| 29–28 | SRR8 SRW8 | R/W | Access control for 000C 8000–000C BFFFh. (Same as 31–30) | | |
| 27–26 | SRR7 SRW7 | R/W | Access control for 000C 4000–000C 7FFFh. (Same as 31–30) | | |
| 25–24 | SRR6 SRW6 | R/W | Access control for 000C 0000–000C 3FFFh. (Same as 31–30) | | |
| 23–22 | SRR5 SRW5 | R/W | Access control for 000D C000–000D FFFFh. (Same as 31–30) | | |
| 21–20 | SRR4 SRW4 | R/W | Access control for 000D 8000–000D BFFFh. (Same as 31–30) | | |
| 19–18 | SRR3 SRW3 | R/W | Access control for 000D 4000–000D 7FFFh. (Same as 31–30) | | |
| 17–16 | SRR2 SRW2 | R/W | Access control for 000D 0000–000D 3FFFh. (Same as 31–30) | | |
| 15–14 | SRR1 SRW1 | R/W | Access control for 000F 0000–000F FFFFh. (Same as 31–30) | | |
| 13–12 | SRR0 SRW0 | R/W | Access control for 000E 0000–000E FFFFh. (Same as 31–30) | | |
| 11 | VRAM | R/W | 1 = MCU responds to 000A 0000–000B FFFFh.<br>0 = MCU does not respond. | | |
| 10 | WBE | R/W | Write buffer enable.<br>1 = Enable.<br>0 = Disable. | | |
| 9–8 | ENB1–0 | R/W | Bank enable: | | |
| | | | ENB1 | ENB1 | Enable |
| | | | 0 | 0 | Bank 0 |
| | | | 0 | 1 | Banks 0 and 1 |

-continued

| Bit | Name | Access | Description | | |
|-----|------|--------|-------------|---|---|
| | | | 1 | 0 | Banks 0, 1, and 2 |
| | | | 1 | 1 | All 4 banks |

DRAM Shadow and Timing Control Register (Continued)

| Bit | Name | Access | Description |
|-----|------|--------|-------------|
| -6 | DTMG1-0 | R/W | Wait states for RAS access timing and CAS to RDY sampling.<br>DTMG1 DTMG0 RAS Access / CAS to Ready<br>0    0    Time    Sampling<br>0    1    6 T Cycles    4 T Cycles<br>1    0    5 T Cycles    3 T Cycles<br>1    1    4 T Cycles    2 T Cycles<br>            Reserved    Reserved |
| 5 | PGHM | R/W | Page hit/miss sampling point.<br>1 = at end of T1.<br>0 = at end of T2. |
| 4 | PGMOD | R/W | Page mode enable. The MCU enables page mode.<br>1 = On.<br>0 = Off. |
| 3 | SELFREF | R/W | DRAM self refresh.<br>1 = On<br>0 = Off |
| 2 | QUEEN | R/W | Refresh 4-deep queuing enable.<br>1 = Enable.<br>0 = Disable. |
| 1-0 | REFDIV | R/W | Refresh period.<br>REFDIV REFDIV Period<br>1    0<br>0    0    16 μsec.<br>0    1    32 μsec.<br>1    0    64 μsec.<br>          128 μsec. |

Memory Array Type Register
Data-Register Index (hex): A8

| Bit | Name | Access | Description |
|-----|------|--------|-------------|
| 31-24 | Reserved | R | |
| 23-16 | Reserved | R | |
| 15-8 | Reserved | R | |
| 7-6 | MAT3(1-0) | R/W | Memory array type bank 3.<br>MAT3 MAT3 DRAM Column Address Width<br>1    0<br>0    0    11/12<br>0    1    10<br>1    0    9<br>1    1    8 |
| -4 | MAT2(1-0) | R/W | Memory array type bank 2.<br>MAT2 MAT2 DRAM Column Address Width<br>1    0<br>0    0    11/12<br>0    1    10<br>1    0    9<br>1    1    8 |
| 3-2 | MAT1(1-0) | R/W | Memory array type bank 1.<br>MAT1 MAT1 DRAM Column Address Width<br>1    0<br>0    0    11/12<br>0    1    10<br>1    0    9<br>1    1    8 |
| 1-0 | MAT0(1-0) | R/W | Memory array type bank 0.<br>MAT0 MAT0 DRAM Column Address Width<br>1    0<br>0    0    11/12<br>0    1    10 |

| Bit | Name | Access | Description |
|---|---|---|---|
| 9 | | | 0 1 |
| 8 | | | 1 1 |

Figure 17:
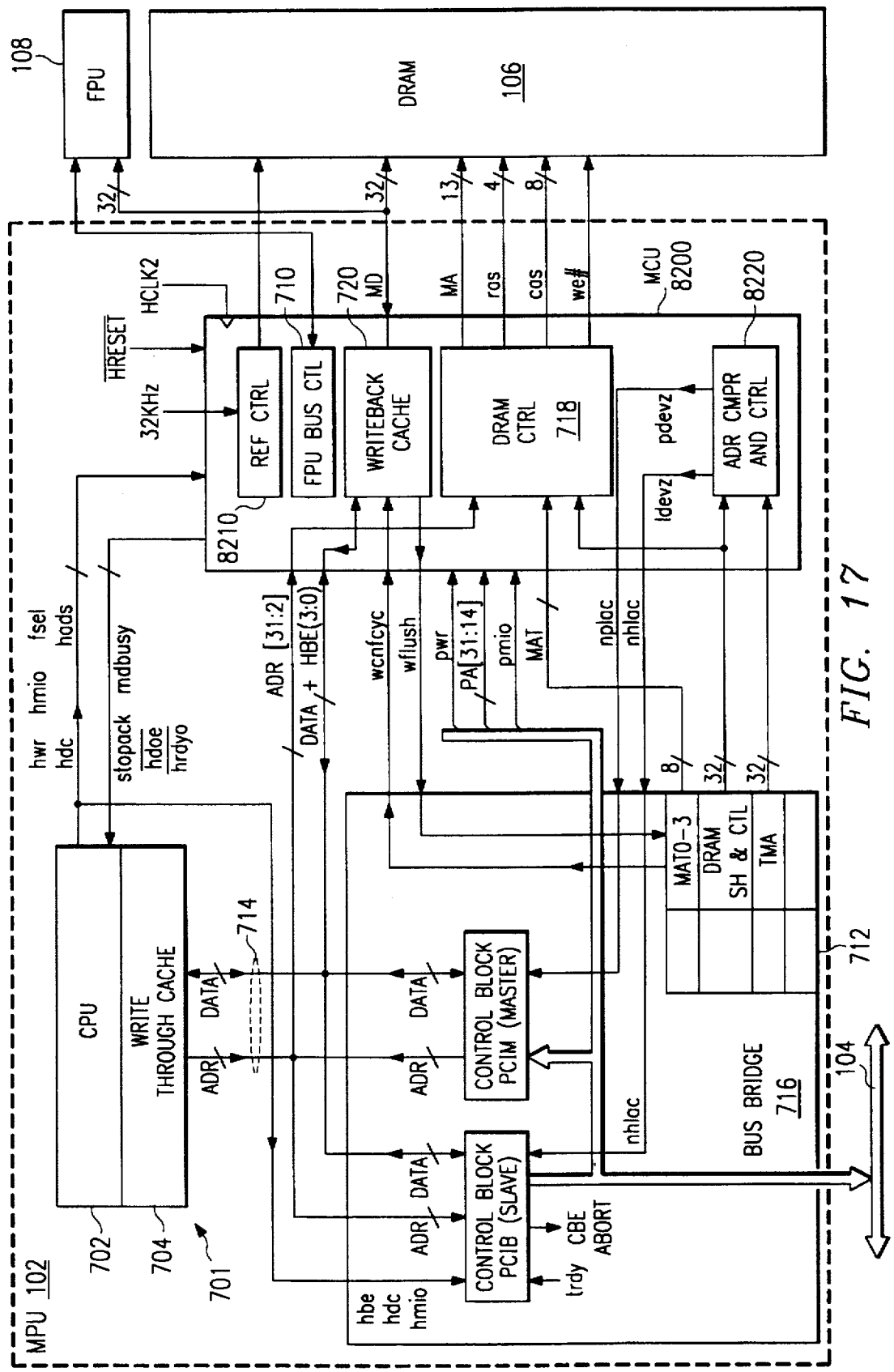
FIG. 17 is a partially block, partially schematic diagram of the microprocessor unit MPU 102 of FIGS. 5 and 9, emphasizing a device embodiment with memory controller unit (MCU) and bus bridge for use in system embodiments according to method embodiments as described.

In FIG. 17, MPU 102 of FIGS. 5 and 9 is detailed with emphasis on the bus bridge 716, configuration registers 712 physically associated with bus bridge 716, and a Memory Control Unit MCU 8200. MCU 8200 includes DRAM control block 718 and data router/buffer 720 which includes a Read/Write buffer implemented as a writeback cache in addition to and distinct from the cache in CPU 701. Further included in MCU 8200 are FPU interface controller 710, refresh controller 8210 fed with 32 KHz clock, and an address compare and control block 8220. Floating point unit FPU 108 is connected to the 32-bit data bus MD and has control lines connected to the FPU bus control block 710. DRAM 106 is connected via 32-bit data bus MD to the Buffer/Writeback Cache block 720, and is connected via 13-bit address bus MA and RAS, CAS, and WE# control lines to DRAM control block 718. CPU 70 supplies control signals Host Write hwr, hdc, hmio, Host address strobe hads, and fsel to MCU 8200. MCU 8200 sends control signals Stop Acknowledge stopack, host data output enable hdoe#, host ready output hrdyo#, and MD Bus Busy mdbusy.

Bus bridge 716 has bus control blocks PCIB for PCI slave operation and PCIM for PCI master operation. The PCI bus cycles are defined in the *PCI Local Bus Specification*, Revision 2.0 dated April 1993 (c) 1992, 1993 PCI Special interest Group, M/S HF3-15A, 5200 N.E. Elam Young Parkway, Hillsboro, Oreg. 97124-6497, and its updates incorporated herein by reference. Accordingly, for brevity, a further description of such bus control is omitted since this is suitably implemented according to the PCI specification or according to any other bus specification selected as the specification for bus 104 of FIGS. 5-7. As to bus bridge 716, the detailed description herein pertains to those portions of the circuitry of PCI bridge 716 which are pertinent to improvements herein and which are not already defined by such known bus specification.

Bus 104 with its PA address lines and its data lines is buffered, gated and muxed to on-chip local bus 714 having ADR and DATA lines in MPU 102 so that contention is advantageously avoided.

Remarkably, the read/write block 720 is implemented as a small write-back cache having 16 or 32 bytes, among other exemplary sizes, instead of a prefetch buffer. The write-back cache 720 has Least Recently Used (LRU) type operation in one embodiment. Write-back cache 720 provides data back to CPU without a DRAM 106 access, and maintains dirty data until it is full of dirty data (data not necessarily the same as DRAM 106 contents at the memory address written), whereupon an automatic write (cache flush) occurs to reestablish coherency. Also, this write-back cache is in addition to the 8Kbyte instruction/data cache 704 already included in the CPU core 701 of FIGS. 9 and 17. A write-back cache allocates on read, not on write. For example, when a cache hit to the write-back cache in block 720 occurs, the write-back cache is updated and memory is not updated, saving a wait cycle. Thus, later external third party accesses to DRAM are preceded by a write-back operation to memory from cache. When a cache miss to the write-back cache in block 720 occurs, the write-back cache is not updated and memory is updated. In MPU 102 the write-back cycle is advantageously invisible to the system because there is no third circuit to access.

The write-back cache 720 is advantageously independent of cache enable/disable control KEN# (cacheability control line for CPU 701). Thus no additional KEN# line is needed to control write-back cache 720.

Write-back cache 720 is especially advantageous on byte access operations wherein not a whole 32-bit double-word but a single byte at a time therein is accessed. The cache 720 improves the speed of display operations and string operations, for two instances, which are important subsets of byte access operations. Furthermore, the traffic on the MD and MA buses to DRAM 106 is reduced by a factor of four because the write-back cache prevents CPU 701 write-through cache 704 from causing a DRAM external access every time a mere byte is updated. Instead, the write-back cache 720 waits until its double-word contents (8 bytes in one cache 720 embodiment) are dirty whereupon it automatically executes a double-word write to the DRAM 106. This feature reduces power consumption (by providing a form of bus-quieting distinct from that of FIG. 12) and speeds up display operations, which is an especially important advantage in windows-type display operations and in portable computers such as notebook computers. Power consumption reduction depends on the software being run and may be as high as 75% multiplied by the ratio of byte accesses to all accesses.

The CPU 701 is described in *TI486 Microprocessor Reference Guide*, Texas instruments 1993, which is hereby incorporated herein by reference. The CPU 701 cache 704 is, for example, a write-through unified instruction and data cache, and lines are allocated only during memory read cycles. The cache 704 can be configured as direct-mapped or as two-way set associative. The direct-mapped organization is a single set of 256 four-byte lines. When configured as two-way set associative, the cache organization consists of two sets of 128 four-byte lines and uses a Least Recently Used (LRU) replacement algorithm. According to the write-through organization, a cache hit to cache 704 updates both cache 704 and memory 106. A cache miss in cache 704 ordinarily updates memory only, although a write-invalid option is possible. Working together, the single-chip combination of CPU core 702 and write-through cache 704 of FIG. 9 with the write-back cache 720 of FIG. 17 operates, upon cache hit in cache 704, to update both cache 704 and access write-back cache 720. If there is a miss in cache 720, only memory 106 is accessed, as if cache 720 were not present. If there is a hit in cache 720, then cache 720, and not memory 106, is accessed, thereby saving a wait cycle.

On the other hand, the write-through/write-back cache 704, 720 combination operates, upon cache miss in cache 704 to access cache 720. Again, if there is a miss in cache 720, only memory 106 is accessed, as if cache 720 were not present. If there is a hit in cache 720, then cache 720, and not memory 106, is accessed, thereby saving a wait cycle.

Memory 106 comprises banks of DRAM which ordinarily would exceed 64K bytes, and normally would have many-megabytes of storage space. Sandwiched between the 8Kbyte write-through cache 704, and the much larger external memory 106, write-back cache 720 is smaller by more than a factor of 8, and indeed smaller by more than a factor of 128 than either of the other two memories. This configuration is thus distinguished from a level-two cache which is larger than the CPU cache 704 when such level-two cache is used. In this way for relatively small 16–32 byte write-back cache investment, a remarkable improvement in MPU 102 performance is obtained.

Logic circuitry 8300 (shown in FIG. 18) in address compare block 8220 of MCU 8200 of FIG. 17 produces signals pdevz (also called low-active pci device access) and ldevz (also called low-active host local access) responsive to CPU 701 addresses lha[31:14] and bus 104 originated addresses pa[31:14]. The upper and lower halves of the circuitry of FIG. 18 are generally analogous in their circuit structures and this special improvement of the two circuits services host and pci related inputs respectively.

More inputs to logic circuitry 8300 include host data/ control# bus cycle control signal hdc (high for memory data cycle, low for control cycle), host data/io# control hmio and pci data control pmio (each interpreted as follows: high for memory data, low for i/o data), host write/read# bus cycle signal hwr, system management mode smm, and host access bank enable hben0-3 and pci access bank enable pben0-3 from address comparisons, referring to FIG. 21.

Further configuring control inputs include ten (10) pairs of bits 31:12 for Shadow Read SRR and Shadow Write SWR in the DRAM Shadow and Timing Control Register (tabulated earlier hereinabove). These high-active bits determine whether shadowing is enabled for read and/or write respectively for ten blocks within the first Meg (lsb 20 address bits 19:0) of memory 106 and specifically in the address range 000C 0000h-000DFFFFh as tabulated. Inputs for lha[19:18]=11 or pa[19:18]=11 signify the 000Cxxxx through 000Fxxxx blocks of memory 106 since 11xx binary is C,D,E, or F xxxx hexadecimal. Inputs lha[17:14] or pa[17:14] signify any of 16 sections within blocks C-F xxxx hex.

Figure 18:
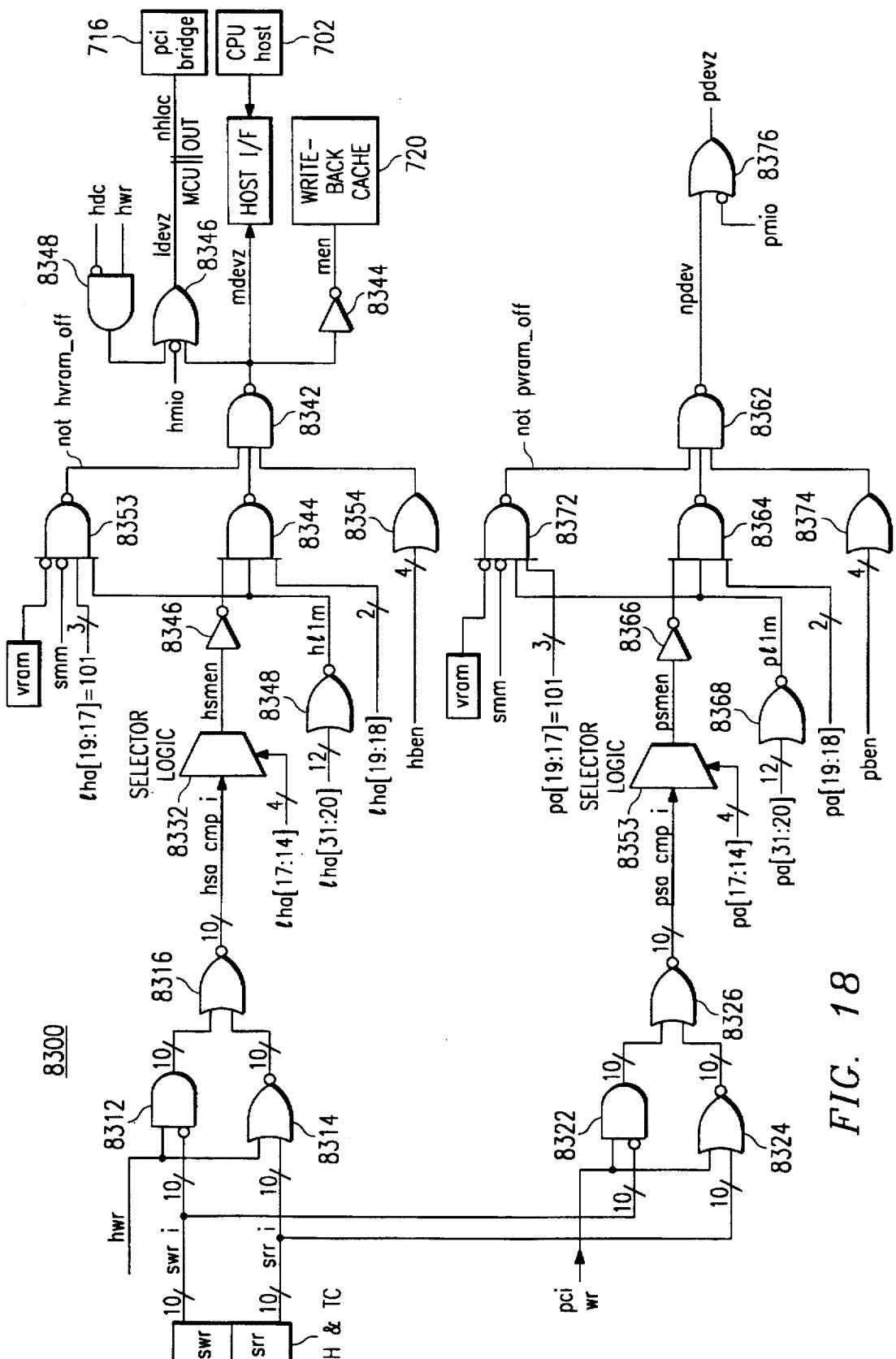
FIG. 18 is a schematic diagram of part of the memory controller unit (MCU) embodiment of FIG. 17.

In FIG. 18, each of 10 SWR bits is fed to a low-active input of ten AND gates 8312 respectively. Each of 10 SRR bits is fed to an input of ten NOR gates 8314 respectively. A high active host write hwr qualifying signal line is connected to a high active second input of all ten AND gates 8312 and all ten NOR gates 8314. The high-active outputs of the ten AND gates 8312 and the ten NOR gates 8314 are fed to input pairs of ten NOR gates 8316 to provide ten low-active outputs signifying which memory spaces are forbidden for host read or write depending on signal hwr being low or high.

A further VRAM configuring bit 11 in the DRAM Shadow and Timing Control Register determines if low that the MCU 8200 is forbidden to respond to addresses in an address range tabulated for VRAM purposes. Inputs for lha[19:17]=101 or pa[19:17]=101 signify the 000Axxxx or 000Bxxxx blocks of memory for VRAM since 101x binary is A or B hexadecimal.

NAND gate 8342 provides a negative logic ORing function of its inputs to produce an output high indicating that the MCU 8200 is forbidden to respond to a particular attempted access. The write-back cache 720 is enabled when NAND gate 8342 mdevz output is low, by high active memory enable signal men generated by invertor 8344 inverting the mdevz output of NAND gate 8342. Also, bus bridge 716 is supplied a low-active signal nhlac which signals the bus bridge 716 that an address is being asserted by the host in permitted DRAM space and that the bus bridge 716 should not convert the CPU access into a PCI bus cycle. Signal nhlac (or ldevz) is supplied by an OR-gate 8346 which supplies an output low (signifying that the MCU will take the cycle) provided that control hmio is high (host access to memory) and an AND gate 8348 low output signifies that a host write/read# hwr signal is low (read active) or that a host hdc signal is high (data cycle), and that the inputs of NAND gate 8342 are all high indicating a host read or write access into a permitted (non-forbidden) section of memory space.

NAND gate 8342 input from an output of NAND-gate 8352 (not hvram_off) is disabling low if vram bit 11 in DRAM Shadow and Control Register is zero (off) and system management mode smm is off (zero), in combination with the host 701 addressing an address space segment in video space (lha[19:17]=101), while the access is not outside the first 1 Meg of address space (lha[31:20]=all zero), as indicated by a high level at the output of NOR gate 8348. Among the important improvements herein described, the introduction of system management mode smm shadowing in DRAM is emphasized because of the flexible control advantages it confers with relatively uncomplicated circuitry as shown.

NAND gate 8342 input from an output of NAND-gate 8344 is disabling low if an SRR or SWR bit in DRAM Shadow and Control Register is disabling respective read or write access to a section of address space which is actually being addressed by the host (lha[17:14]) and the host is addressing somewhere in the space (lha[19:18]=11 (C,D,E, Fxxxx) and the access is in the first 1 Meg of address space (lha[31:20]=all zero). The correspondence of section of address space being addressed by host (lha[17:14]) with a disabling low SRR or SWR bit is determined by selector logic 8332 having ten inputs respectively connected to the ten NOR gates 8316 signifying disabled host read or write memory areas. The ten inputs of selector logic 8332 are internally gated by ten respective decode circuits in logic 8332 responsive to ten respective address space sections or subspaces represented by codes in address lines (lha[17:14] ). A low-active output hsmen from selector logic 8332 is made active-high by an inverter 8346 which in turns feeds an input of NAND gate 8344.

Figure 21:
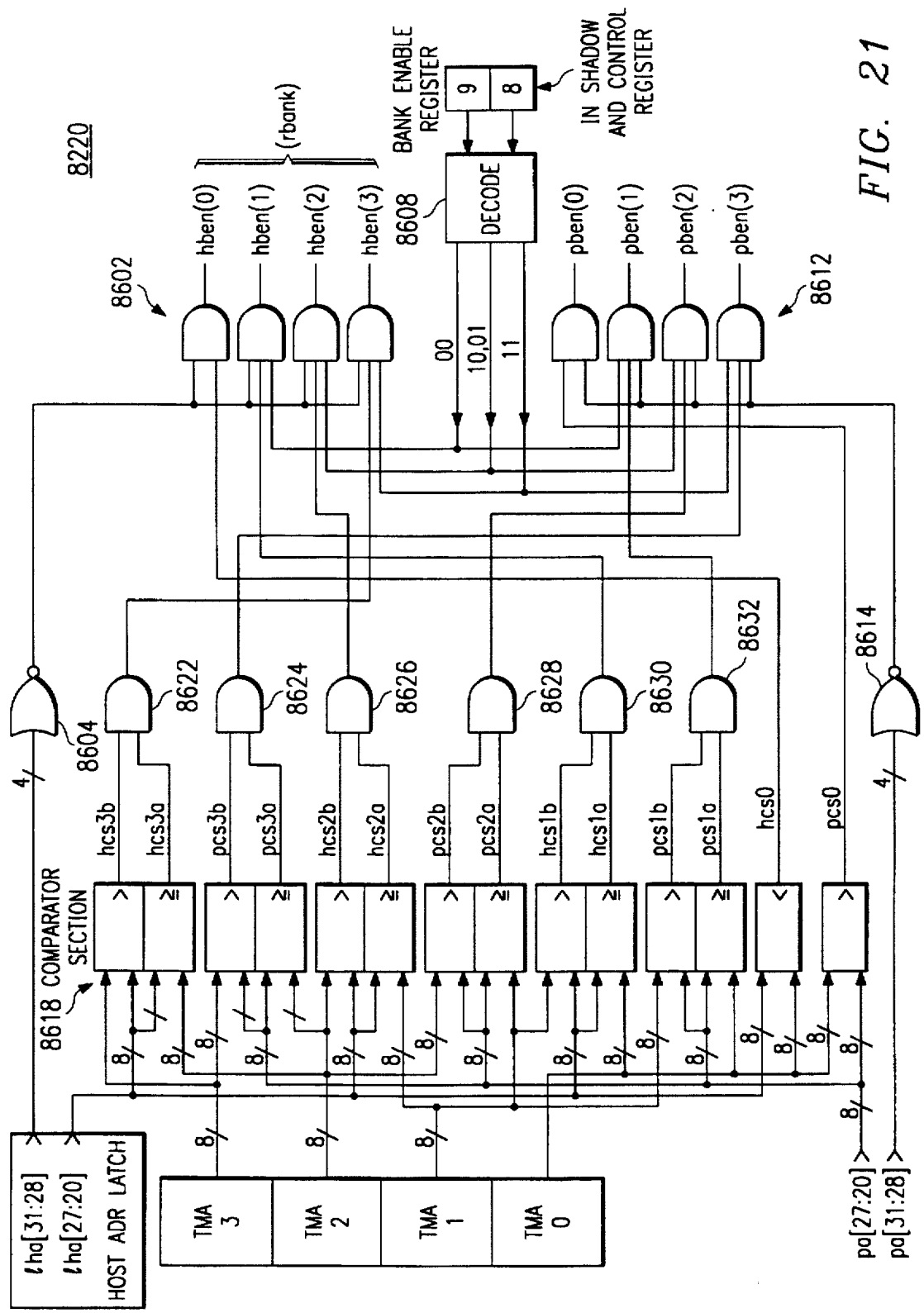
FIG. 21 is a partially block, partially schematic diagram of address comparison circuitry in the MCU of FIG. 17.

NAND gate 8342 input from an output of OR-gate 8354 is disabling low if all of the hben bank enable inputs are low, signifying an attempted host access into any bank not enabled by the ENB bits, referring to FIG. 21.

In an important improvement logic circuit embodiment, a pci-related lower half of FIG. 18 is combined with the host-related upper half of FIG. 18. In this way a nplac (pdevz) signal is developed to control the bus bridge 716 in a way complementing the control provided by signal nhlac. Elegantly analogous circuitry comprising ten AND gates 8322, ten NOR gates 8324 and ten NOR gates 8326 is responsive to PCI write control signal pci wr as well as bits SRR and SWR. Selector logic 8353 has ten inputs for NOR gates 8326 and feeds inverter 8366 to a NAND gate 8364 also fed by pl1m NOR gate 8368 and CDEF signal pa[19:18] =11. Another NAND gate 8372 provides not pvram_off signal responsive to vram low, smm low, pl1m (1M access) and A,B space pa[19:17]. An OR-gate 8374 supplies an output that disables NAND gate 8362 if pci access is attempted to any disabled bank. NAND gate 8362 is also fed by NAND gates 8372 and 8364 to supply an output npdev which is ORed with pmio# in an OR-gate 8376 to produce output pdevz. In other words if pmio is high thereby signifying a pci memory access and NAND gate 8362 supplies an active npdev=0 signal, then OR-gate 8376 outputs a low signal nplac (pdevz) to bus bridge 716 to allow pci access to DRAM 106.

Figure 19:
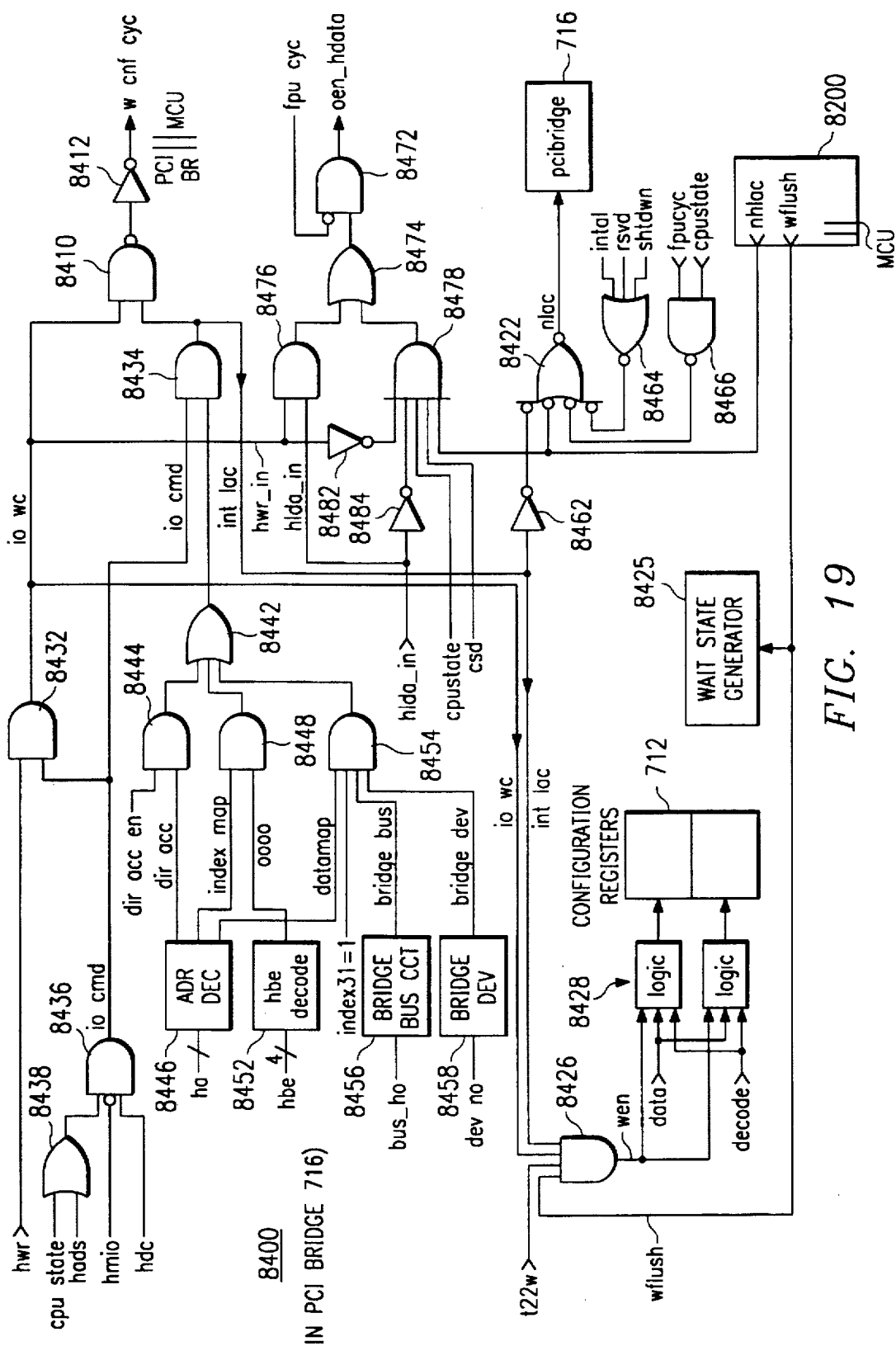
FIG. 19 is a partially block, partially schematic diagram of a circuitry embodiment part of the bus bridge of FIG. 17.

In FIG. 19, logic circuitry 8400 in the bus bridge 716 of FIG. 17 provides further improvement embodiment circuitry to perform a request-acknowledge handshake with MCU 8200 so that configuration registers 712 are not inadvertently updated when MCU 8200 is performing a memory access which depends on their contents. The request signal is a high-active write configuration register cycle w cnf cyc, and the acknowledge signals are a low-active write-back cache flush wflush, a low-active host local access signal nhlac, and the low-active pci local access signal nplac (pdevz) of FIGS. 17 and 18.

In FIG. 19, a NAND gate 8410 followed by an inverter 8412 supplies the request signal w cnf cyc from the bus bridge 716 to the MCU 8200. An nhlac active low acknowledge comes back from MCU 8200 to a low-active input of an OR-gate 8422 connected for low-active anding to supply a low-active output nlac to the rest of bus bridge 716 as shown in FIG. 17. Also, signal wflush activates a wait state generator 8425 in the circuitry for accessing memory 106. Moreover, high active acknowledge wflush enables an AND gate 8426 which in turn supplies a write enable signal wen to logic 8428 that write updates the configuration registers 712. Logic 8428 gates DATA from the host 701 or bus 104 to the appropriate one of configuration registers 712 as selected by register address DECODE circuitry gating logic 8428. AND gate 8426 has inputs for the following signals: write clock t22w, io write command io wc, and internal local access int lac in addition to acknowledge wflush.

Note that NAND gate 8410 has inputs for both io wc and int lac signals to make the request. When wflush responds and clock t22w is present, then AND-gate 8426 enables configuration register write. The concept here is detection of an io attempt to write into the configuration registers 712 followed by request to MCU 8200 to avoid contention, followed by an acknowledge from MCU 8200. If configuration registers had to be duplicated in bus bridge 716 and MCU 8200, or split between them with duplicated controllers to control accesses to the split group of configuration registers, then die (chip) area would be wasted with extra circuitry. Advantageously in this embodiment, an uncomplicated request/acknowledge arrangement with a single request communicated on line w cnf cyc and a plurality of acknowledges wflush, nplac and nhlac on the same single chip holding both the bus bridge 716 and memory controller MCU 8200 suffices to avoid contention and save real estate and manufacturing expense.

Discussion now turns to signals io wc and int lac in further detail. Signal io wc is generated by an AND-gate 8432 which has a first input for host write/read# hwr and a second input connected to the output i/o command signal io cmd of an AND gate 8436. Signal int lac is generated by an AND gate 8434 which has a first input connected to the output io cmd of an AND gate 8436 and a second input connected to the output of an OR gate 8442. The reason for detecting i/o commands is that in this embodiment it is precisely these commands that update configuration registers as distinguished from performing memory 106 accesses. The purpose of OR gate 8442 and its input logic is to detect a write to those particular configuration registers on which the operations of the MCU 8200 depend and thus where contention might become a problem. Such registers are MAT, TMA, and DRAM Shadow and Control Register. When such write is detected, the w cnf cyc request is issued and operations held off until a wflush acknowledge or permission is received from the MCU to go ahead and update write into the configuration registers.

AND gate 8436 has three inputs. One input receives a host data/control cycle signal indicated by line hdc driven high, a second input receives a signal (active low on line hmio) indicating an input/output access, and a third input receives the output of OR-gate 8438 indicating either that a control cpu state is high or that host address strobe bads is high.

OR-gate 8442 has three inputs. A first input of OR-gate 8442 is fed by the output of an AND gate 8444 having an access signal dir acc supplied by an address decoder from host address lines ha and a second input of AND gate 8444 fed by a qualifying enable dir acc en.

A second input of OR-gate 8442 is fed by the output of an AND gate 8448 having an index map input from address decoder 8446 enabled by a host byte enable hbe decoder 8452 output for hbe=0000.

A third input of OR-gate 8442 is fed by the output of an AND gate 8454 having four inputs of its own. The first input of AND gate 8454 is fed by a datamap output of address decoder 8446. The second gate 8454 input is fed by a signal index 31=1. A bridge bus circuit 8456 responsive to a signal bus_ho (host output) feeds a third gate 8454 input, and a bridge device (bridge dev) signal circuit 8458 responsive to a signal dev no (device number) feeds the fourth gate 8454 input.

Returning to OR gate 8422 briefly, note that signal int lac is a enabling input via an inverter 8462 to gate 8422. A further enabling input is supplied by a NOR gate 8464 having inputs for interrupt intal, reserved rsvd (tied low) and shutdown shtdwn. Another enabling input is supplied by a NAND gate 8466 having inputs for signal floating point unit cycle fpucyc and signal cpustate. (Signal cpustate indicates that the cpu is the master.)

A signal representing an output enable for host data is designated oen_hdata and supplied by an AND gate 8472 having inputs for no fpu cycle fpu cyc# and for the output of an OR gate 8474. OR gate 8474 has inputs fed by an AND gate 8476 and an AND gate 8478. AND gate 8476 has inputs for signal io wc and Hold Acknowledge hlda_in from PPU 110. AND gate 8478 has five inputs: 1) for io wc inverted by an inverter 8482, 2) for hlda_in inverted by an inverter 8484, 3) for signal cpustate, 4) for a signal csd, and 5) for signal nhlac from MCU 8200. The concept here is that a host data output enable is provided if an acknowledged host write is present or an MCU-recognized host local access is present.

Figure 20:
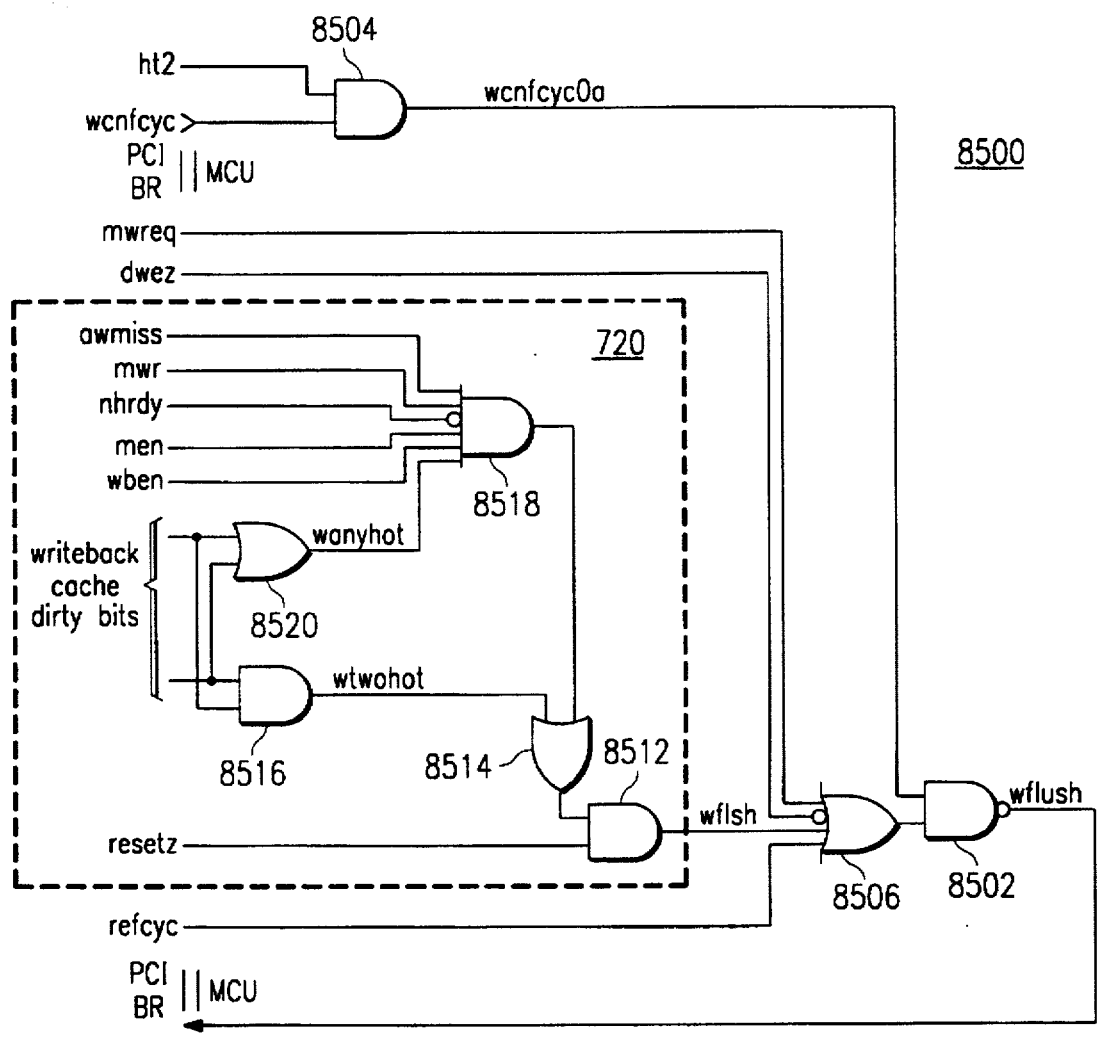
FIG. 20 is a schematic diagram of a circuitry embodiment part of the MCU of FIG. 17, and FIG. 20 has connections which mate to lines in the bus bridge schematic of FIG. 19.

In FIG. 20 a complementing logic circuitry 8500 improvement embodiment in the MCU 8200 of FIG. 17 mates to lines in the bus bridge circuitry 8400 in FIG. 19. In logic circuitry 8500, an AND gate 8502 supplies the acknowledge signal wflush to bridge circuitry 8400. AND gate 8502 has a first input fed by an AND gate 8504 which is fed by the wcnfcyc request signal from circuitry 8400 clocked by the host t2 (ht2) clock. The second input of AND gate 8502 is fed by the output of an OR gate 8506 which responds to active highs on any of four inputs: 1) a memory write request mwreq, 2) a DRAM write enable dwez (low-active inverted), 3) a write-back cache AND-gate 8512 output wflsh, and 4) a refresh cycle signal refcyc since the MCU 8200 is using configuration register timing information to control refresh.

Focusing now on the writeback cache 720 circuitry that produces flush signal wflsh, AND gate 8512 has a first input for low-active reset signal resetz so that no flush signal is output in reset. AND gate 8512 has a second input fed by the output of an OR-gate 8514 which in turn has two inputs fed by a signal wtwohot output of AND gate 8516 and fed by the output of a six-input AND gate 8518.

OR-gate 8514 input wtwohot when high signifies that both of two dirty bits of the write-back cache 720 are in the dirty (hot) state indicating lack of coherency with the DRAM. This condition means that a DRAM write cycle is soon to be initiated from write-back cache 720 to DRAM 106 to eliminate the hot state and assure room in the write-back cache 720 for more storing operations. (In a read cycle, the CPU 701 is waiting for completion of the read cycle in this embodiment, and configuration register contention does not happen.)

AND gate 8518 output when high signifies or predicts the potentiality of a wtwohot state coming soon but not actually present yet. AND gate 8518 output is responsive to the conjunction of all of six inputs: 1) address miss to the write-back cache 720 (awmiss high), 2) memory write from CPU 701 (mwr high), 3) MCU 8200 is ready for the memory write from CPU 701 (nhrdy active low), 4) enable signal men (see FIG. 18) high indicates that the write is directed to an allowed memory space, 5) write-back cache enable when signal is high, and 6) at least one write-back cache dirty bit is hot (1) as indicated by a high output wanyhot from an OR gate 8520 ORing the dirty bits instead of anding all of them. The significance of signal wflsh is that no acknowledge should be given to the wcnfcyc request to update a configuration register because the current information therein is needed to complete an imminent memory 106 transaction by MCU 8200, advantageously avoiding contention.

In FIG. 21, address comparison block 8220 in the MCU 8200 of FIG. 17 is responsive to the Top Memory Address values in the TMA register to produce a high for one bank signal hben(0), hben(1),hben(2), or hben(3) depending on which bank is being addressed by CPU 701. Thus hben refers to a host access to a particular bank. Analogously, block 8220 is responsive to the Top Memory Address values in the TMA register to produce a high for one bank signal pben(0), pben(1), pben(2), or pben(3) depending on which bank is being addressed via the PCI bus 104 as in a DMA access. Thus, pben refers to a bus (e.g. PCI) access to a particular bank in DRAM 106.

The bank signals hben are supplied by four AND-gates 8602 in FIG. 21. All four AND-gates 8602 are enabled by a NOR-gate 8604 provided host address bits lha[31:28] are zeroes (low). Also, the AND-gates for hben(1,2,3) are respectively enabled by outputs of a decoder 8608 in response to a pair of bits ENB1-0 at bits 9,8 of the DRAM shadow and control register tabulated earlier hereinabove. In this way, any selected number of banks starting from bank 0 can be enabled by the register bits ENB1-0 via decoder 8608. The bank signals pben are supplied by four AND-gates 8612 in FIG. 21. All four AND-gates 8612 are enabled by a NOR-gate 8614 provided bus 104 derived address bits pa[31:28] are zeroes (low). Also, the AND-gates for pben (1,2,3) are respectively qualified by outputs of decoder 8608 in response to bits ENB1-0, at bits 9, 8 of the DRAM shadow and control register.

Address comparison circuit 8220 of FIG. 21 provides a comparator section 8618 to detect the identity of the bank being addressed by eight address bits lha[27:20] or pa[27:20]. Notice that the lower 20 lsb address bits lha[19:0] and pa[19:0] are of no consequence in the comparison performed by section 8618, as the Top Memory Address values stored in the TMA register correspond to higher order address bits, above bit position 20 in this example. Comparator section 8618 compares a given address with at least one Top Memory Address value. For example, if an address is less than the TMA0 value, then bank 0 is being addressed and comparator output hcs0 enables hben(0) or output pcs0 enables pben(0) depending on the source of the address.

Host addresses lha directed to other banks are compared by three pairs of comparators with three pairs of adjacent Top Memory Address values in adjacent bytes TMA0,1; TMA1,2; TMA2,3 of the TMA register. An address is directed to a bank if the address lies between the address boundaries of the bank will enable the bank signal for that bank. The address is detected as "between" the boundaries when the address is greater than or equal to the lower boundary TMA value and less than the upper boundary TMA value.

Bus addresses pa directed to such banks are compared by three more pairs of comparators in section 8618 with the three just-named pairs of adjacent Top Memory Address values in adjacent bytes TMA0,1; TMA1,2; TMA2,3 of the TMA register. The pairs of comparators have outputs which are connected to pairs of inputs of respective AND gates in an array 8622, 8624, 8626, 8628, 8630, 8632.

For one example, comparator outputs hcs3b and hcs3a supply AND gate 8622. The output of AND gate 8622 enables an AND gate for hben(3) in set 8602. Comparator output hcs3a when active signifies that an asserted host address is greater than or equal to the value TMA2. Comparator output hcs3b when active signifies that the value TMA2 is greater than or equal to the asserted host address. In this way an asserted host address between TMA2 and TMA3 values is detected. Similar remarks apply to the other comparator pairs in comparator section 8618.

Figure 22:
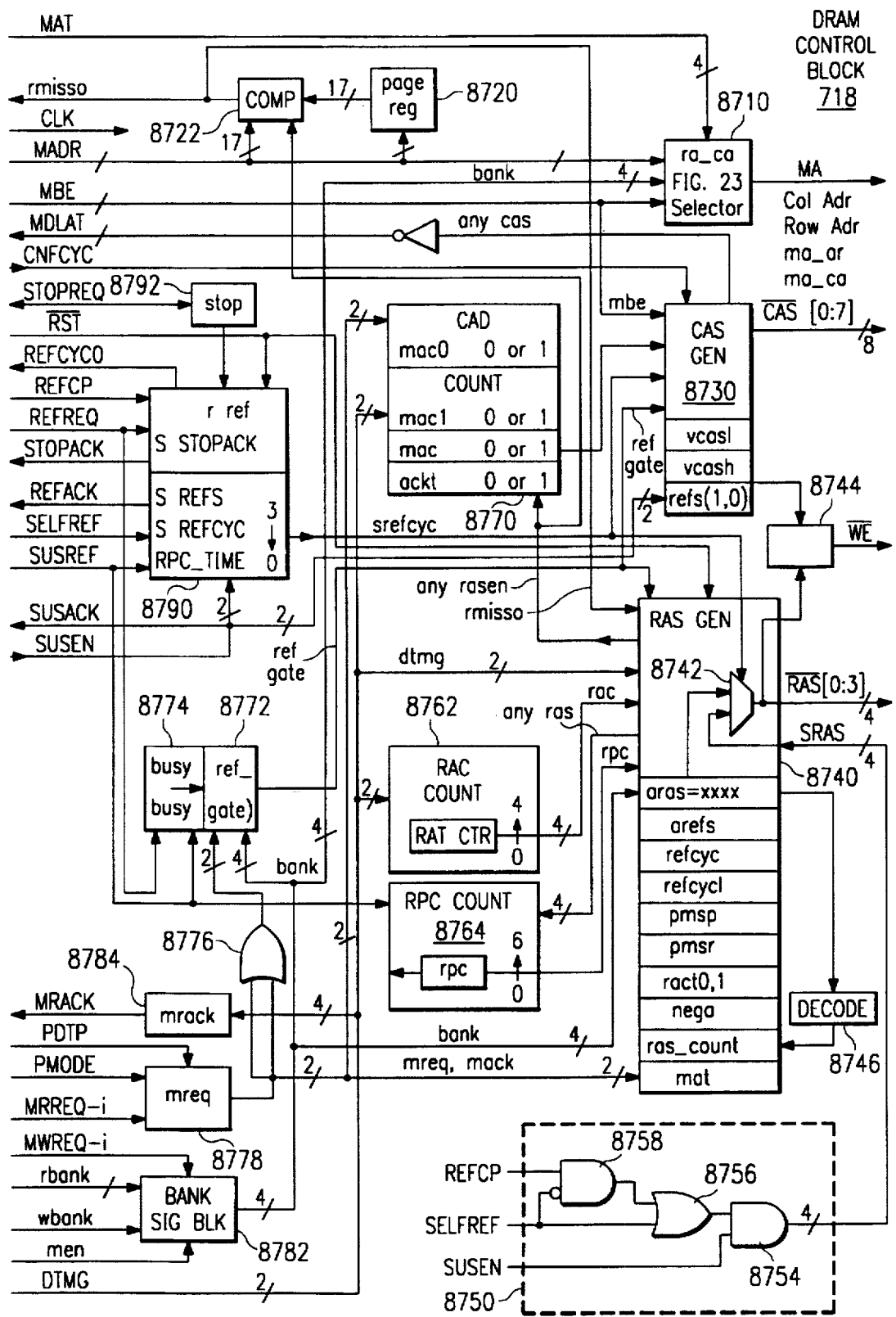
FIG. 22 is a partially block, partially schematic diagram of a DRAM control block embodiment in the MCU of FIG. 17.

In FIG. 22 a DRAM control block embodiment 718 in the MCU 8200 of FIG. 17 has a row/column address selector circuit 8710 fed by address lines MADR, and byte enable lines MBE, and four bit-pairs from MAT Memory Array Type register to produce the memory address output on lines or pins MA to external memory 106. A page register 8720 holds 17 bits from address lines indicative of pages. A comparator 8722 compares a latest page address from lines MADR with the next previous page address held in page register 8720. If these page addresses do not match, comparator 8722 outputs a page miss high rmisso to the write-back cache 720 and to a Row Address Strobe (RAS) generator block 8740.

A Column Address Strobe (CAS) generator block 8730 has inputs for configuration cycle CNFCYC, byte enables MBE, suspend enable SUSEN, and suspend acknowledge SUSACK. CAS generator 8730 outputs low-active CAS# [0:7] to memory 106, as well as a write enable output to logic 8744 which supplies the WE# output to memory 106. An output MDLAT is also supplied on-chip by block 8730 through an inverter.

Row Address Strobe (RAS) generator block 8740 has inputs for page miss rmisso, memory request mreq, memory acknowledge mack, and a bank signal. Various latches in RAS generator 8740 are Actual RAS aras (4 bits) muxed by a mux 8742 with the 4 bit RAS output (SRAS) of a Self Refresh RAS generator 8750, actual refresh latch arefs, first refresh clock cycle latch refcyc, second refresh clock cycle latch refcyc1, page mode latches pmsp and pmsr, ras activation state machine latches fact0 and ractl, RAS negate latch nega, RAS active time count ras_count, and memory activation timing latch mat (not to be confused with Memory Array Type configuration register MAT).

Figure 34:
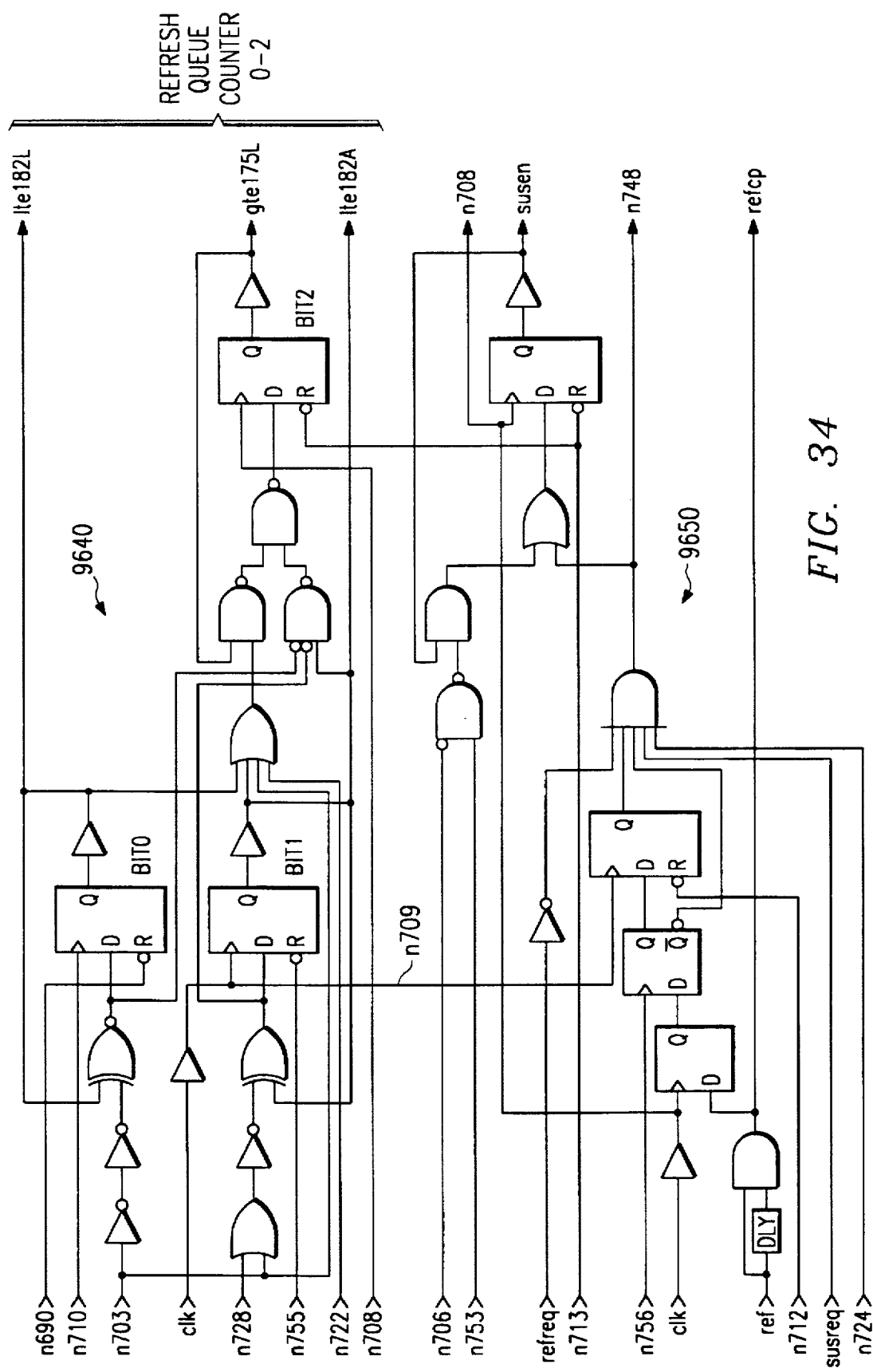

AND gate 8754 has an enabling input for Suspend Enable SUSEN from Refresh block 8210 (FIGS. 17 and 34), and a second input fed by an OR-gate 8756. A single-line output of AND-gate 8754 drives four SRAS lines in tandem, hence the slash-4 entry at gate 8745 output in FIG. 22. OR-gate 8756 is activated by either a Self Refresh signal SELFREF or the output of an AND gate 8758. AND-gate 8758 has inputs: 1) not SELFREF, and 2) DRAM control 718 input signal REFCP refresh clock pulse (FIG. 34).

In FIG. 22, a Row Address Access time counter RAC COUNT 8762 counts from zero to four (0–4) and supplies four output lines rac to RAS generator 8740. A Row Address Precharge time counter RPC COUNT 8764 has inputs on line any ras from RAS generator 8740 and supplies back an output rpc to generator 8740.

A Column address timing block 8770 selects 1 or 2 clocks for CAS to CAS generator 8730 according to latch contents respectively designated 0 or 1 in block 8770. These latches are mac0, mac1, mac, and ackt. Timing block 8770 is fed with any ras enable from RAS generator 8740, with two-bits of dtmg (see DTMG 1-0 in bits 7-6 of the DRAM Shadow and Timing Control Register tabulated earlier hereinabove), and with memory request and memory acknowledge lines mreq and mack.

A bank signal block 8782 combines read bank rbank, write bank wbank, memory enable men, and memory write request MWREQ signals to produce four signals respective to the four banks and designated "bank". An advantage of the writeback cache 720 results from a circuit provided therein to store or cache hben of FIG. 21 (also called rbank). Then when a bank value is needed, the write-back cache 720 checks the asserted address, and if its bank value is already cached in that circuit, the bank value is retrieved under the signal designation wbank and supplied to bank logic 8782 of FIG. 22 to establish a bank signal for the DRAM controller 718.

A memory request block 8778 has page mode input signals PMODE and PDTP as well as memory read request MRREQ, and supplies the mreq, mack signals. These mreq, mack signals are ORed by OR gate 8776 for a refresh gate circuit ref_gate 8772 that has the bank inputs and supplies output refgate to both the RAS and CAS generators 8740 and 8730. A busy circuit 8774 is fed by Refresh Request REFREQ and Suspend Refresh SUSREF inputs from refresh block 8210 (see FIG. 17), and in turn controls the refresh gate circuit 8772.

A control logic block 8790 provides handshaking and arbitration between memory refresh cycles and regular memory data access cycles. Block 8790 has inputs for REFCP, REFREQ, SELFREF, SUSREF, SUSACK, SUSEN, RST#, and STOPREQ (hstop2mcu) via a stop circuit 8792. Block 8790 supplies Stop Acknowledge STOPACK (hstopfmmcu) for handshaking with CPU 701 as described in connection with FIG. 36 of the incorporated patent applications Ser. No. 08/363,198, and the other copending applications noted in the Background of the invention hereinabove. Refresh Acknowledge REFACK and Refresh Cycle 0 REFCYC0 outputs are provided by block 8790. A refresh cycle control output srefcyc is supplied to both CAS and RAS generators 8730 and 8740, and controls mux 8742. A refresh downcounter RPC_TIME counting from 3 down to 0 is included in block 8790.

Still further detail on the DRAM controller block 718 follows.

Signal MRREQ memory read request and MWREQ memory write request are both initiated by write back cache block 720 upon read miss and write miss respectively.

These signals, which are based on host/cpu bus protocol, are converted by DRAM controller block 718 to DRAM cycle protocol, i.e. read cycle is terminated at end of CAS (Column Address Strobe) cycle and write cycle is terminated at leading edge of CAS. Also it sends acknowledge signals to write back cache controller when they are completed.

Signals rbank and wbank select DRAM BANK according to given read or write request from processor or PCI master. On read cycle which is always read miss case at write-back cache 720, address comparator 8220 drives rbank directly. However, on write cycle there are two cases. One is write miss and the other is write back. In case of write back cycle, write back cache memory 720 advantageously drives wbank because the pre-decoded information is stored in cache memory. In this way, the integrated small cache memory reduces address decoding time for a write-back cycle.

Block 8740 generates 4 signals RAS#[0:3] to control respective banks 0,1,2,3 in DRAM 106 in conjunction with block 8730.

Register aras[0:3] holds all status of synchronous logic parts, ie. RAS for data access and RAS for refresh except suspended refresh during which no CPU CLK is available. For data access RAS, the aras register is driven by the bank signal information when page mode is off. If page mode is on, all RAS is initially inactive whereupon on page miss, a selected one RAS is negated and activated.

Once any of register aras bits [0:3] is activated for data access, a 2 bit counter ract0,1 starts to count clock cycles (ract0 is bit 0 and ract1 is bit 1). Counter ract0,1 operates so that ras access time which is specified for the DRAM chips actually employed is such as to control the period from leading edge of RAS to leading edge of CAS. When counter ract0,1 reaches the value specifed by DRAM timing bits DTMG (bits 7-6 in DRAM Shadow and Timing Control Register tabulated earlier hereinabove), signals CAS[0:7] are activated. Register nega stores a flag to stop counting in counter fact0,1 when register bits aras[0:3] are negated.

Register mat in block 8740 sets flags if Row Address is driven to MA when register aras[0:3] is negated in order to allow signal aras[0:3] on next CLK. Register mat gives a timing of address setup time for a RAS signal as needed to accommodate each particular DRAM device in memory 106.

In block 8770, register mac flags when Column Address setup time to CAS is going to be satisfied according to the value specified by the DRAM TYPE MAT configuration register so that signal casl or cash can be asserted for data access.

Returning to block 8740, a latch pmsp flags that page miss precharge time has completed. When page miss occurs on the same bank, DRAM controller 718 has to wait until selected RAS precharges. However, if selected RAS was not active, it can be activated immediatedly. Latch pmsp enables register aras[0:3] if that is the case.

Register pmsr[0:3] holds information identifying which bank is previously activated so that it can be compared with the identification of the currently selected bank in order to determine if it is page hit or miss.

Block 8762 RAC_COUNT and Block 8764 RPC_COUNT continually track RAS signal activity. RAC stands for Ras ACcess time and RPC stands for Ras PreCharge time. When RAS is asserted RAC_COUNT starts incrementing and RPC_COUNT is reset. On the other hand, when RAS is negated, RAC_COUNT is reset and RPC_COUNT starts to increment. These counter values are used to determine the clock timing to drive RAS HIGH and LOW. According to these counter values and given the value through DTMG configuration bits, block 8740 controls register bits ras[0:3] for DRAM data access.

Block 8730 controls CAS[0:7] signals to DRAM 106. The 8 CAS lines advantageously control double sided DRAM with a minimum of 2 RAS signals for 2 banks of double sided DRAM, 4 RAS signals for 4 banks of double sided DRAM, and 8 RAS signals for 8 banks of double sided DRAM. This DRAM controller 718 also is useful in applications whether or not they use double sided DRAM. Having 8 lines of CAS also makes each CAS to transit faster for higher frequency CPU operation with less noise and accommodates many applications. To support such double sided DRAM, there are 2 sets of cas registers: register casl and register cash. Register casl operates with DRAM bank0 and bank2 and register cash operates with DRAM bank1 and bank3.

On a read cycle both of the cas low, high registers (casl or cash) are asserted regardless of byte_enable information BE[3:0]# given by processor 701 to allow internal write back cache 720 and write-through cache 704 in processor 701 to allocate current address in cache memory. However, on a write cycle registers casl and cash follow BE information to select which data is valid.

Upon a REFRESH request from refresh controller 8210 (see FIG. 17), DRAM controller 718 arbitrates data access and such refresh cycle to DRAM. Host bus cycles and DRAM cycles are isolated from each other by WRITE BACK CACHE 720 in the device, and arbitration is performed at block 8740 and block 8730.

Block 718 DRAM CONTROL supports three types of refresh. A first one is regular refresh when system is running. Second is SUSPEND refresh with no-self-refresh type DRAM. And third is SUSPEND refresh with self-refresh type DRAM.

When the system is running, DRAM controller block 718 does a staggered refresh process to minimize system power line noise. When a refresh request occurs while data access to DRAM is progressing, refresh is serviced after completion of the current data access. Also, when refresh is progressing, data access to DRAM has to wait, so a READY signal to processor is prevented during refresh. However, on occurrence of a read/write hit to write back cache and write allocate cycle, since a HOST bus cycle and a DRAM cycle are isolated from each other, they are advantageouly allowed to proceed independently without any wait states.

When the system is entering SUSPEND mode, to save overall system power only the memory subsystem is powered, but not clocked since toggling the CLK line at clock frequency consumes power. However, in suspend mode DRAM is advantageously refreshed correctly under control of block 8750 to preserve the information stored therein. Non-selfrefresh type DRAM is ordinarily refreshed every 15.6 microseconds. Signal refcp holds an about minimum 200 nanosecond pulse on both rising and falling edges of 32KHZ RTC CLK converted by low powered delay line implemented in block 9600 refresh (see FIGS. 32 through 35). Since signals CAS[0:7] are activated during SUSPEND refresh, the type of refreshing is CAS-before-RAS which does not require provision of any refresh address.

Signal CAS[0:7] and signal RAS[0:3] are synchronized to CLK during non-suspend mode. When suspend request is asserted by signal STOPREQ, after waiting one refresh period, blocks 8730, 8740 negate all signals RAS#[0:3] and signal CAS#[0:7]. Once all RAS and CAS signals have been inactivated, Suspend Acknowledge signal SUSACK is asserted to block refresh control and to indicate, to refresh block 8210 (FIG. 17), that SUSPEND REFRESH MODE is established. Refresh Block 8210 then asserts signal SUSREF which, via block 8790, switches multiplexer 8742 to pass asynchronous refresh pulse information (signal refcp in block 8750) to signal RAS[0:3]. Also at the same time signal STOPACK is returned to processor 701 to stop clock oscillation by phase lock loop PLL.

Waiting one refresh period to switch SUSPEND mode advantageously ensures spike free asynchronous switching. When STOPREQ is negated, signal srefcyc is maintained active for another pulse of signal REFCP, advantageously ensuring that switching back from asynchronous to synchronous mode does not have any spike noise on RAS/CAS signals.

If DRAM is self refresh type, signal SELFREF simply disables REFCP to pass RAS#[0:3] so that RAS#[0:3] can be maintained low during SUSPEND MODE. DRAM will then enter self refresh mode if the condition lasts over 100 us.

Figure 23:
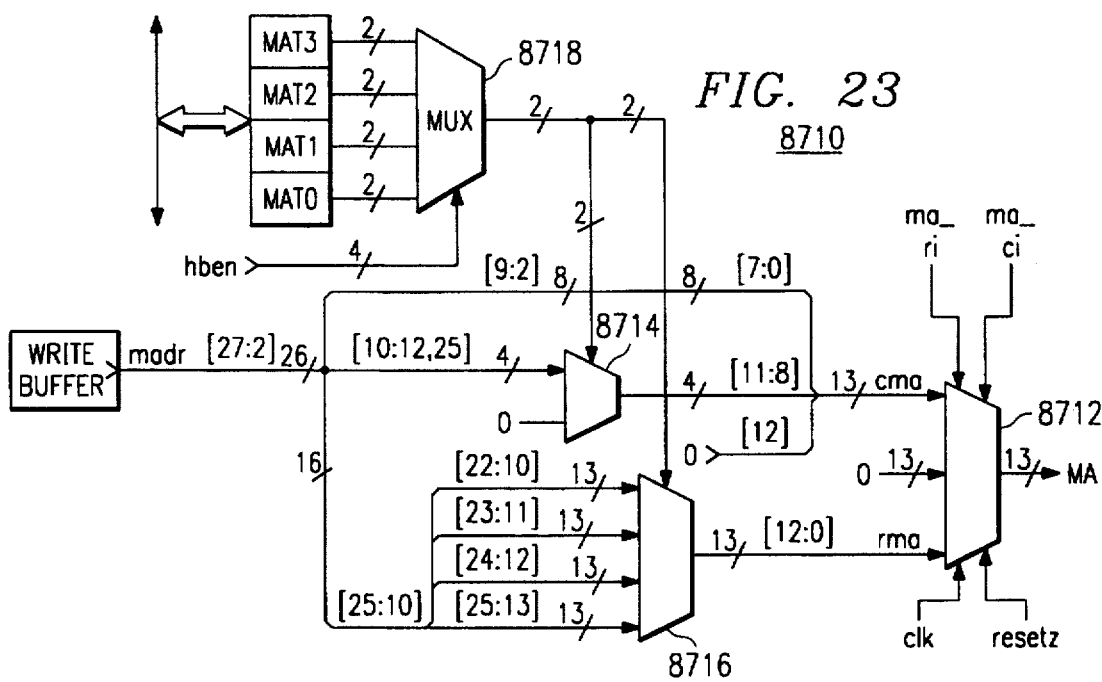
FIG. 23 is a partially block, partially schematic diagram of a column and row address selector embodiment in the DRAM control block of FIG. 22 in the MCU of FIG. 17.

FIG. 23 details the column and row address selector ra_ca 8710 in the DRAM control block of FIG. 22. Address selector 8710 has a memory address selector mux 8712 with output to the MA bus, and three 13-bit wide mux inputs cma for column memory address, rma for row memory address and 13 logic low zeroes for reset and address bus quieting. Controls to selector 8712 include clock clk, row address select ma_ri, column address select ma_ci, and low-active Reset resetz. The MAT register MAT0-3 holds four bit-pairs representing the memory array type, corresponding to a bank to which the MA bus address is to be written. Any one bit pair controls both a 4-bit wide column address selector mux 8714 and a 13-bit wide row address selector mux 8716 which have respective outputs connected to the cma and rma inputs of selector mux 8712. A selector mux 8718 selects one of the four bit-pairs MAT0-3 and outputs the selected bit pair as controls to selector muxes 8714 and 8716. Selector mux 8718 is controlled by 4 bank enable lines hben (one line active for its corresponding bank).

CPU 701 or a bus master on bus 104 originates memory addresses which are latched in MCU 8200 and supplied as memory address madr on lines madr[27:2]. Eight lines madr[9:2] are supplied directly to the cma[7:0] lsb eight lines to mux 8712. The cma input of mux 8712 has 13 bit lines comprised of four more lines cma[11:8] connected to the ouput of mux 8714, and one line cma[12] tied low (0).

Mux 8716 has two four-line inputs. One input is 4 lows (0000) and the other input is comprised of madr lines 10, 11, 12 and 25. In this embodiment, mux 8714 operates and contributes to the cma input according to the following table:

| MAT bit pair | madr | cma |
|---|---|---|
| 00 (widest) | [25, 12, 11, 10] = | [11, 10, 9, 8] |
| 01 | [11, 10] = | [9, 8] cma [11, 10] = 00 |
| 10 | [10] = | [8] cma [11, 10, 9] = 000 |
| 11 (8 bit col > | | cma [11, 10, 9, 8] = 0000. |

The same configuration is advantageously used for both symmetric DRAM (number of column address lines equals number of row address lines) and asymmetric DRAM (numbers not equal) with no additional complication required.

In an alternative embodiment, the table has a very regular organization:

| MAT bit pair | madr | cma |
|---|---|---|
| 00 (widest) | [12, 11, 10] = | [10, 9, 8]; cma[11] = 0 |
| 01 | [11, 10] = | [9, 8]; cma[11, 10] = 00 |
| 10 | [10] = | [8]; cma[11, 10, 9] = 000 |
| 11 (8 bit col > | | cma[11, 10, 9, 8] = 0000. |

Numerous alternative embodiments remarkably accommodate different DRAM column and row address widths based on the principles disclosed herein. Both symmetric (col. adr. width equals row adr. width) and asymmetric DRAMS (widths unequal) are accommodated.

Mux 8714 has four 13-bit inputs of contiguous lines from madr connected so that madr[25:13] is selected by DRAM wide-column-width MAT code 00, madr[24:12] by MAT 01, madr[23:11] by MAT 10, and madr[22:10] by MAT 11. In this way, all the row address generally next to the lsb column addresses in the input madr address are routed appropriately to the rma input of mux 8712. Addresses madr[1:0] are byte addresses from CPU 701. MA addresses to the DRAM 106 fetch double-words 4 bytes of data) and thus do not include the lsb byte addresses.

Figure 24:
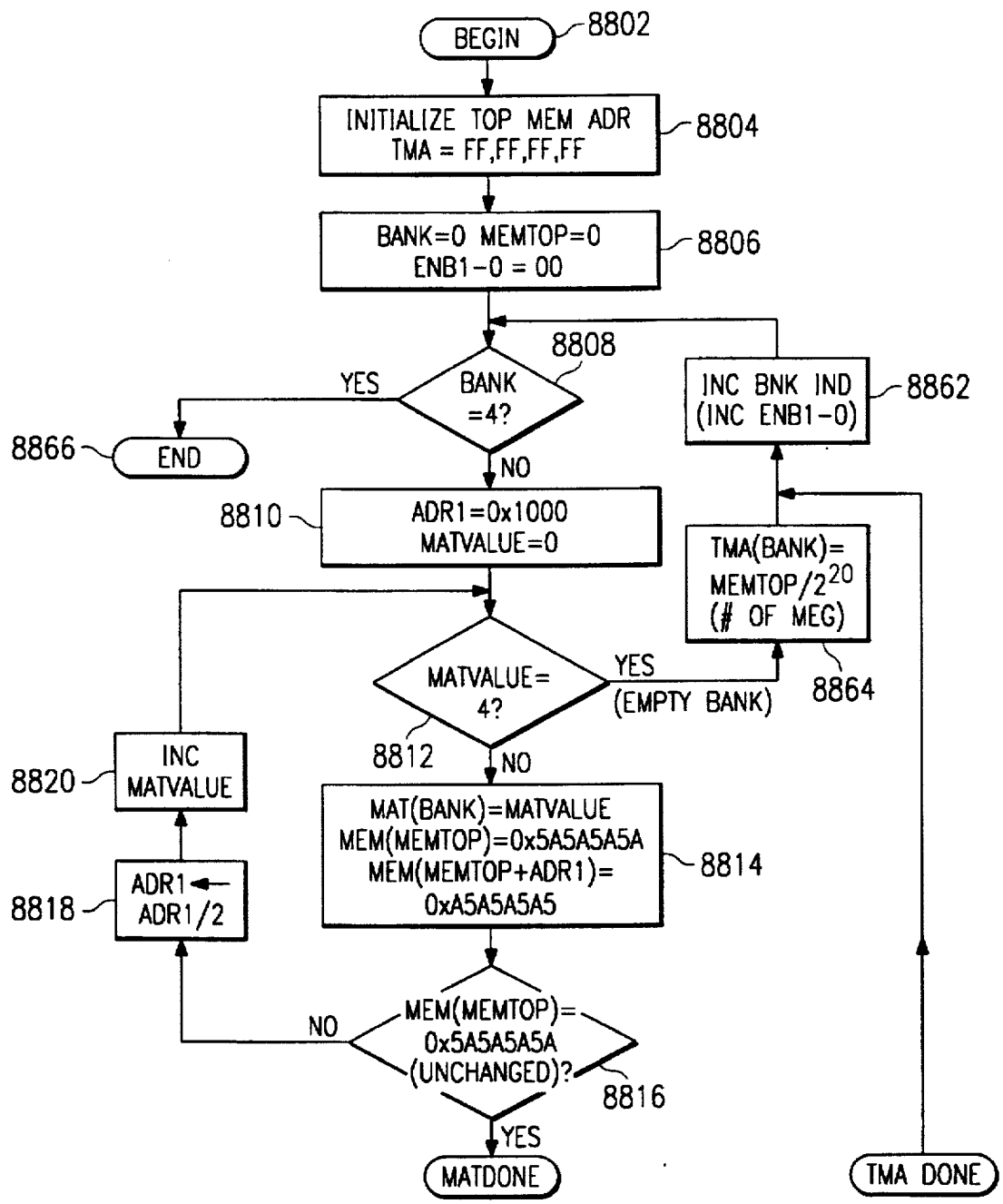
FIG. 24 is a method embodiment flow diagram for BIOS software for loading a Memory Array Type (MAT) register, and FIG. 24 mates with flow diagram FIG. 27.

In FIG. 24 a method embodiment for BIOS (basic input/output system, or bootup system) software tests memory 106 in each bank for its column-width type and loads Memory Array Type (MAT) register tabulated earlier hereinabove. FIG. 24 mates with flow diagram FIG. 27 that loads Top Memory Address register TMA. This software is at least initially read from BIOS ROM 120 of FIG. 6 and executed by CPU 701 using MCU 8200. This method when implemented in software increases system flexibility and reduces hardware and consequent die cost for MPU 102 while remaining transparent to the application software and computer user or end-customer. Also, unwieldy hardware jumpering is avoided. The TMA and MAT registers used together provide a very efficient way of supporting different column address width-types and memory-space amounts of DRAMS in the respective banks 0, 1, 2, 3 of FIG. 8 for example. The Memory Array Type values directly decode to column width, resulting in elegantly uncomplicated logic hardware in FIG. 22.

Operations commence at a BEGIN 8802 and proceed to a step 8804 to initialize a 32-bit Top Memory Address TMA register (tabulated earlier hereinabove and pertinent to FIG. 27 operations) with value FF hex in each of four bytes therein.

Figure 26:
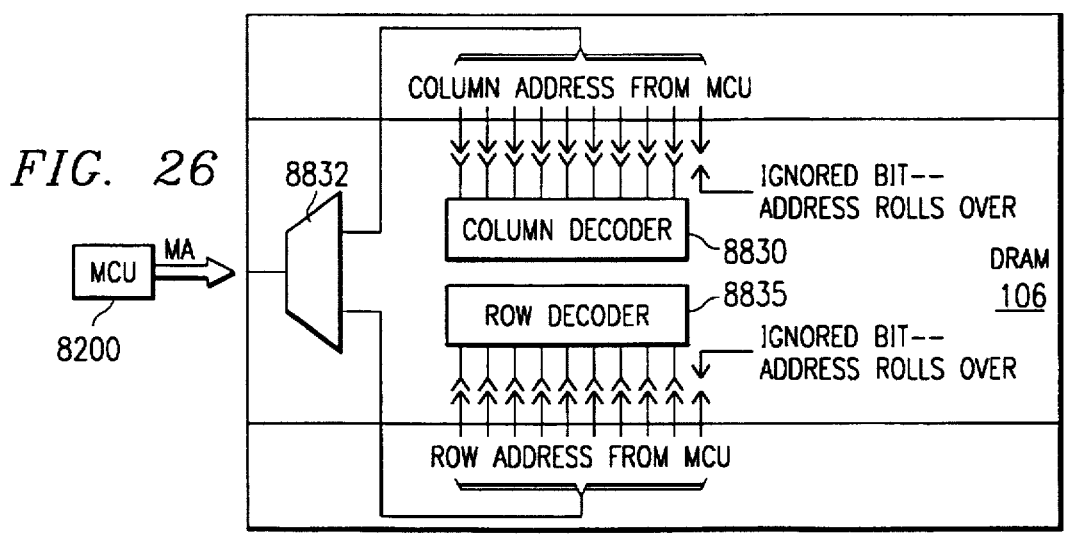
FIG. 26 is a block diagram of a system with the MCU of FIG. 17 connected to a DRAM memory, for illustrating the operations of the method of FIG. 24.

Next in a step 8806 a Bank index and a memory top address testing variable MEMTOP are both initialized to zero. Also, bank enable bits ENB1-0 are initialized to 00 in the DRAM Shadow and Control Register bits 9,8. This step is important because no banks higher than the banks enabled by ENB bits are enabled. In this way, operations of FIG. 27 which might address another bank wraparound, or roll over, back into the highest enabled bank for test purposes as shown in FIG. 26.

A loop decision step 8808 is not triggered until the Bank index reaches 4, so operations go on to a step 8810 wherein within-outer-loop initialization step 8810 sets a Memory Array Type Value MATVALUE to zero and also sets a column width testing variable ADR1 to all zeros MSB and 1000 for LSBs (0x1000).

Operations now proceed to an MAT inner-loop decision step 8812 which is not triggered unless the MATVALUE index reaches 4. Next in a step 8814 the MAT register of FIG. 23 has a pair of bits set to the current value of MATVALUE. More specifically, the low-byte 7:0 of the MAT register has 4 pairs of bits 7,6 for Bank 3; 5,4 for Bank 2; 3,2 for Bank 1 and 1,0 for Bank 0. Each pair of bits are appropriately loaded with MATVALUE codes as they are tested and determined by this MAT inner loop. The MAT value corresponds to the DRAM bank column address width in descending order 00 for 11/12 bit width, 01 for 10 bit width, 10 for 9 bit width, and 11 for 8 bit DRAM bank column address width.

Variable MEMTOP in step 8814 currently holds the value of the memory address at the bottom of the DRAM memory 106 bank having index value Bank at this point in the software. As a test, step 8814 loads DRAM 106 at memory address MEMTOP (initially zero in FIG. 25) with an arbitrarily chosen test value 0x5A5A5A5A which in this example has many ones and many zeros alternating in 32 bits. Further in the test, step 8814 attempts to load DRAM 106 at another, higher, memory address MEMTOP-plus-ADR1 (see FIG. 25) with a different arbitrarily chosen test value 0xA5A5A5A5, which in this example is the logical complement of the value loaded at address MEMTOP.

Figure 25:
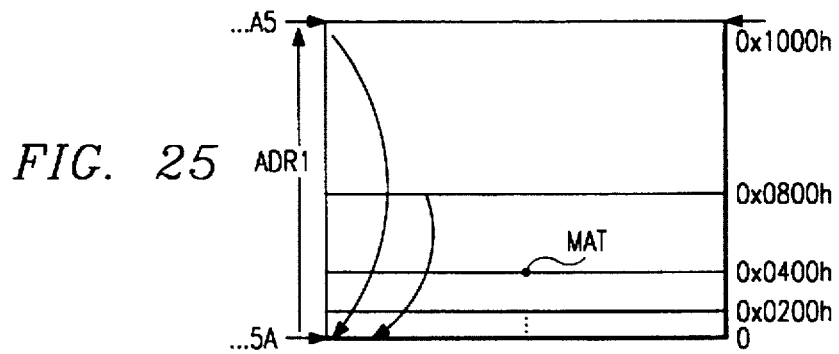
FIG. 25 is a memory column address diagram for illustrating the operations of the method of FIG. 24.

FIGS. 25 and 26 illustrate the significance of the test in step 8816. If MATVALUE is correct, the two different values ..A5 and ..5A actually load different locations. But if the MATVALUE is too low, a rollover in FIG. 25 occurs and the ..A5 value overwrites the ..5A value. An overwrite is detected in a step 8816 of FIG. 24 whereupon a branch is taken to a step 8818 to divide ADR1 by two (by a single right-shift), and then to increment the MATVALUE test value 8820 in the MAT register bitpair for the current Bank index, and then go back to steps 8812, 8814 and 8816 until the test of step 8816 is passed and point MATDONE is reached.

FIG. 26 shows why the rollover in FIG. 25 occurs unless the MATVALUE is correct. Column addresses are sent on the MA bus separated in time from row addresses. If ADR1 is wider than the column address width of the DRAM in the particular bank being accessed, then the high order column address bits sent on the MA bus, due to the current test value MATVALUE in the MAT register of FIG. 23, are ignored by the DRAM because it lacks the width of column address decoder 8830 hardware to decode them. A mux 8832 in DRAM 106 sends the separately sent row addresses to a row address decoder 8835. The row addresses should be the same for all the tested choices of MATVALUE, and this is accomplished in this example by loading the bottom address of the bank first.

Continuing to FIG. 27 to discuss more BIOS software method improvements, operations proceed from point MATDONE where they have exited the MAT inner loop of FIG. 24 and go on to a step 8840. Step 8840 initializes a size testing variable BANKSIZE to 1 (representing 1 Meg of DRAM) whereupon a TMA inner loop is reached. Unless the BANKSIZE variable exceeds 64 (for 64 Meg), a branching step 8842 is not triggered, and operations go on to a step 8844.

Beginning in Step 8844 the TMA inner loop tests the currently indexed bank to find for recording in the TMA register the top memory address in the currently indexed bank in the address space of DRAM 106. Upon entry of this FIG. 27 TMA inner loop the value MEMTOP is the address of the bottom, not the top, of the currently indexed bank. Now in step 8844, a test value NEWTOP is made equal to the sum of the address MEMTOP plus BANKSIZE. Since the initialization value of BANKSIZE is just a minimum guess, it may be incorrect.

Figure 28:
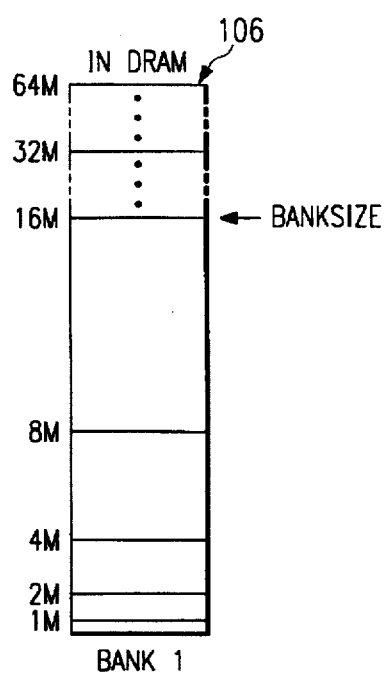
FIG. 28 is a diagram of memory address space in a particular bank for illustrating an operation of determining a value MEMTOP in the operations of the method of FIG. 27.

To test the BANKSIZE value, the location in DRAM 106 having bottom-of-bank address MEMTOP is loaded with a test value 0xA5A5A5A5 in a step 8846 and the higher NEWTOP address location is loaded with a different, here complementary, test value 0X5A5A5A5A. If the value of BANKSIZE is too small to correctly represent the size of the currently addressed bank the two address locations that are actually accessed will be different locations and no overwriting will occur. Accordingly, no change in the ..A5 value loaded in step 8846 will occur, and test step 8850 will take a branch to step 8852 to double the BANKSIZE value (see FIG. 28) and then go back to step 8842, 8844, 8846, 8848, 8850 and loop repeatedly if necessary. When BANKSIZE has reached a value just equal to the size of the bank, the most significant one-bit in the address MEMTOP-plus-NEWTOP will be outside the range of any address decoder in the bank and will be ignored (and will not be recognized by a decoder for any higher bank because any higher bank is disabled by the ENB value), whereupon the location at the bottom of the bank is overwritten. FIG. 26 shows that a row decoder 8835 ignores the msb row address bit when BANK-SIZE is equal to the size of the bank, either because the decoder has no internal connection to the msb line or because the system board will have no connection for the msb address MA line to any pin of the DRAM chip in this bank. Test step 8850 detects the change resulting from the overwrite, and proceeds to a step 8854.

In step 8854, the value MEMTOP is made equal to the NEWTOP test value. At this point MEMTOP is equal to the address at the bottom of the memory 106 bank having the next higher Bank index value. Then, in a next step 8856, the number of Meg (1 Meg=$2^{20}$) in all banks up to and including the currently-indexed bank is loaded into a byte of the TMA register corresponding to the Bank index value.

Figure 29:
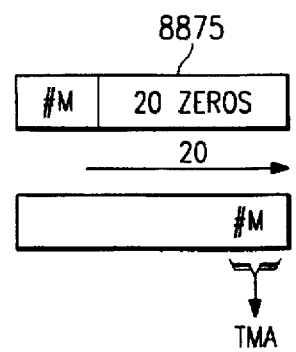
FIG. 29 is a diagram of a shifting process for generating a TMA value in the operations of the method of FIG. 27.

As shown in FIG. 29, this number of Meg is found by right-shifting the MEMTOP value 8875 from step 8854 by 20 places to accomplish a divide by $2^{20}$ and the LSB 8 bits are loaded into a byte of the TMA register corresponding in TMA byte-position to the Bank index value.

Upon completion of step 8856 or a greater than 64M branch from step 8842, operations reach a point TMADONE, and go back to FIG. 24, whereupon the Bank index is incremented in a step 8862 and control passes back to step 8808 at the top of the outer loop.

Advantageously, the method of FIGS. 24 and 27 for determining top memory addresses for register TMA also accommodates empty bank situations. In such case, all values ADR1 in step 8814 (see FIG. 24) fail to prevent overwriting of FIG. 25 as detected by step 8816. A MATVALUE of 4 decimal (100 binary) is generated by step 8820 after several loops in the MAT inner loop, whereupon step 8812 takes an Empty-Bank branch to a step 8864. In step 8864, the byte in the TMA register indexed for the latest Bank index is simply set equal to the bottom-of-bank address value MEMTOP right-shifted by 20 places. Operations proceed from step 8864 to step 8862 incrementing the Bank index and passing control to step 8808. When incrementing step 8862 has incremented the Bank index to a value equal to the maximum number of DRAM banks (for example, the four banks on the system board of FIG. 8 numbered 0,1,2,3), then step 8808 takes a branch to an END point 8866 whereupon other BIOS routines outside of the scope of this discussion are executed.

Figure 30:
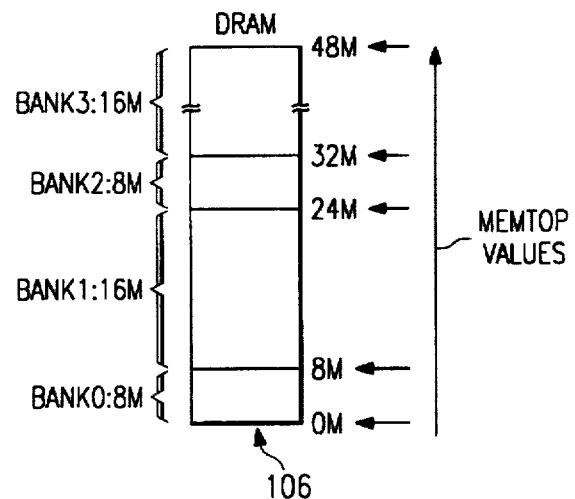
FIG. 30 is a diagram of memory address space in a whole set of memory banks for illustrating operations of determining value MEMTOP and TMA values in the operations of the method of FIG. 27.

In FIG. 30, suppose then that there are four banks 0,1,2,3 actually having 8M, 16M, 8M, and 16M of memory respectively installed therein. The software of FIGS. 24 and 27 computes a succession of MEMTOP values 0, 8, 24, 32, 48 (decimal numbers of Meg). At the end of the operations according to the method embodiment, the TMA register has the decimal values 48, 32, 24, 8 loaded in binary form into respective bytes 31-24, 23-16, 15-8, 7-0 of the TMA register ready for use by the circuitry and method embodiments illustrated in connection with FIG. 21.

Figure 31:
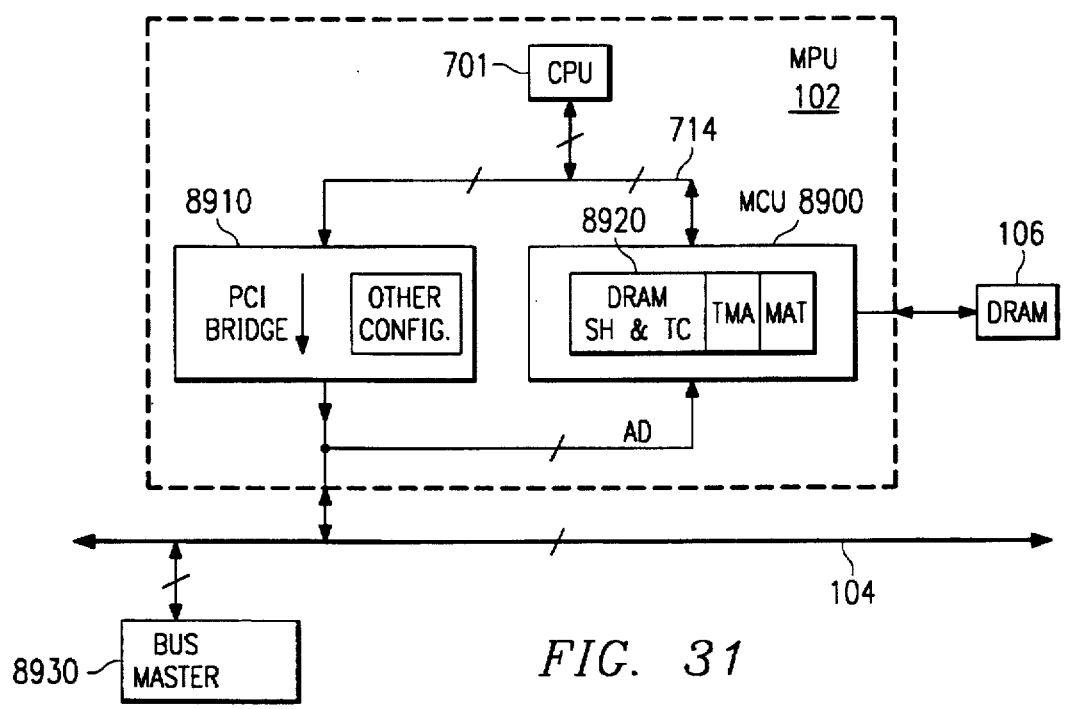
FIG. 31 is a diagram of an microprocessor device embodiment alternative to that of FIG. 17.

In FIG. 31 a microprocessor device embodiment alternative to that of FIG. 17 has two configuration control blocks—one in a PCI bridge 8910 and the second in an MCU 8900. Configuration control logic for the read/write path decodes accesses to MCU-specific configuration registers in the MCU 8900. Configuration control logic for the read/write path analogously decodes accesses to non-MCU-specific configuration registers in the PCI bridge 8910. No configuration registers themselves are duplicated. In this way MCU 8900 and PCI bridge 8910 act as a single PCI-compliant circuit. PCI bridge 8910 has most of the configuration registers themselves (distinguish registers from the control circuitry for register accesses), and MCU 8900 has the rest of them constituting only those registers (SH&TC, TMA, MAT) which relate to MCU operation. In this way, both MCU 8900 and PCI bridge 8910 together provide 100% of the configuration register space.

FIGS. 32-35 are schematic diagrams of a refresh control block in the MCU embodiment of FIG. 17. Advantageously, the circuitry of FIGS. 32-35 responds to a Halt alone to accomplish a self-refresh operation without any complex setup. Asynchronous refresh in suspend mode is provided.

Block 9641 generates signal ref, which is REFRESH CLK. Component 9602 is an inverter delay line. Exclusive NOR 9604 thus generates pulses in response to both edges of signal osc32k. Block 9641 divides the frequence of the signal generated by component 9604 by 2, 4, 8. Signal refdiv[1:0] selects one of 4 frequencies. Result is on signal ref which is used as refresh CLK, and notably signal ref is totally asynchronous to processor CLK. Signal ref is fed to block 9650 (FIG. 34) to reshape refresh CLK wave form to one shot pulse style wave form which is easier to be used in block 8600 DRAM CONTROLLER. The pulsed wave signal is signal refcp. In non-suspend mode signal refcp is delivered to a refresh queue counter for gaining performance purpose. On suspend mode asynchronous signal refcp is delivered to block 8600 DRAM CONTROLLER directory.

Block 9610 (FIG. 32) and block 9620 (FIG. 33) determine if block 8600 DRAM CONTROLLER is in idle state or in an active state monitoring signals mrreq and signal mwreq; the state of block 8600 is indicated by the state of signal hidle. When signal hidle is active that means DRAM CONTROLLER is idle, block 9600 REFRESH controller attempts to release REFRESH QUEUE counted by block 9630 and block 9640. If REFRESH QUEUE counter reaches 4, it releases REFRESH QUEUE without checking block 8600 DRAM CONTROLLER activities. This feature reduces DRAM CYCLE overhead of REFRESH and data access DRAM cycle.

In FIGS. 32-35 the refresh controller circuitry has outputs Refresh Clock Pulse REFCP, Suspend Enable SUSEN, Refresh Request REFREQ, and Suspend Refresh SUSREF connected as shown in FIG. 22 to circuits 8750 and 8790 of DRAM Controller 718. DRAM Controller 718 is also responsive to a stop request hstop2mcu from on-chip microprocessor 701 and supplied via logic as a Suspend Request SUSREQ. DRAM controller 718 cooperates with the refresh circuitry to have low-active row address strobe RAS#[0:3] output terminals for connection to external memory 106.

Figure 32:
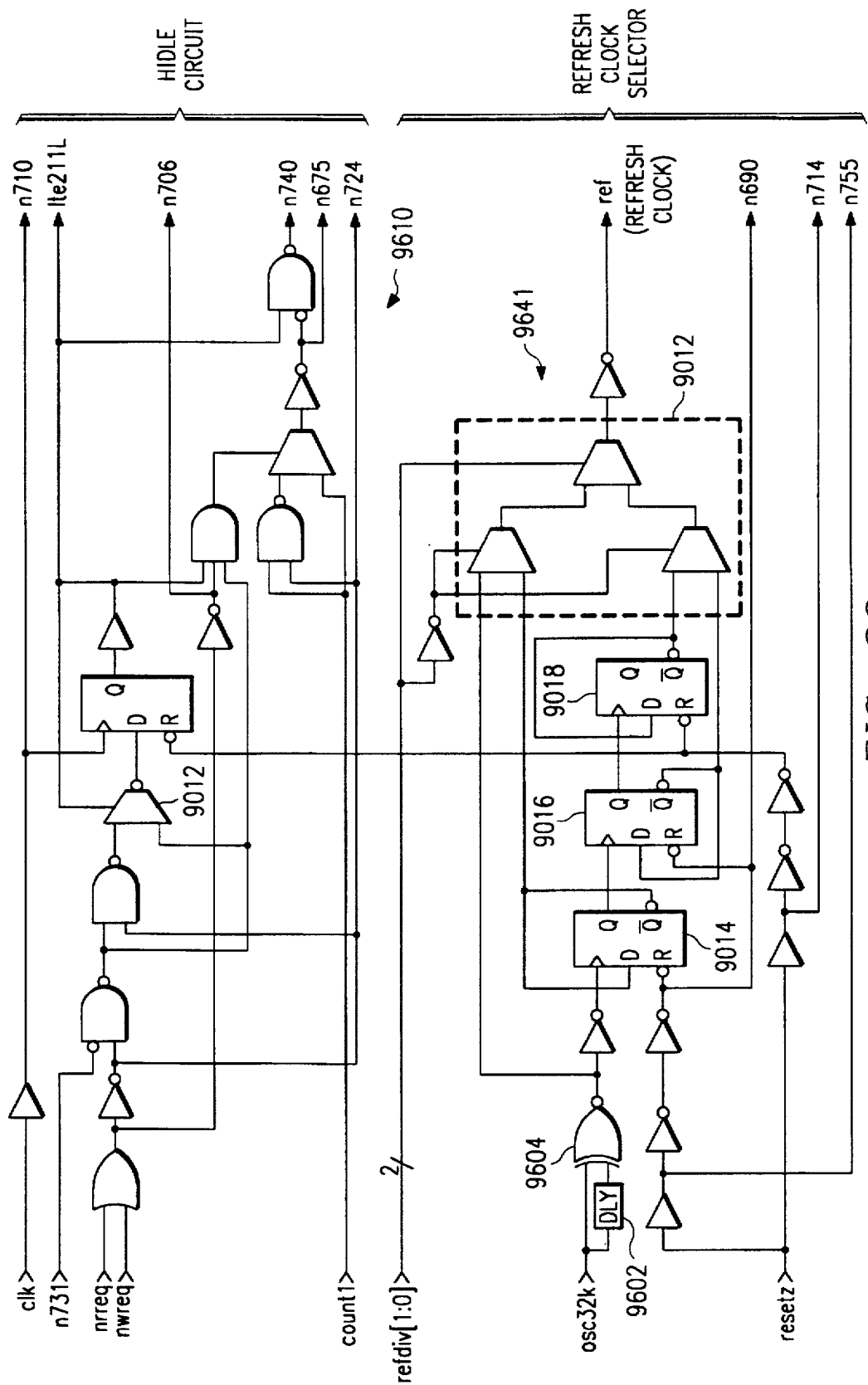
FIGS. 32–35 are schematic diagrams of a refresh control block in the MCU embodiment of FIG. 17.
Figure 33:
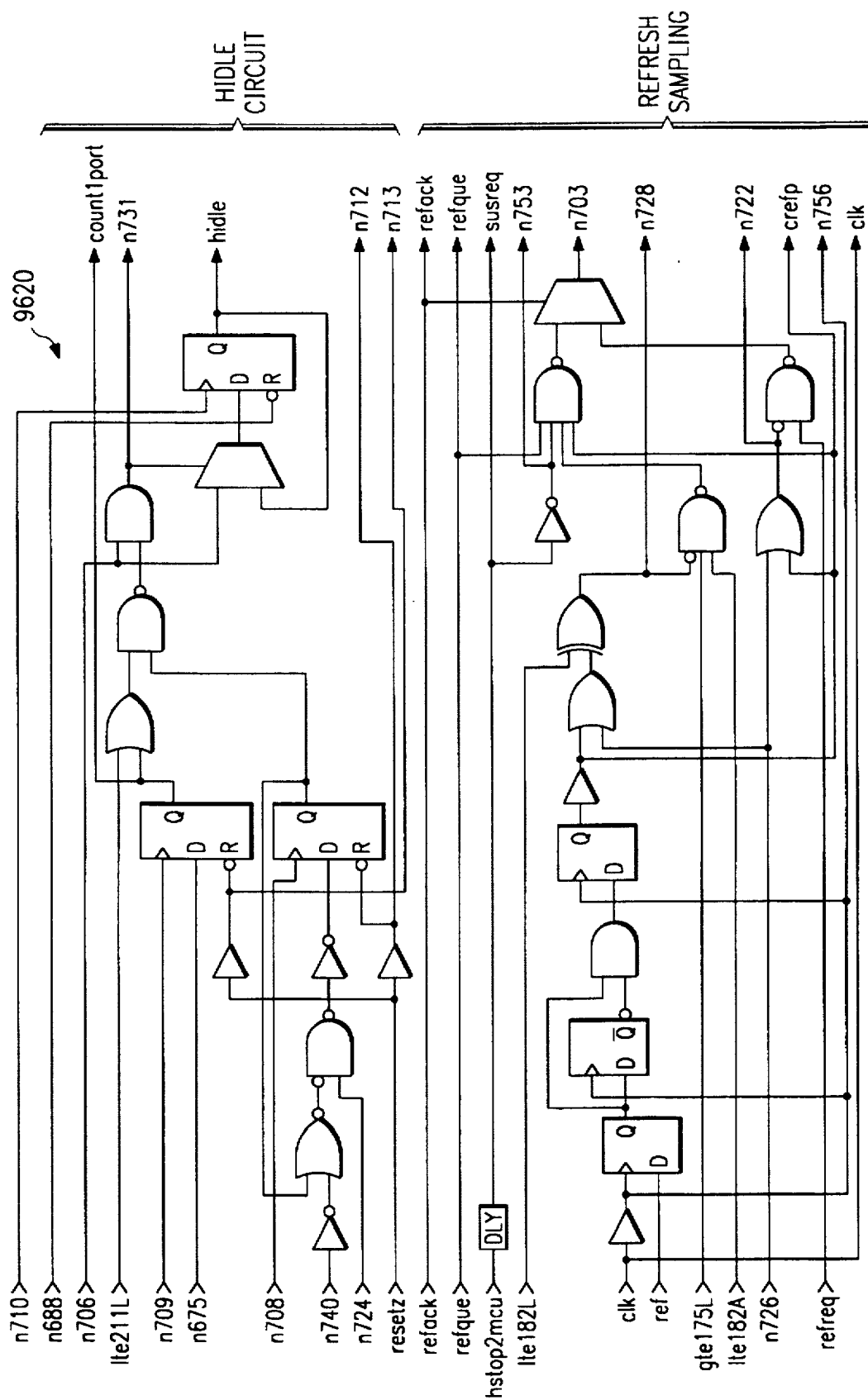

The refresh controller circuit of FIGS. 32-35 and FIG. 22 block 8750 includes an idle condition counter 9610, 9620 of FIGS. 32-33 responsive to inactivity of both memory read or write requests nrreq, nwreq from the writeback cache 720 to initiate a DRAM access. If the inactivity last for several refresh clock periods (e.g. 4), a signal hidle is produced to indicate the idle state.

A refresh queue 3-bit counter circuit 9640 (FIG. 34) counts up to a predetermined value, here also four (4). The queue counter enqueues refresh requests with data accesses. The counter outputs are lte182L, lte182A, and gte175L for counter 9640 bits 0,1,2 respectively. These outputs are fed to a refresh request circuit 9645, referring to FIG. 35. Circuit 9645 is responsive to the refresh queue counter 9640, to the state of the idle condition detector output hidle, and to a refresh queuing enable QUEEN bit 2 of the DRAM Shadow and Timing Control Register tabulated earlier hereinabove. Circuit 9645 (FIG. 35) provides a handshake signal refresh request REFREQ to block 8790 of FIG. 22, and block 8790 supplies a refresh acknowledge REFACK back to circuit 9645. When the queue counter has reached a value "4", as long as hidle is active, arbitration by block 8790 releases the refresh request, and then the queue counter counts back down to zero.

A refresh clock circuit in FIG. 32 is supplied with 32 KHz clock osc32k, and uses a 200 nanosecond delay block 9602 and XNOR gate 9604 to create short clock pulses at the 32 KHz rate. XNOR gate 9604 is coupled to a frequency divider having latches 9014, 9016, 9018. A four-input mux 9012 supplies a Refresh ref output having a programmable period based on the bit-pair refdiv[1:0] tabulated as bits 1-0 REFDIV in the DRAM Shadow and Timing Control Register. Signal ref is fed through another 200 nanosecond delay and AND gate in FIG. 34 circuit 9650 to produce signal REFCP to block 8750 of FIG. 22.

Other logic in circuit 9650 synchronously samples the refresh clock to detect a falling edge. A 5-input AND gate in circuit 9650 produces an output n748 when 1) no refresh operation is in progress (refreq low), 2 AND 3) a signal ref falling edge has just occurred, 4) a suspend request SUSREQ becomes active and 5) no read or write request activity (nrreq, nwreq) in circuit 9610 is present as indicated on line n724.

Signal Suspend Enable SUSEN is ouput from a latch in circuit 9650 when either input of an input OR gate to the SUSEN latch is active. One input is connected to the n748 AND gate signal just described. The other input is coupled back to the output SUSEN of the latch, and this feedback can be disabled by appropriate activity in signal n706 from HIDLE circuit shown in FIG. 32 and signal n753 which is inverted SUSREQ.

Figure 35:
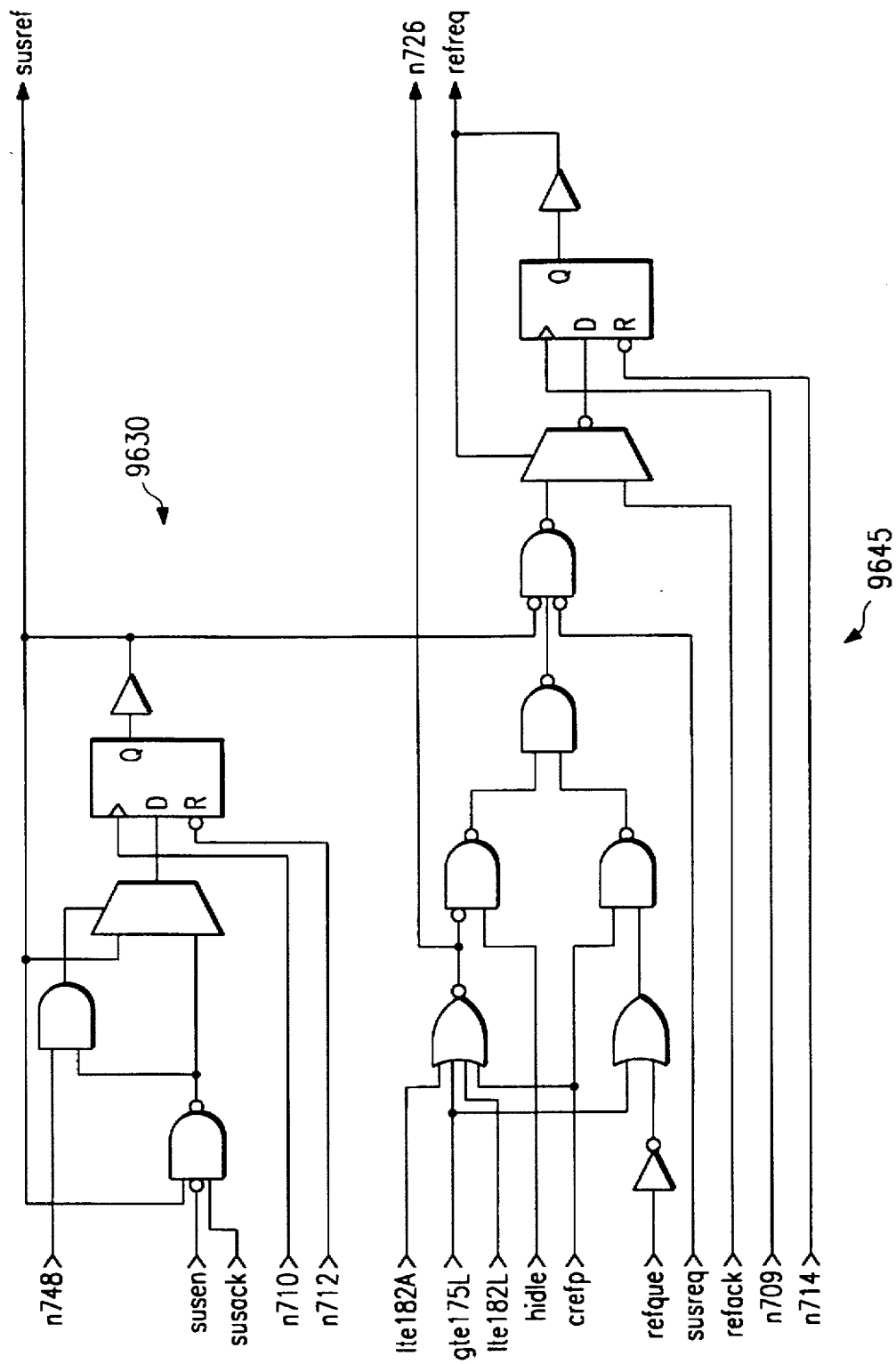

The DRAM Shadow and Timing Control Register has bit 3 SELF REF acting as a control latch for at least one bit indicative of a self refresh mode enable and also has bit 2 (QUEEN) as at least one other bit indicative of a refresh queuing enable. OR-gate 8756 of FIG. 22 acts as an example of a self refresh circuit which is disabled by the self refresh mode enable SELFREF and has an input REFCP from refresh clock circuitry of FIGS. 32 and 34. A suspend enable circuit implemented by circuitry 9645 and 9650 of FIGS. 35 and 34 is fed by idle condition detector 9610, 9620 of FIGS. 32 and 33 and a stop request line SUSREQ coupled from CPU 701 line hstop2mcu.

A refresh RAS circuit implemented by AND gate 8754 of FIG. 22 has an output SRAS[0:3], and a first input fed by self refresh circuit OR-gate 8756 and a second input fed by suspend enable circuit (9645, 9650) output SUSEN which indicates that, because of entry into a SUSPEND mode by the system system clock clk (e.g. 66 MHz) will soon cease even though 32 KHz clock will continue.

Mux 8742 in FIG. 22 acts as a row address strobe multiplexer having an output connected to the RAS terminals RAS#[0:3]. Mux 8742 has a first input for data access RAS from RAS generator 8740 aras, and a second input connected to the output of refresh RAS circuit AND gate 8754.

The refresh circuitry 8210 of FIG. 17 as described in detail in connection with FIGS. 32-35 and FIG. 22 confers numerous advantages. First, the refresh circuitry accommodates normal refresh in response to REFCP via mux 8742.

Second, the refresh circuitry works with either self-refreshing DRAMs (memory chips with internal refresh generator or non-self-refreshing DRAMs by merely setting or clearing the SELFREF bit in a process of BIOS system configuration operations to appropriately control FIG. 22 block 8750. When SELFREF bit is set high, refresh clock REFCP is prevented by gate 8758 from toggling the SRAS and RAS lines. RAS#[0:3] output is high (inactive) with SELFREF high because the DRAM, being assumed to be of a self refresh type, should not be stimulated with RAS. When the SELFREF bit is set low by BIOS for a system employing non-self-refreshing DRAMs, refresh clock REFCP is allowed to toggle the SRAS and RAS#[0:3] lines because the DRAM, being assumed to be non-self refresh type, needs to be stimulated with RAS# low.

Third, the circuitry 8210, 8750 recognizes that refresh is needed in the system suspend state when using non-self refreshing DRAMs. Recall from the incorporated applications Ser. No. 08/363,198, and the other copending applications noted in the Background of the Invention hereinabove (FIGS. 27, 33, 36 and associated description therein) that an automatic suspend is created by the TONTOFF register and the maskclock (stopclock) process used therein. The automatic suspend feature is further advantageously implemented at the MCU 8200 level by the special refresh circuitry 9650 in FIG. 34 and suspend enable gate 8750 which uses SUSEN signal to automatically enable AND gate 8754 for suspend refresh of non-self-refresh DRAMs, and block 8790 of FIG. 22 to respond to SUSEN to control mux 8742 to automatically select suspend refresh signals SRAS instead of regular refresh controlled by refcyc, refcycl coordinated with data accesses by RAS generator 8740.

Moreover, the circuitry of FIGS. 32-35 provides by circuit 9630 appropriate handshaking of a suspend enable signal SUSEN as an enable to block 8790, responsive to which the block 8790 generates suspend acknowledge SUSACK.

Thus, as herein described, various control embodiments in circuits, systems and methods are used to improve bus interfaces, microprocessors, memory interfaces, audio and video data transfer circuitry, multiple bus-master circuits, and all other devices, systems and processes to which their advantages commend them.

A few preferred embodiments are described in detail herein. It is to be understood that the scope of the invention also comprehends embodiments different from those described, yet within the scope of the claims.

For example, color display devices can be raster-scanned cathode ray tubes or other raster-scanned devices; devices that are not raster-scanned and have parallel line or frame drives; color printers, film formatters, or other hard copy displays; liquid crystal, plasma, holographic, deformable micromirror, field-emission or other displays of CRT or non-CRT technology; or three-dimensional or other devices using nonplanar image formation technologies.

While in some contexts, the term "microcomputer" refers to a device that requires a memory and the term "microprocessor" refers to a device that does not require a memory, the terms as used herein are synonymous and refer to equivalent things. The phrase "processing circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic system comprising:
    a memory; and
    a microprocessor unit coupled to the memory and to a system bus, the microprocessor unit comprising:
        a memory controller circuit coupled to said memory
        configuration registers for storing configuration information for use by said memory controller circuit in performing accesses to the memory; and
        a bus bridge circuit coupled to said system bus for transferring addresses and data, and comprising:
            a request logic circuit for generating, responsive to at least one of the addresses, a write request signal to said memory controller circuit signaling an impending write access to at least one of said configuration registers; and
            an enable circuit for enabling a write access to at least one of said configuration registers responsive to receiving a reply signal;
        wherein said memory controller circuit includes a reply logic circuit for generating the reply signal responsive to the combination of the write request signal from said request logic circuit and a signal in the memory controller indicating the absence of a pending memory operation utilizing current information in at least one of said configuration registers.

2. The system of claim 1, wherein the reply logic circuit comprises:
    memory access logic circuitry, for generating a pending memory access signal responsive to the memory controller circuit issuing a memory access request signal or a memory refresh signal; and
    reply signal generating logic, coupled to receive the pending memory access signal and the request signal, for generating the reply signal.

3. The system of claim 2, wherein the microprocessor unit further comprises:
    a write-back cache memory, having a plurality of cache locations, and having a plurality of dirty bits, each dirty bit associated with one of the plurality of cache locations for indicating if its corresponding cache location contains modified data;
    wherein the reply logic circuit further comprises:
        cache status logic, coupled to the write-back cache memory to receive the state of the dirty bits, for generating a pending writeback signal to the memory access logic circuitry;
    and wherein the memory access logic circuitry is for generating a pending memory access signal responsive to the memory controller circuit issuing a memory access request signal or a memory refresh signal, or to the cache status logic issuing the pending writeback signal.

4. The system of claim 1, wherein the microprocessor unit further comprises:
    a microprocessor, coupled to the bus bridge circuit and to the memory controller, and having a processing unit operable to process digital data in accordance with computer instructions.

5. The system of claim 4, wherein said microprocessor unit is implemented on a single integrated circuit chip.

6. The system of claim 4, further comprising:
    a single-chip electronic device coupled to said microprocessor and having circuitry for bidirectional data communication therewith.

7. The system of claim 6, wherein said single-chip electronic device includes a direct memory access circuit and a bus bridge interface circuit coupling said direct memory access circuit to said bus bridge circuit in said microprocessor unit.

8. The system of claim 1, wherein the information stored by the configuration registers comprises memory access timing and memory address information, for use by the memory controller circuit in performing accesses to the memory.

9. The system of claim 8, wherein the memory is arranged in a plurality of banks;
    and wherein the configuration registers comprise a plurality of memory array type registers, each for storing a code indicating a column address width for an associated one of the plurality of banks in the memory.

10. The system of claim 8, wherein the configuration registers comprise a timing control register, for storing a code indicating an access time of the memory.

11. The system of claim 8, wherein the memory is arranged in a plurality of banks;
    and wherein the configuration registers comprise a plurality of top memory address registers, each for storing a top memory address for an associated one of the plurality of banks in the memory.

12. The system of claim 11, wherein the memory controller circuit comprises:
    comparison circuitry, coupled to receive a memory address and to receive the contents of the top memory address registers, for selecting one of the plurality of banks in the memory responsive to the relationship of the memory address to the top memory addresses.

13. A computer system, comprising:
    a memory;
    a microprocessor unit coupled to the memory and to a system bus, the microprocessor unit comprising:
        a microprocessor having a processing unit operable to process digital data in accordance with computer instructions;
        a memory controller circuit coupled to the memory and to the microprocessor;
        configuration registers for storing configuration information for use by said memory controller circuit in performing accesses to the memory; and a bus bridge circuit coupled to the system bus and to the microprocessor, for transferring addresses and data, and comprising:
- a request logic circuit for generating, responsive to at least one of the addresses, a write request signal to said memory controller circuit signaling an impending write access to at least one of said configuration registers; and
- an enable circuit for enabling a write access to at least one of said configuration registers responsive to receiving a reply signal;

wherein said memory controller circuit includes a reply logic circuit for generating the reply signal responsive to the combination of the write request signal from said request logic circuit and a signal in the memory controller indicating the absence of a pending memory operation utilizing current information in at least one of said configuration registers;

and wherein the computer system further comprises:

a peripheral processor unit coupled to said microprocessor unit and having circuitry for bidirectional data communication therewith;

a user input interface coupled to the peripheral processor unit; and an output interface coupled to the peripheral processor unit.

14. The computer system of claim 13, further comprising:
a user input device coupled to the user input interface.

15. The computer system of claim 13, further comprising:
a docking station coupled to the user input interface; and
an input device connected to the docking station.

16. The computer system of claim 13, further comprising:
a display coupled to the output interface.

17. The computer system of claim 13, further comprising:
a docking station connected to the output interface; and
a display connected to the docking station.

18. The computer system of claim 13, wherein the user input interface, memory, output interface, peripheral processor unit, and microprocessor unit are attached to a printed wiring board having a substantially planar board element, and having conductors near a surface thereof for interconnecting the user input interface, memory, output interface, peripheral processor unit, and microprocessor unit.

19. The computer system of claim 13, wherein said microprocessor unit is implemented on a single integrated circuit chip.

20. The computer system of claim 13, wherein the information stored by the configuration registers comprises memory access timing and memory address information, for use by the memory controller circuit in performing accesses to the memory.

* * * * *

UNITED STATES PATENT AND TRADEMARK OFFICE
CERTIFICATE OF CORRECTION

PATENT NO : 5,737,765
DATED : 4/7/98
INVENTOR(S): Akio Shigeeda

It is certified that error appears in the above-identified patent and that said Letters Patent are hereby corrected as shown below:

On the title page
Please add [73] Assignee on Cover Page, Column 1,

-- Assignee: Texas Instruments Incorporated,
Dallas, Texas --

Please add Attorneys Names on Cover Page, Column 2,

-- Dana L. Burton, James C. Kesterson, Richard L. Donaldson --

Signed and Sealed this

Fifteenth Day of December, 1998

*Attest:*

BRUCE LEHMAN

*Attesting Officer*  *Commissioner of Patents and Trademarks*